United States Patent [19]
Hatakeyama et al.

[11] Patent Number: 6,015,976
[45] Date of Patent: Jan. 18, 2000

[54] FABRICATION APPARATUS EMPLOYING ENERGY BEAM

[75] Inventors: Masahiro Hatakeyama; Katsunori Ichiki, both of Fujisawa; Takao Kato; Yotaro Hatamura, 2-12-11 Kohinata, Bunkyo-ku, both of Tokyo; Masayuki Nakao, Matsudo, all of Japan

[73] Assignees: Ebara Corporation; Yotaro Hatamura, both of Tokyo, Japan

[21] Appl. No.: 09/195,254

[22] Filed: Nov. 18, 1998

Related U.S. Application Data

[62] Division of application No. 08/617,376, Mar. 18, 1996, Pat. No. 5,868,952.

[30] Foreign Application Priority Data

| Mar. 17, 1995 | [JP] | Japan | 7-86537 |
| Mar. 17, 1995 | [JP] | Japan | 7-86538 |
| Mar. 17, 1995 | [JP] | Japan | 7-86539 |
| Mar. 17, 1995 | [JP] | Japan | 7-86543 |

[51] Int. Cl.⁷ .................................................. H01J 37/302
[52] U.S. Cl. .............................. 250/492.23; 250/492.22
[58] Field of Search .................... 250/492.23, 492.22, 250/442.11, 491.1

[56] References Cited

U.S. PATENT DOCUMENTS

| 4,136,285 | 1/1979 | Anger et al. | 250/492 A |
| 4,213,053 | 7/1980 | Pfeiffer | 250/492.23 |
| 4,310,743 | 1/1982 | Seliger | 219/121 EB |
| 4,410,800 | 10/1983 | Yoshikawa | 250/492.22 |
| 4,513,203 | 4/1985 | Bohlen et al. | 250/491.1 |
| 4,607,166 | 8/1986 | Tamaki | 250/442.11 |
| 4,734,152 | 3/1988 | Geis et al. | 156/646 |
| 4,757,208 | 7/1988 | McKenna et al. | 250/492.2 |
| 4,810,621 | 3/1989 | Akkapeddi et al. | 430/321 |
| 4,835,392 | 5/1989 | Löschner et al. | 250/492.2 |
| 4,891,526 | 1/1990 | Reeds | 250/442.11 |
| 5,269,882 | 12/1993 | Jacobsen | 156/659.1 |
| 5,350,499 | 9/1994 | Shibaike et al. | 204/192.34 |
| 5,468,969 | 11/1995 | Itoh et al. | 250/492.23 |
| 5,708,267 | 1/1998 | Hatakeyama | 250/251 |
| 5,742,065 | 4/1998 | Gordon et al. | 250/492.23 |

FOREIGN PATENT DOCUMENTS

| 59-075624 | 4/1984 | Japan . |
| 88/05205 | 7/1988 | WIPO . |

OTHER PUBLICATIONS

Becker, E.W. et al.: "Fabrication of Microstructures with High Aspect Ratios and Great Structural Heights by Synchrotron Radiation Lithography, Galvanoforming, and Plastric Moulding (LIGA Process)" Microelectronic Engineering, vol. 4, 1986, pp. 35–56, XP002016184* the whole document*.

(List continued on next page.)

*Primary Examiner*—Jack I. Berman
*Attorney, Agent, or Firm*—Wenderoth, Lind & Ponack, L.L.P.

[57] ABSTRACT

Three-dimensional ultra-fine micro-fabricated structures of the order of $\mu m$ and less are produced for use in advanced optical communication systems and quantum effect devices. Basic components are an energy beam source, a mask member and a specimen stage. The mask member is an independent component, and various combinations of relative movements of the mask member with respect to the beam axis and/or workpiece can be made with high precision to produce curved or slanted surfaces on a workpiece, thereby producing multiple lines or arrays of convex or concave micro-lenses. Other examples of fine-structures include deposition of thin films in a multiple line pattern or in an array pattern. Because of flexibility of fabrication and material, labyrinth seals having curved surfaces with grooved structures can be used as friction reduction devices for bearing components. Fine groove dimensions of the order of nm are possible. Energy beams can be any of fast atomic beams, ion beams, electron beam, laser beams, radiation beams, X-ray beams and radical particle beams. Parallel beams are often used, but when a focused bean is used, a technique of reduced projection imaging can be utilized to produce fine-structures of the order of nm.

17 Claims, 84 Drawing Sheets

OTHER PUBLICATIONS

Fusao Shimokawa et al., "Reactive–fast–atom beam etching of GaAs using $Cl_2$ gas", J. Appl. Phys. 66(6), Sep. 15, 1989, published by 1989 American Institute of Physics, 1989, pp. 2613–2618.

Tetsuro Nakamura et al., "Fabrication Technology of Integrated Circuit", published by Sangyo Tosho Publishing Company (Japan), 1987, pp. 21–23 (includes English translation).

Masayuki Nakao et al., "3–dimensional handling in Nano Manufacturing World", Proceedings of 71st Fall annual meeting of the Japan Society of Mechanical Engineers, published by the Japan Society of Mechanical Engineers, 1993, vol. F, pp. 273–275 (includes English Abstract).

Masayuki Nakao et al., "Realization of 3–D Manufacturing in Nano Manufacturing World", Proceedings of 71st Spring annual meeting of the Japan Society of Mechanical Engineers, published by the Japan Society of Mechanical Engineers, 1993, vol. IV, pp. 485–486 (includes English Abstract).

U.S. application No. 08/610,235, filed Mar. 4, 1996, entitled "Ultra–Fine Microfabrication Method Using an Energy Beam", by Masahiro Hatakeyama et al.

U.S. application No. 08/621,990, filed Mar. 26, 1996, entitled "Micro–Processing Apparatus and Method Therefor", by Masahiro Hatakeyama et al.

Pending U.S. application No. 08/531,698, filed Sep. 21, 1995, entitled "Method and Apparatus for Energy Beam Machining", by Masahiro Hatakeyama et al., scheduled to issue Jun. 23, 1998, as U.S. Patent No. 5,770,123.

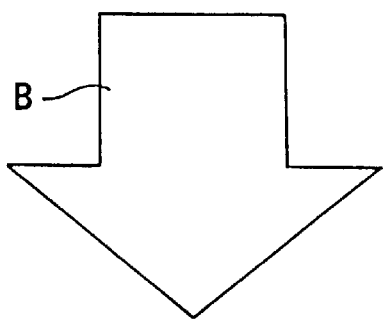
F I G. 1A
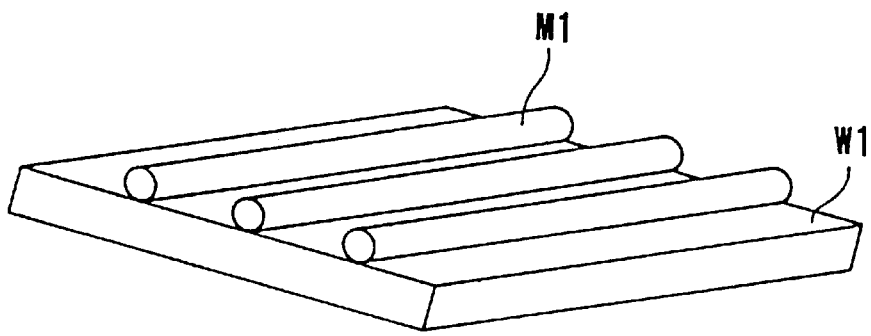
F I G. 1B
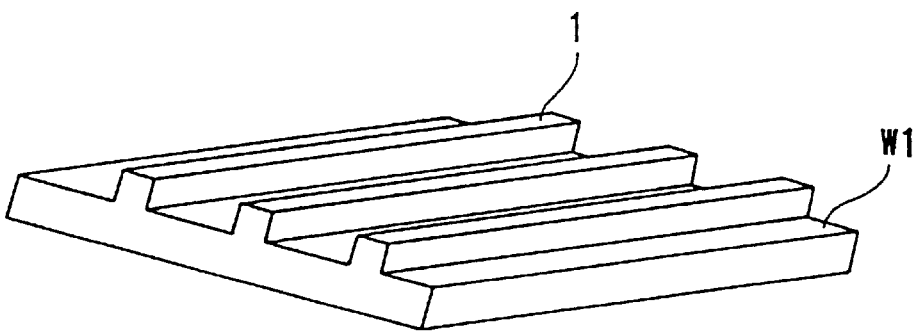
F I G. 1C
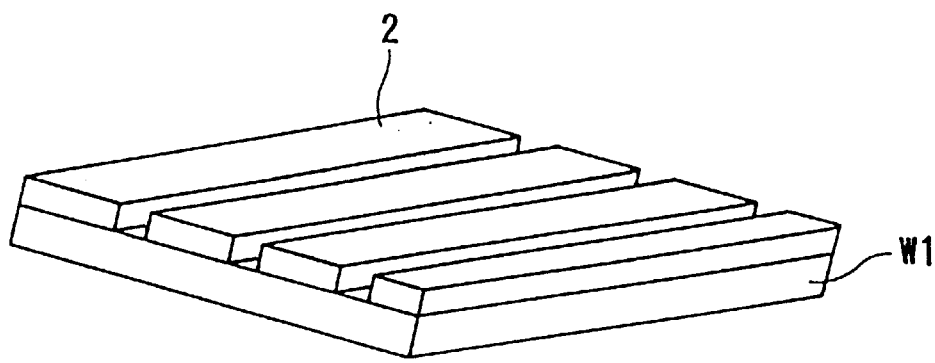

F I G. 1 5
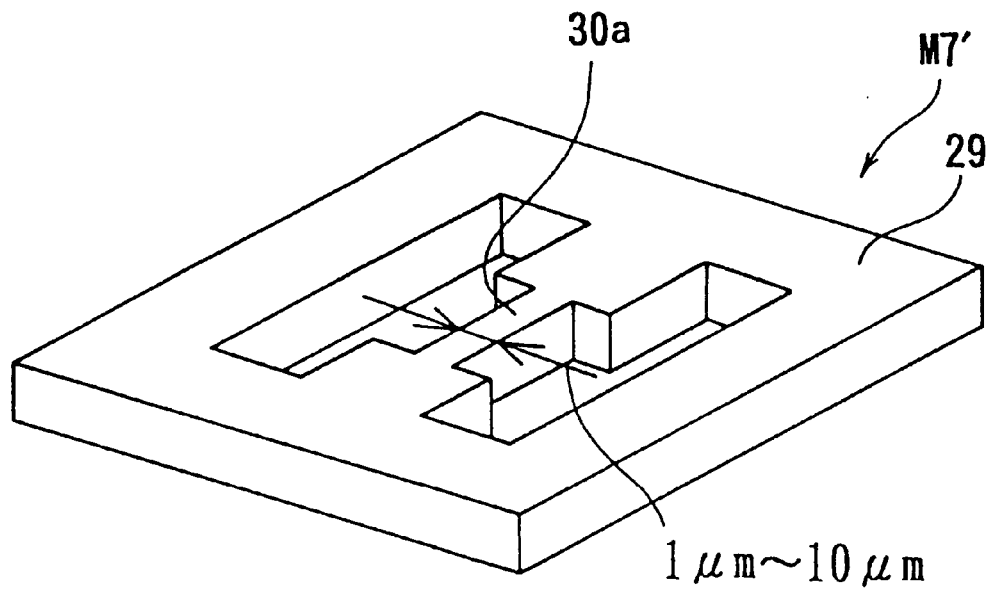
1μm～10μm
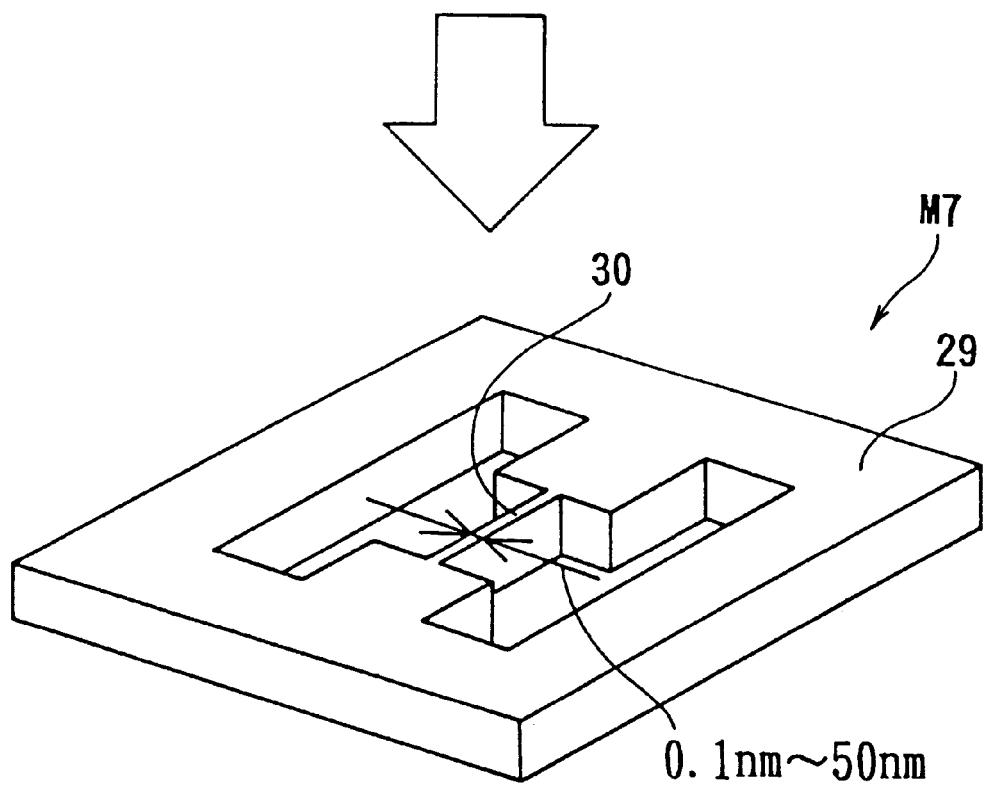
0.1nm～50nm

FIG. 17
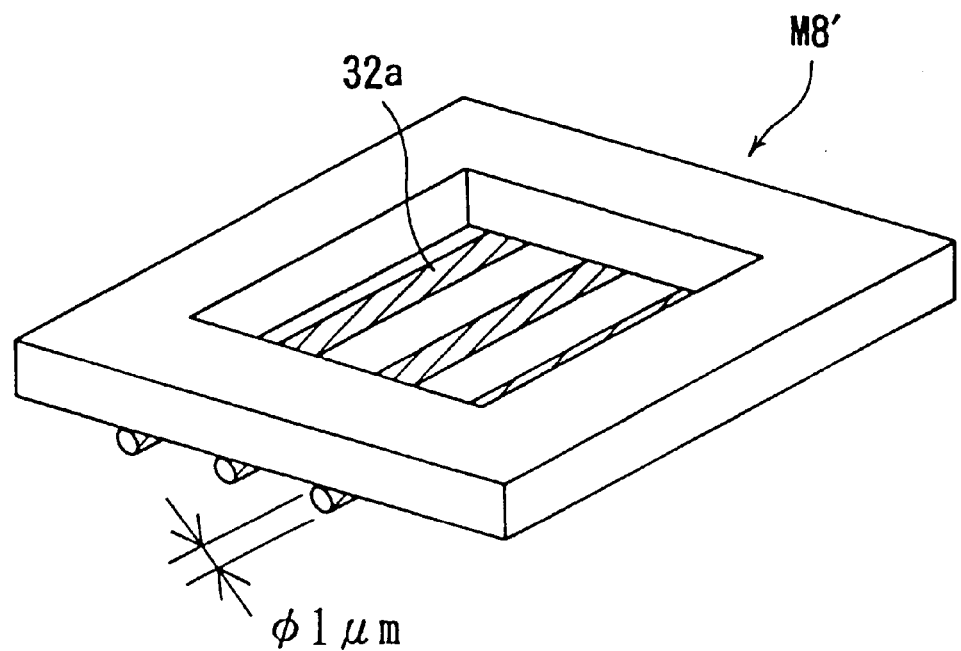
φ1μm
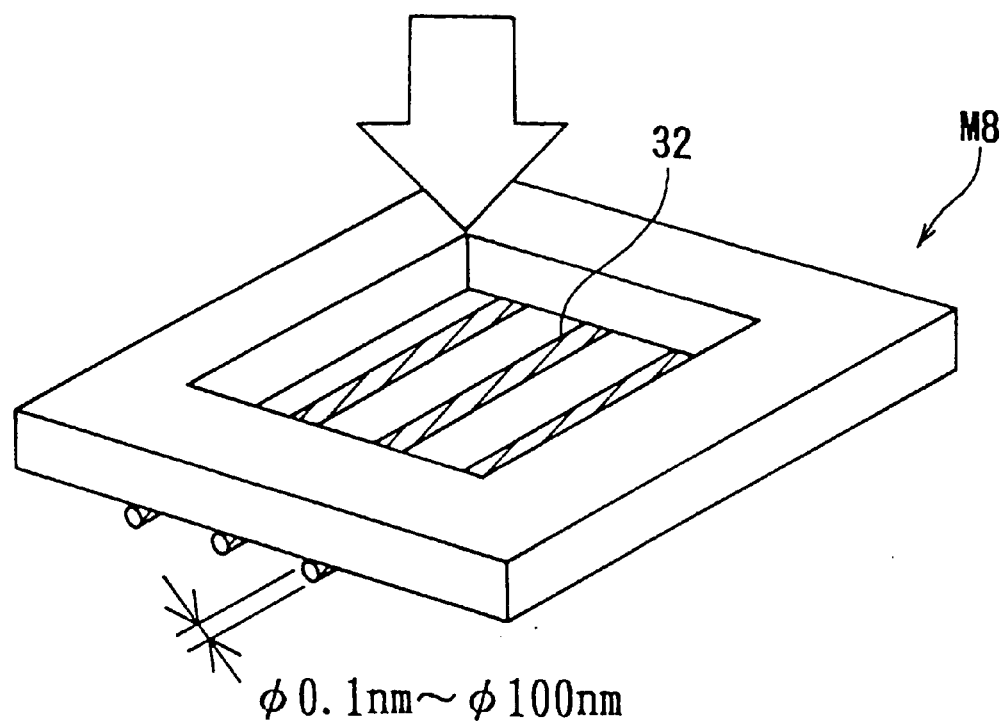
φ0.1nm ~ φ100nm

F I G. 19
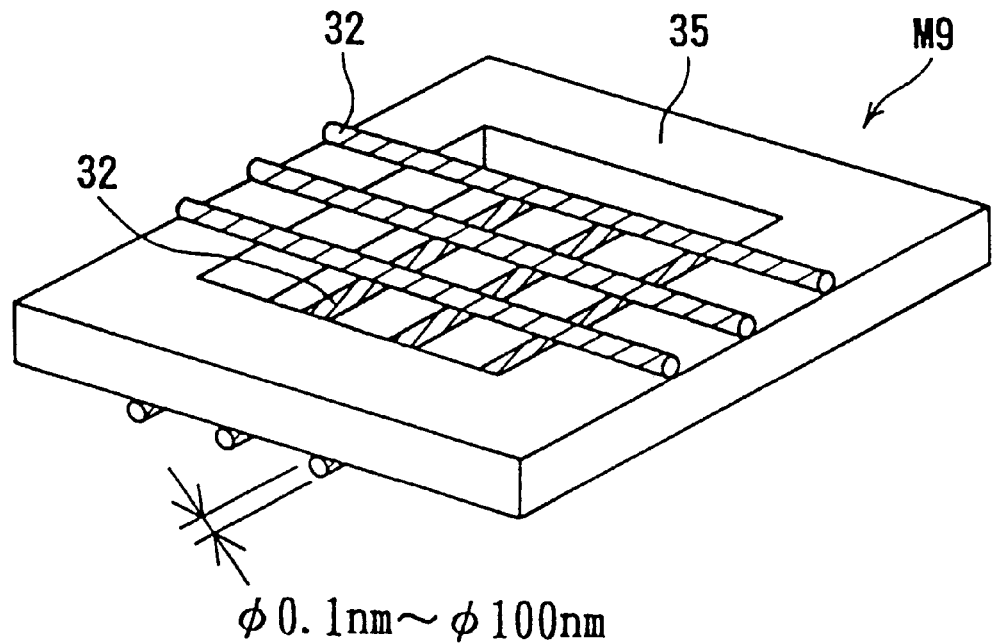
φ0.1nm~φ100nm
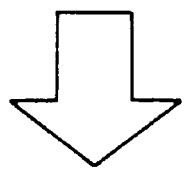
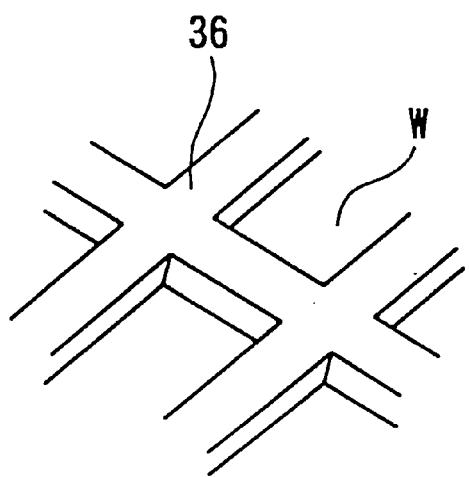

F I G. 25A
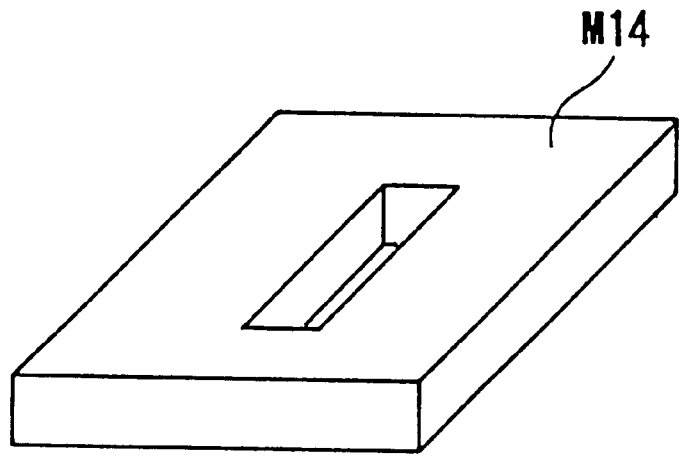
F I G. 25B
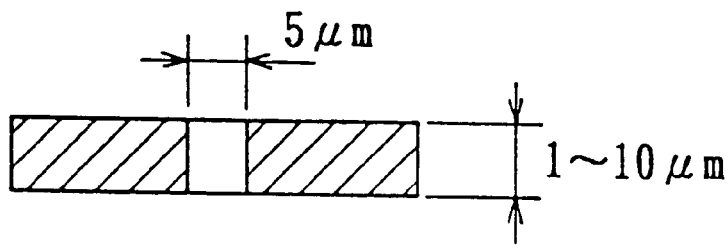
F I G. 27
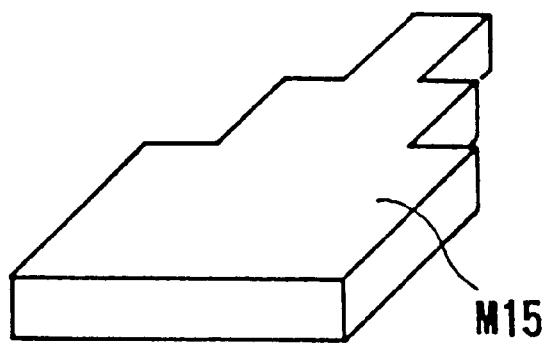

F I G. 33A
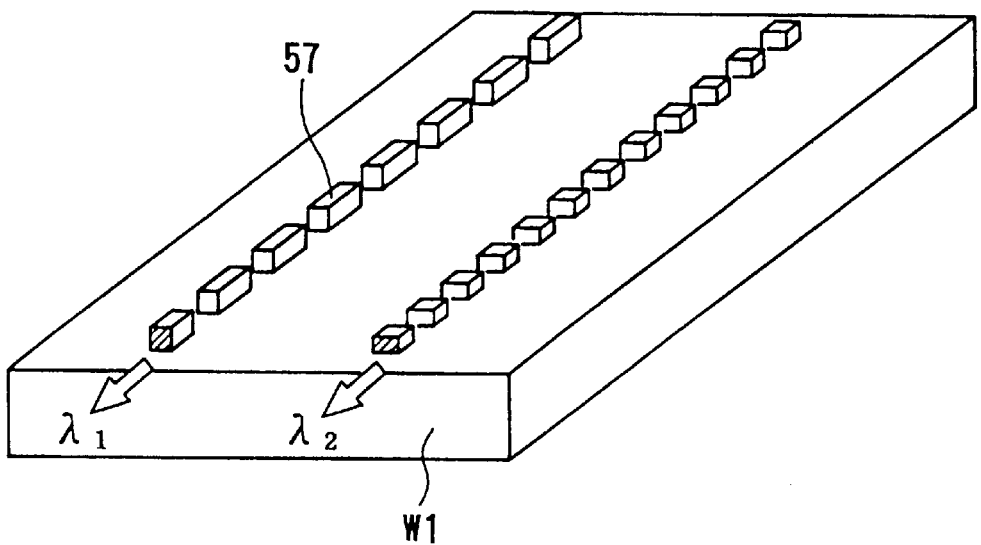
F I G. 33B
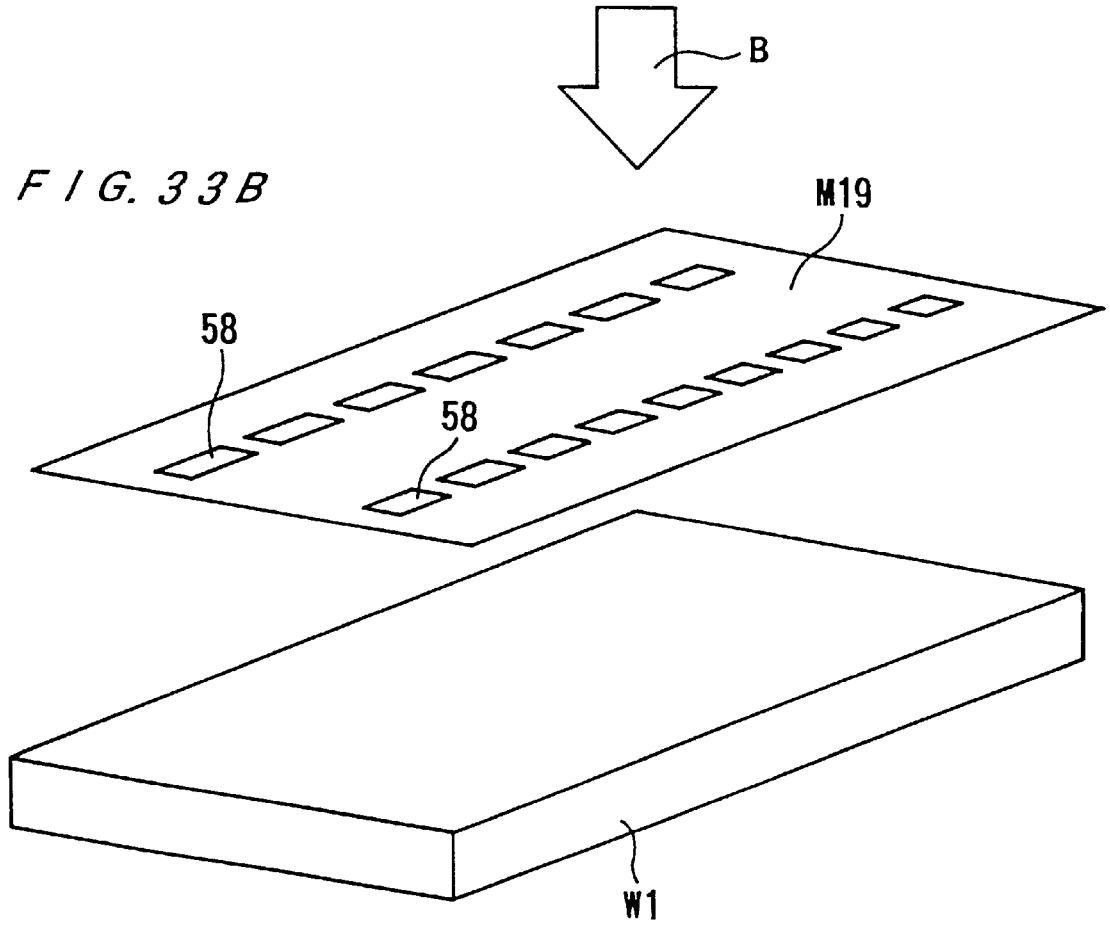

F I G. 34A
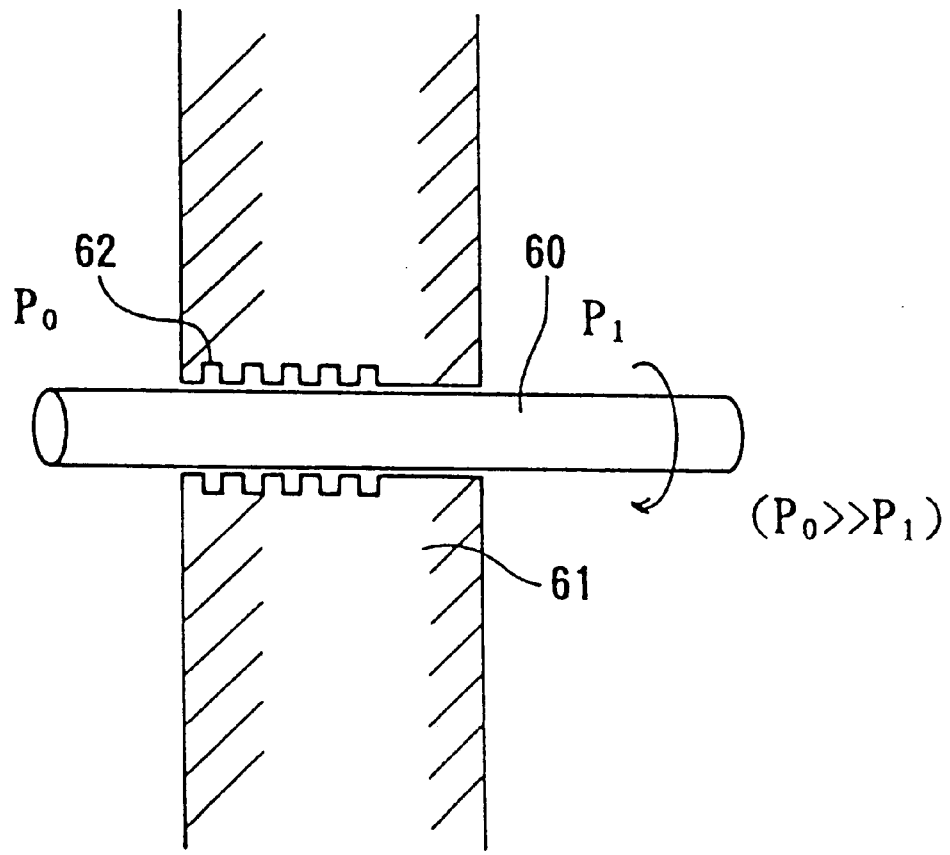
$(P_0 \gg P_1)$
F I G. 34B
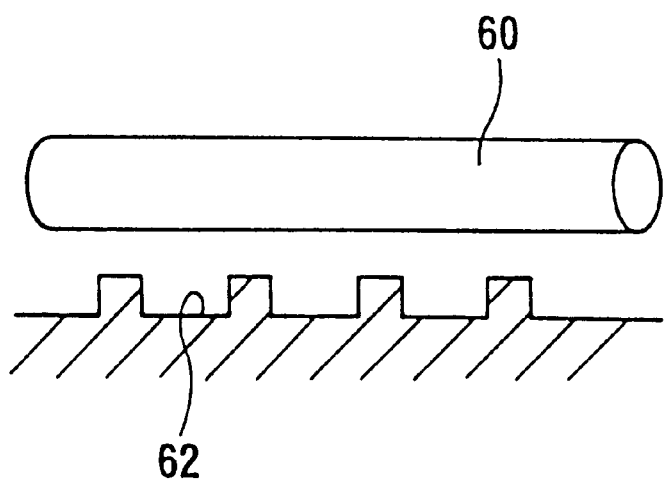

F I G. 3 5
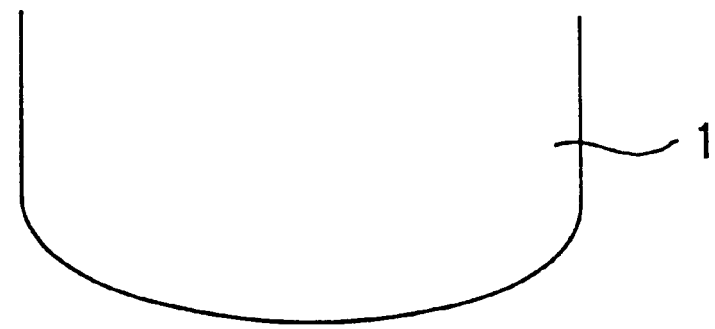
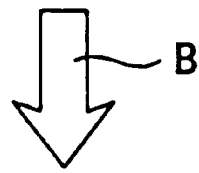
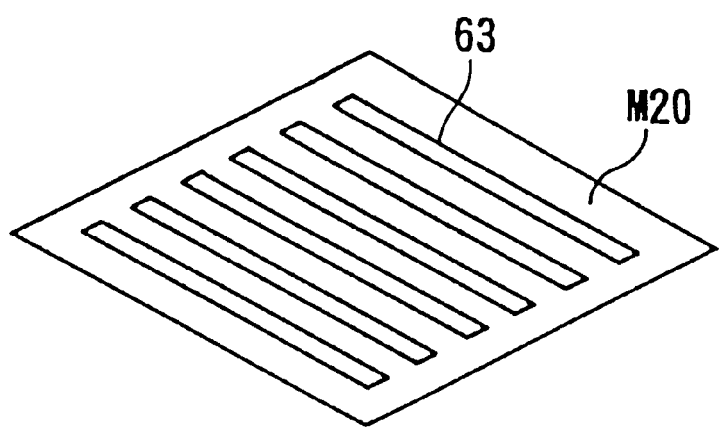
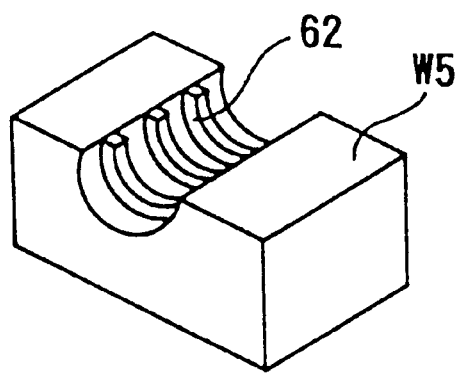

F I G. 4 1
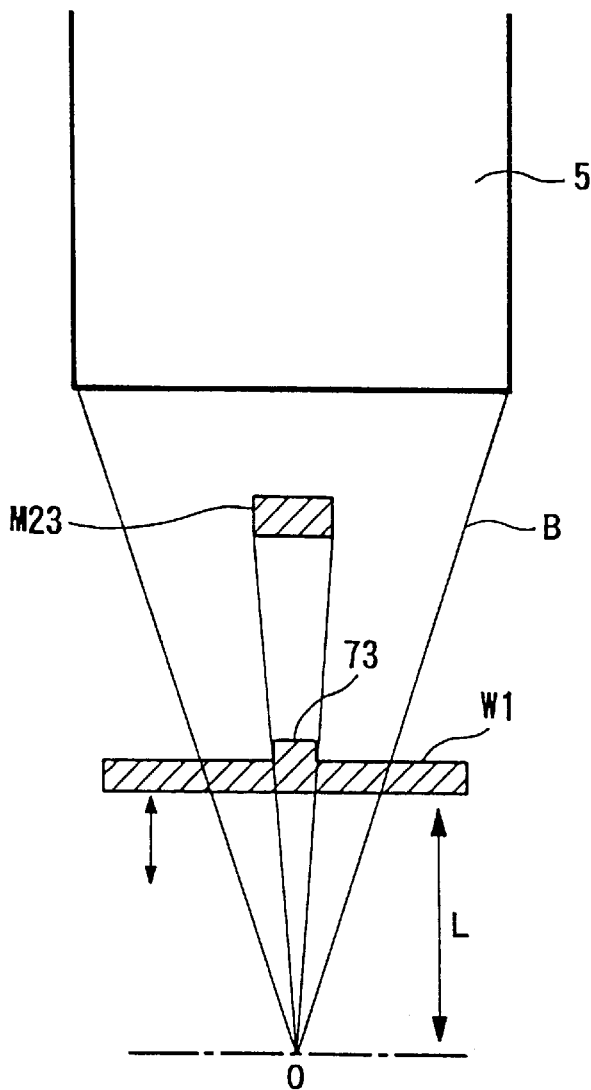
F I G. 4 2
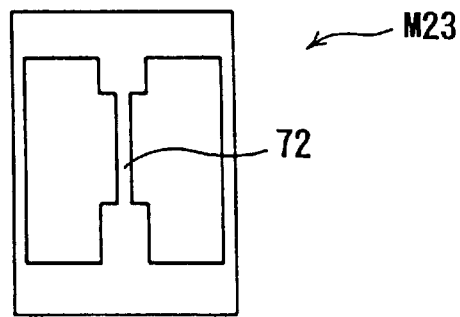

F I G. 47
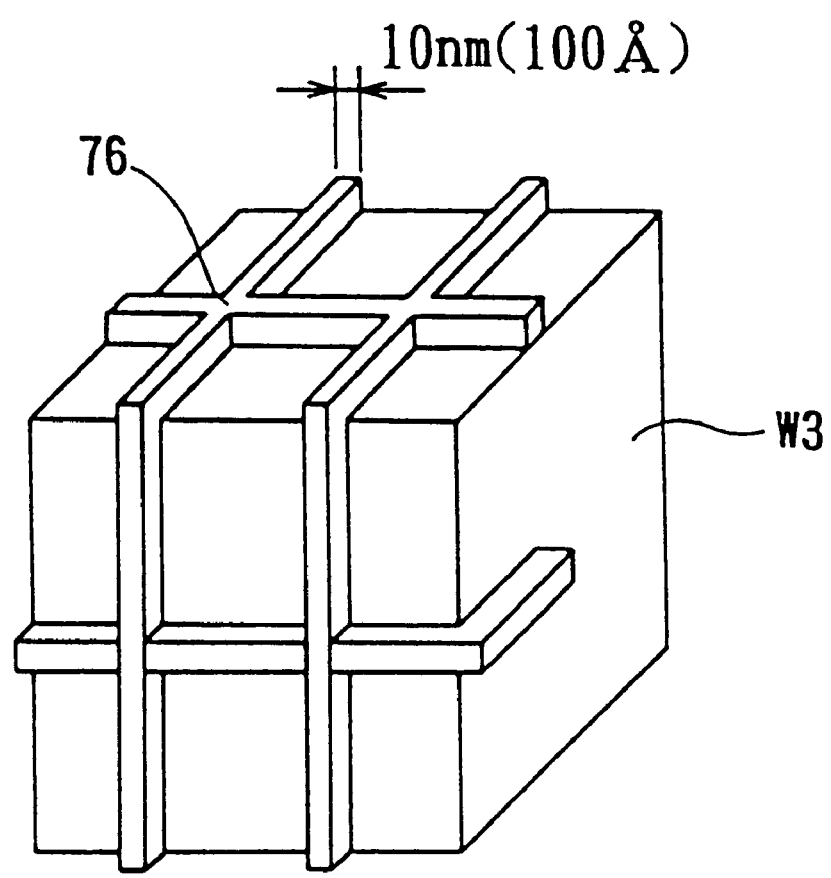

F I G. 54
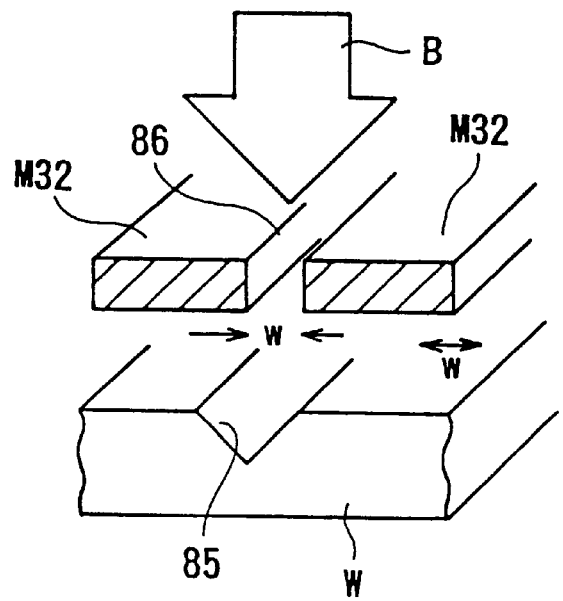
F I G. 55
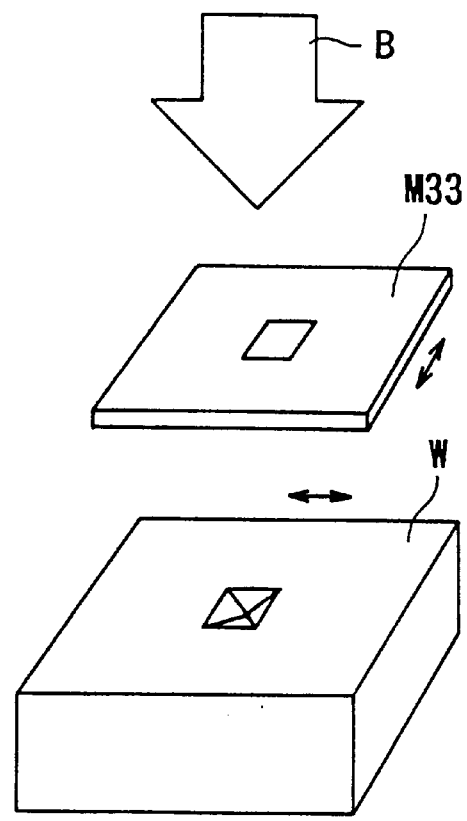

F I G. 65
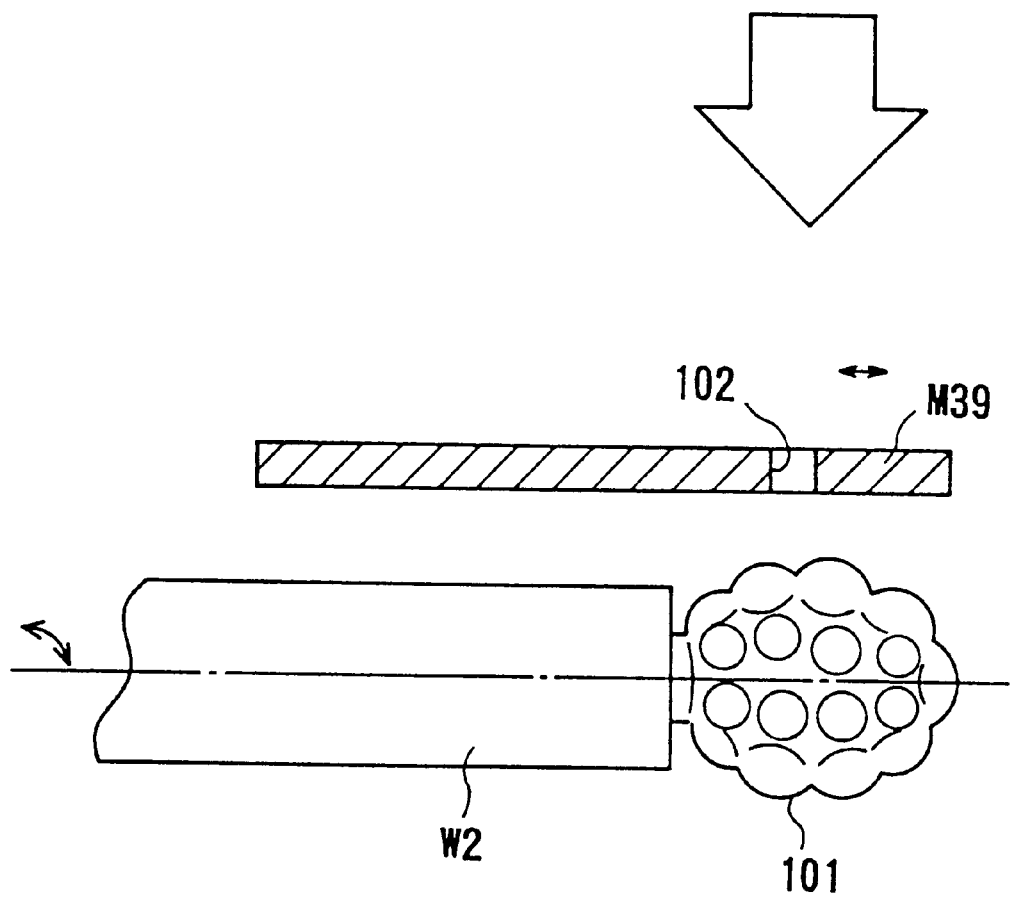

F I G. 71A
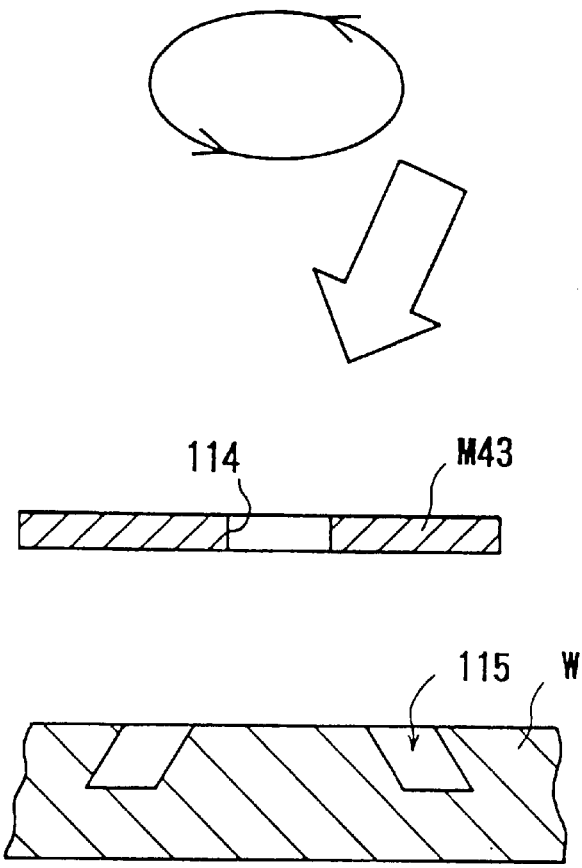
F I G. 71B
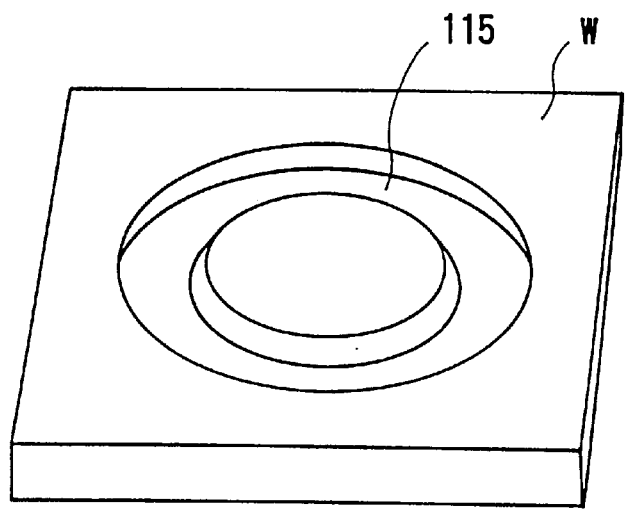

F I G. 74
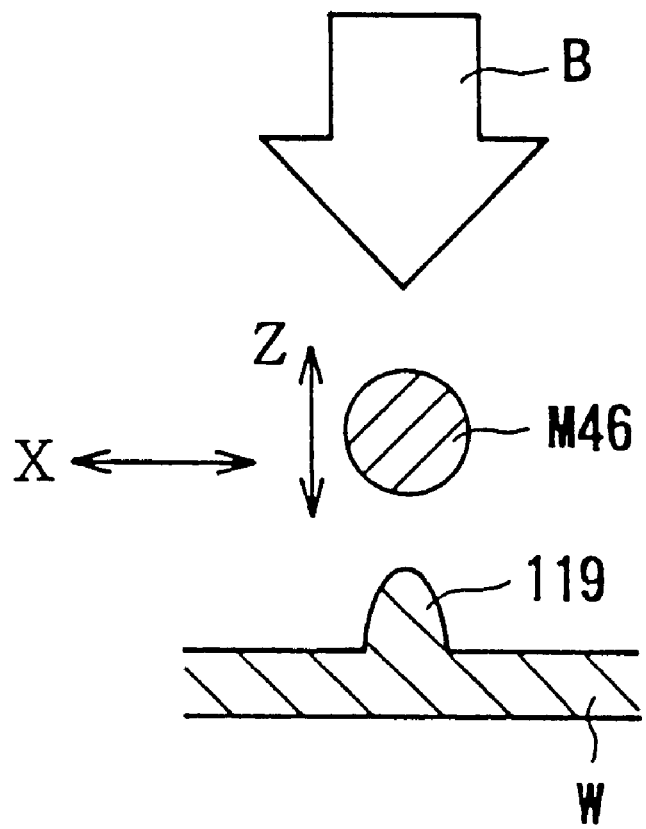

$\lambda_1 > L, \lambda_2 < L$

F I G. 8 8
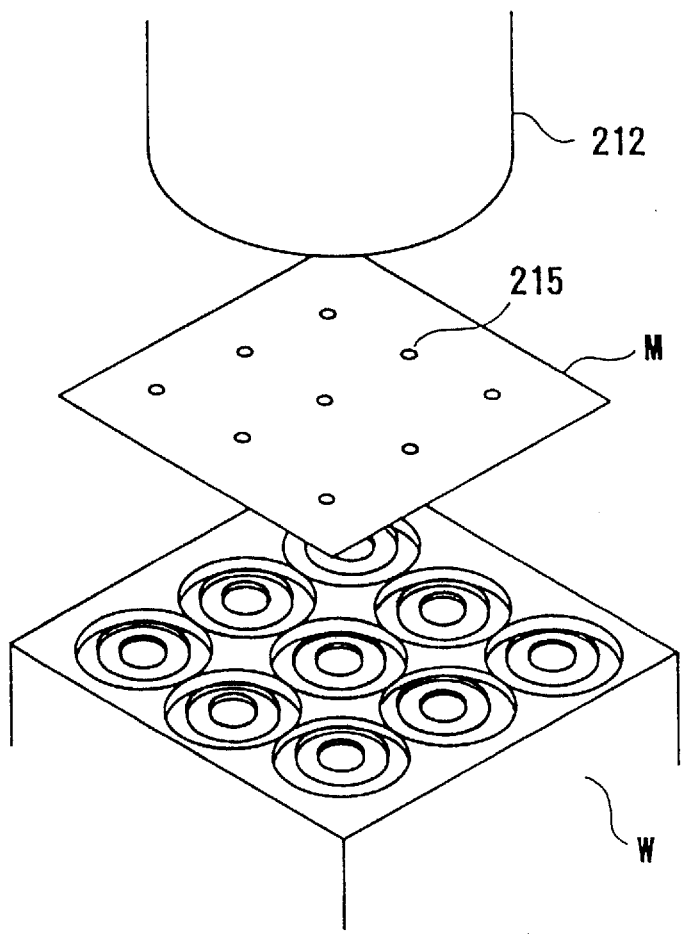
F I G. 8 9
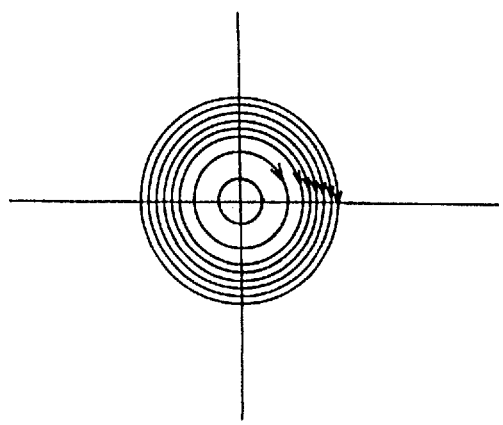

F/G. 90
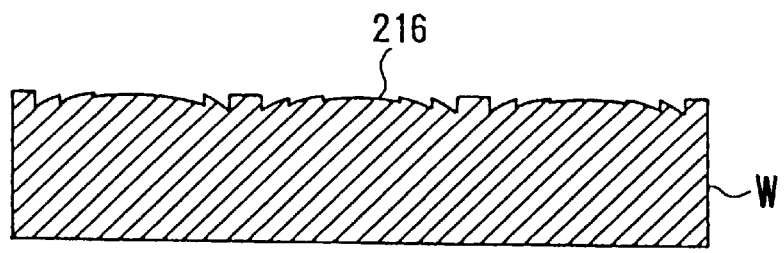
F/G. 91
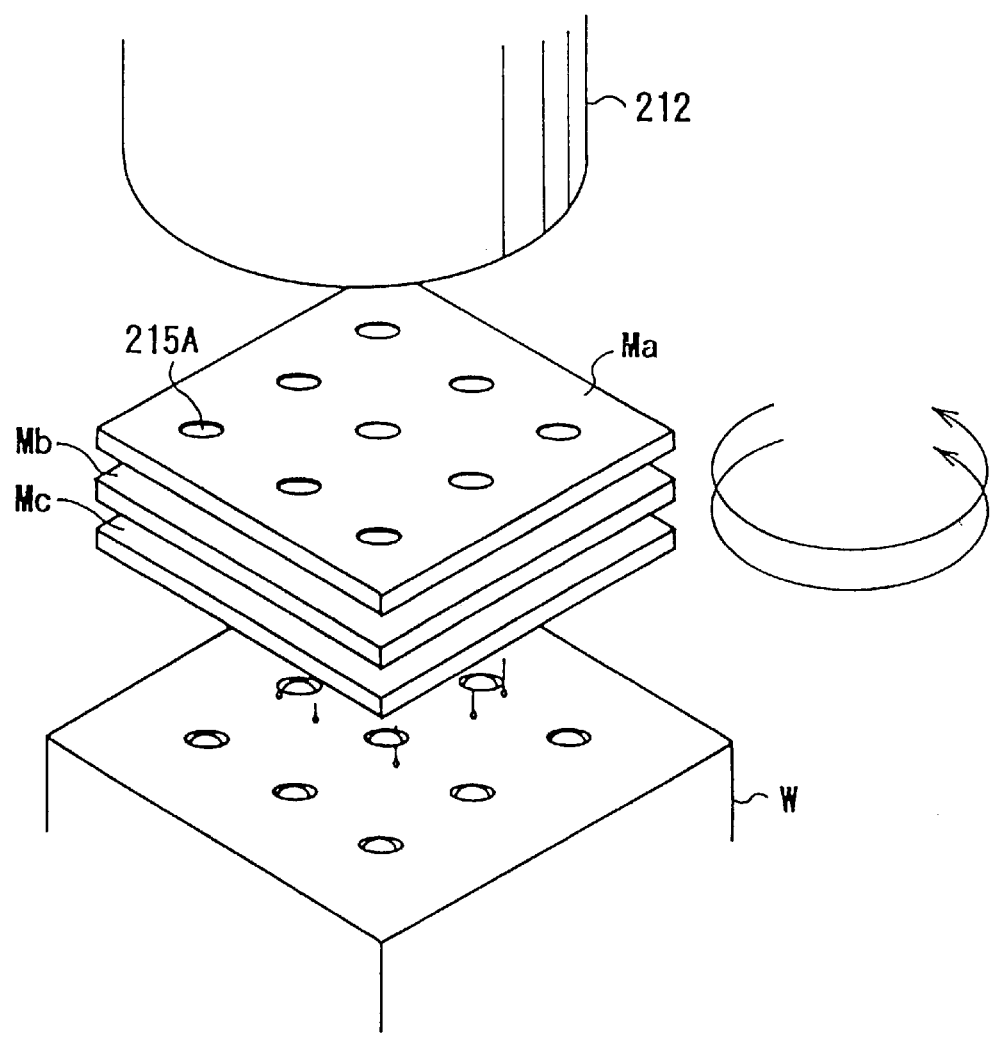

F I G. 92A
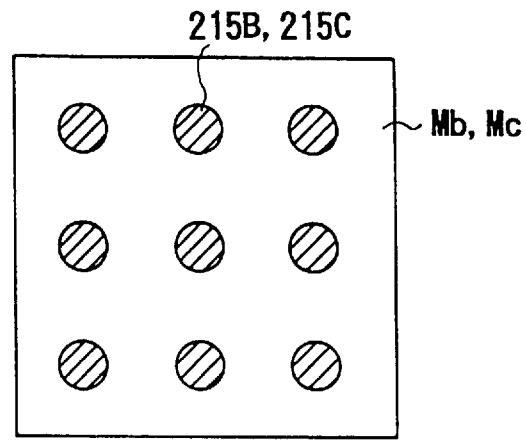
F I G. 92B
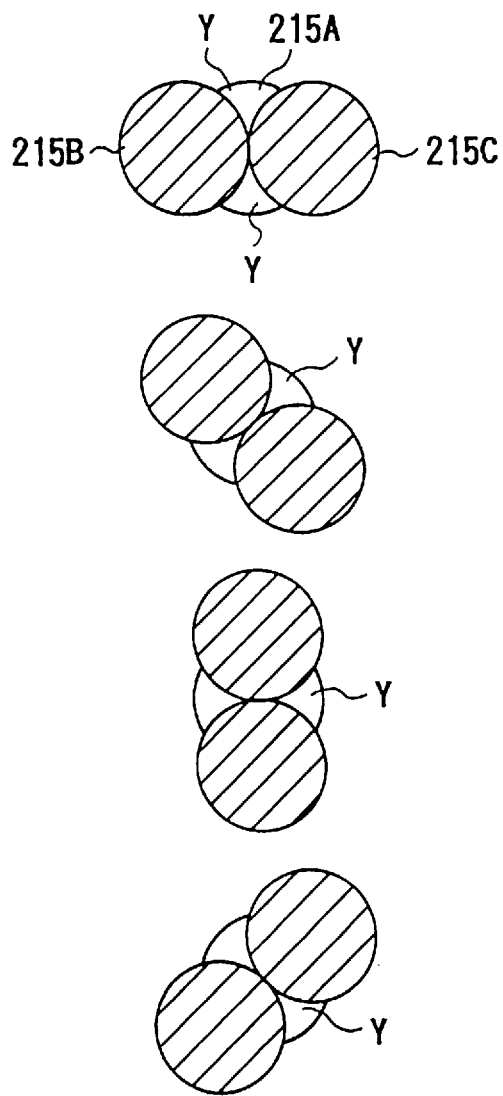

F I G. 95
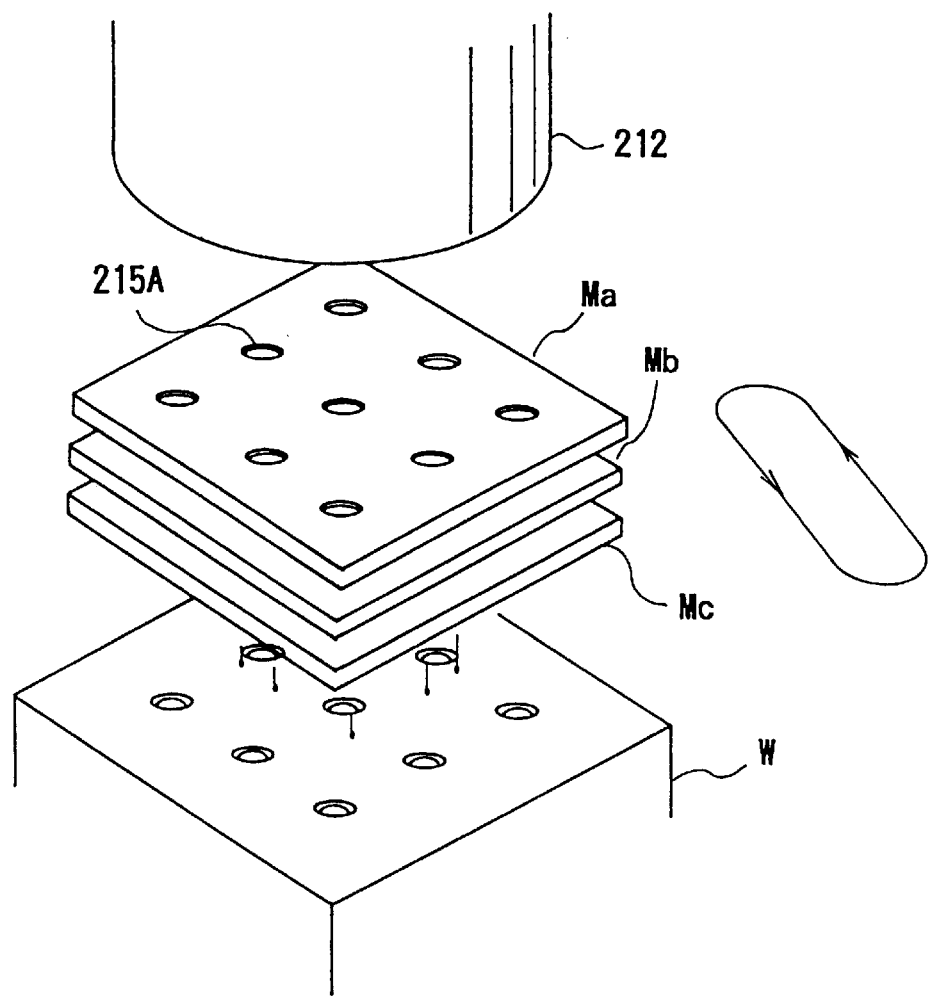
F I G. 96
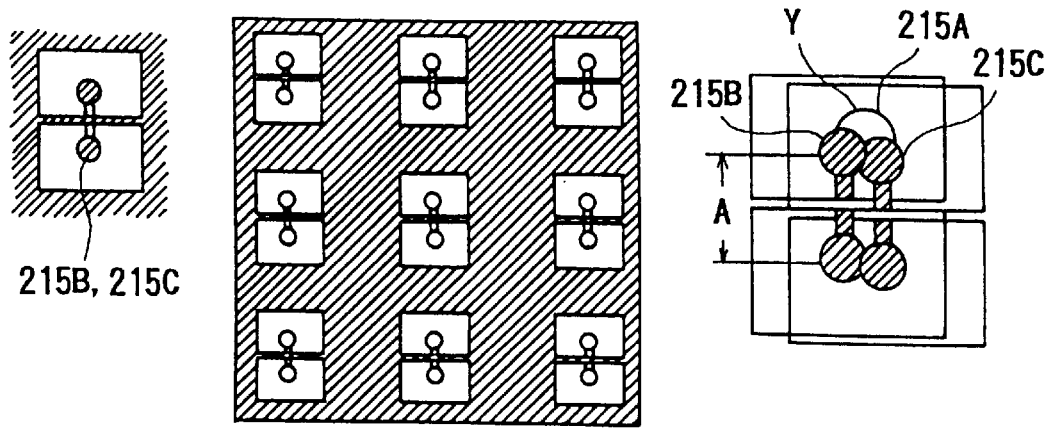

F I G. 1 0 0
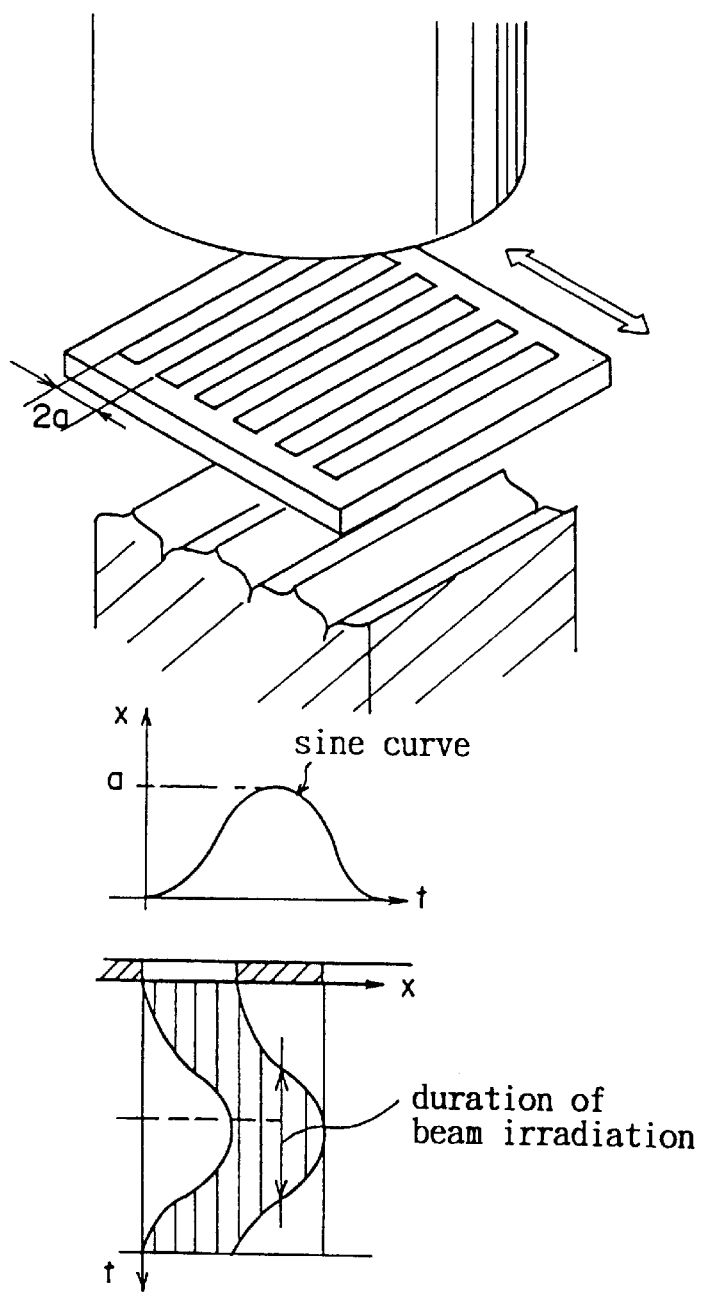
F I G. 1 0 1
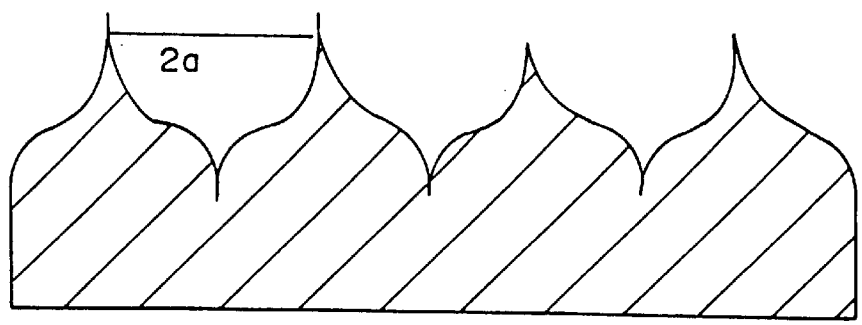

FIG.102
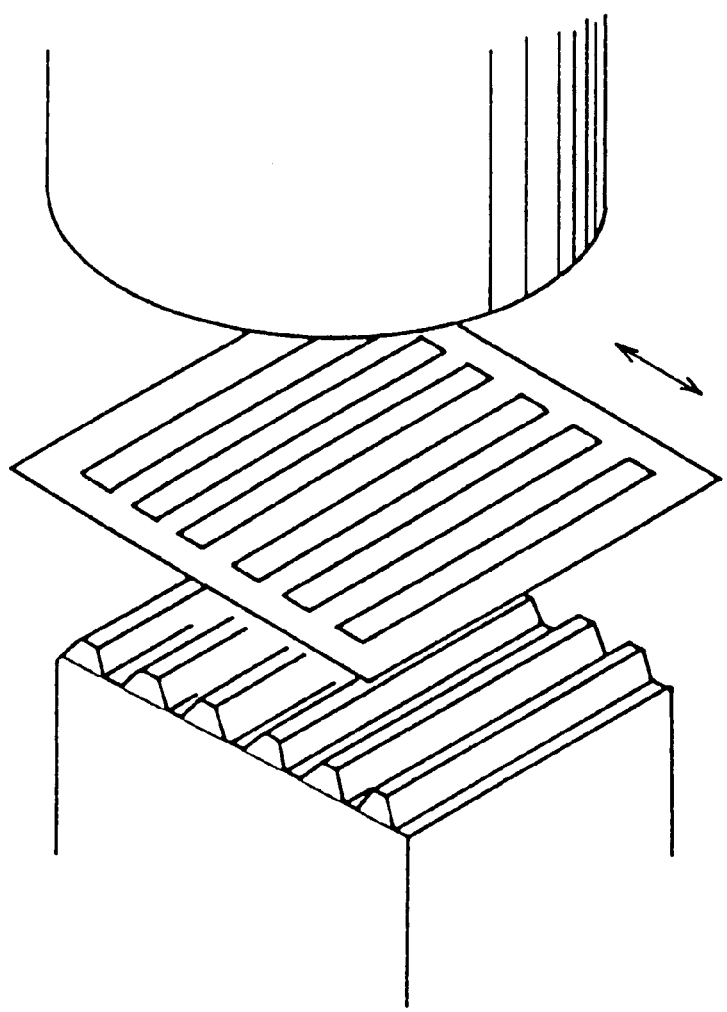
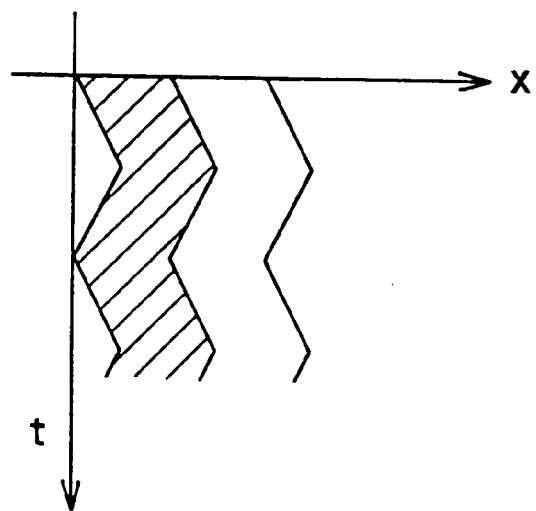

F I G. 1 0 5
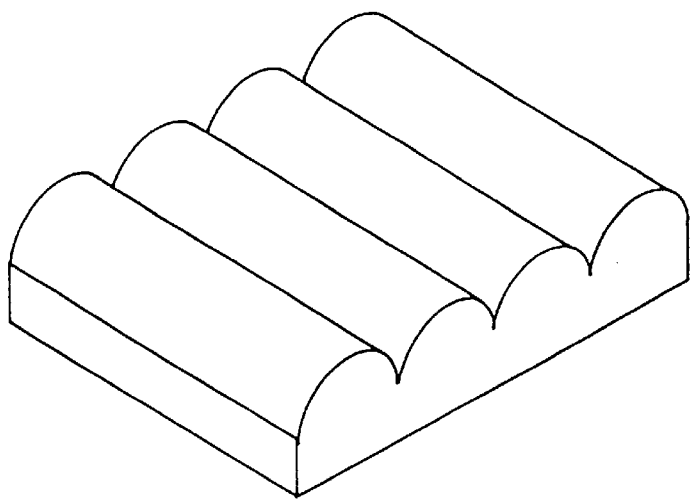
F I G. 1 0 6
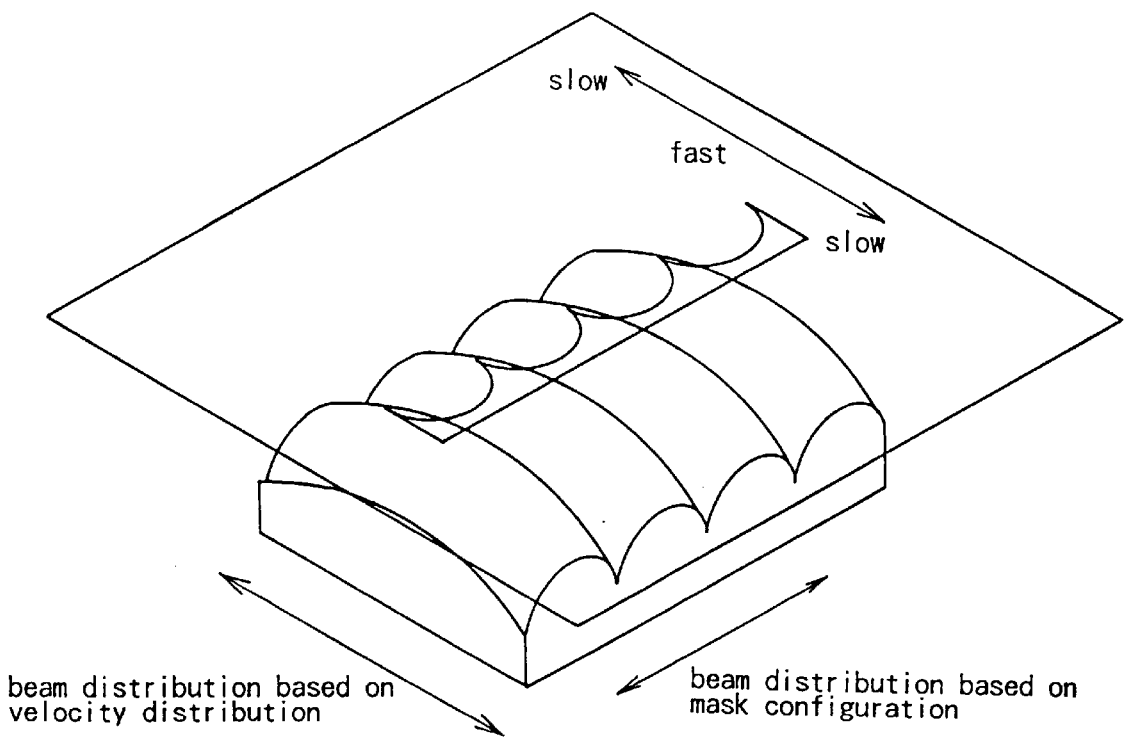

F I G. 1 0 9
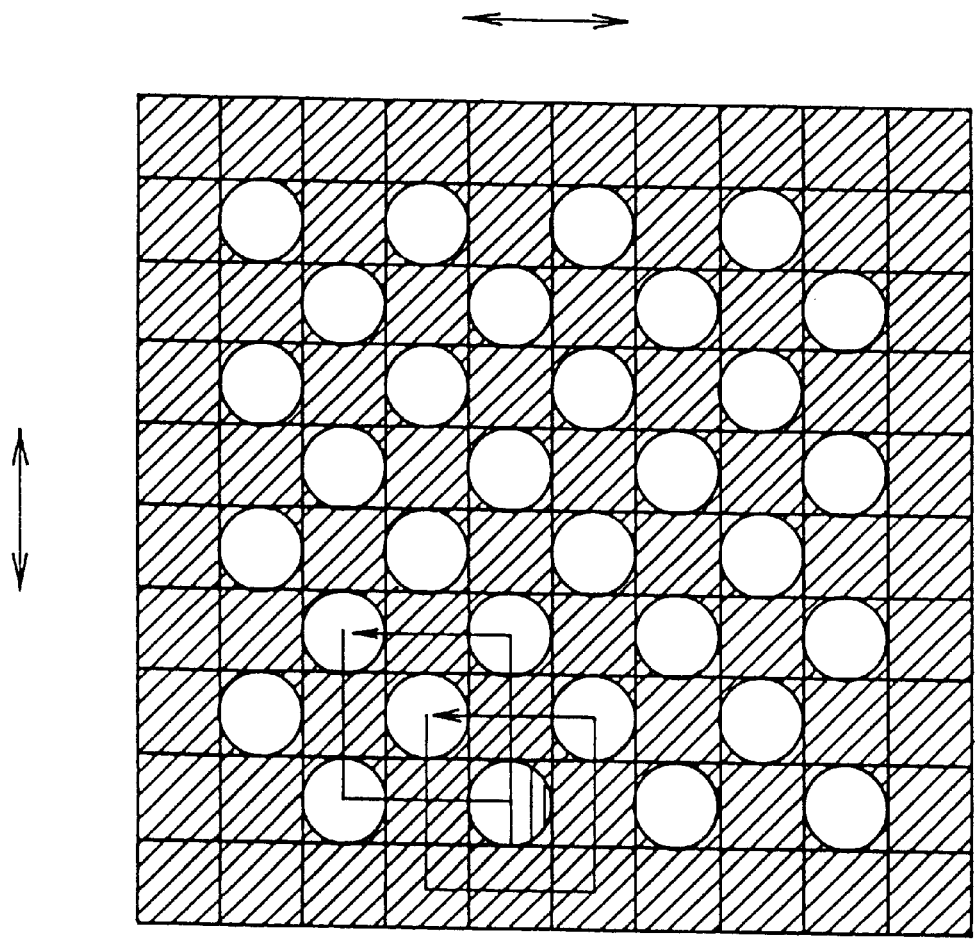
F I G. 1 1 0
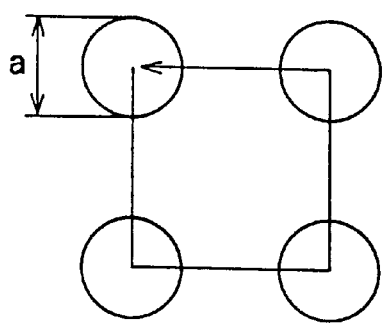

F I G. 1 1 3
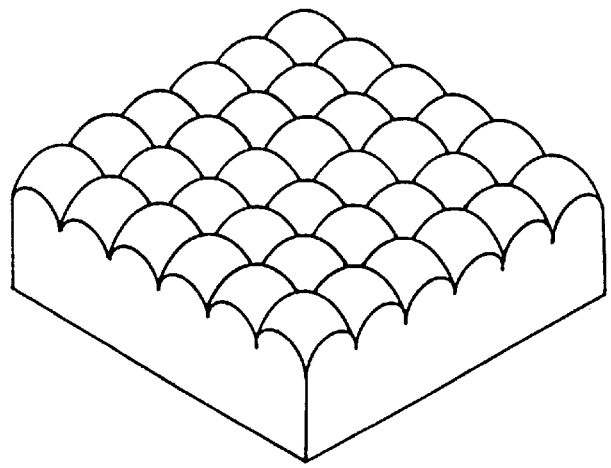
F I G. 1 1 4
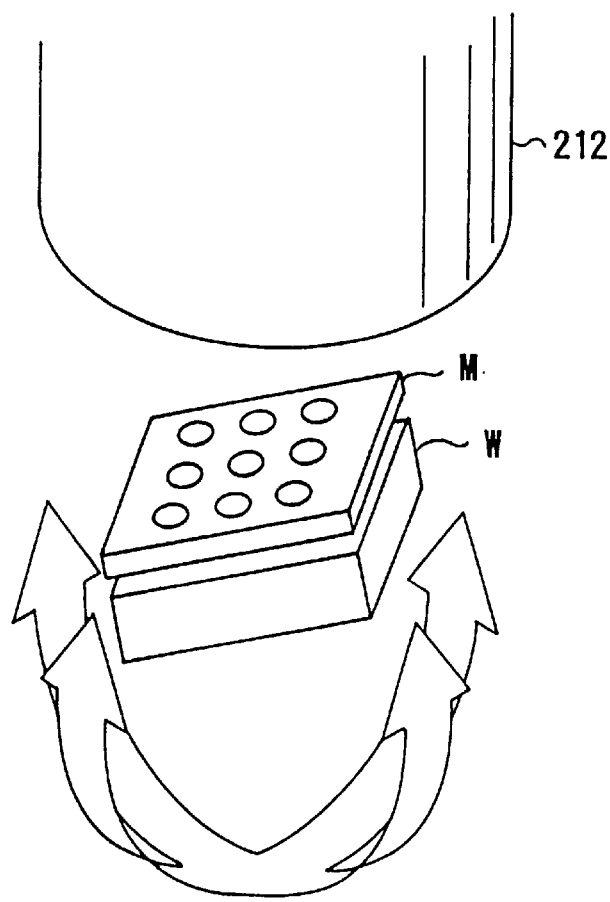

F I G. 115
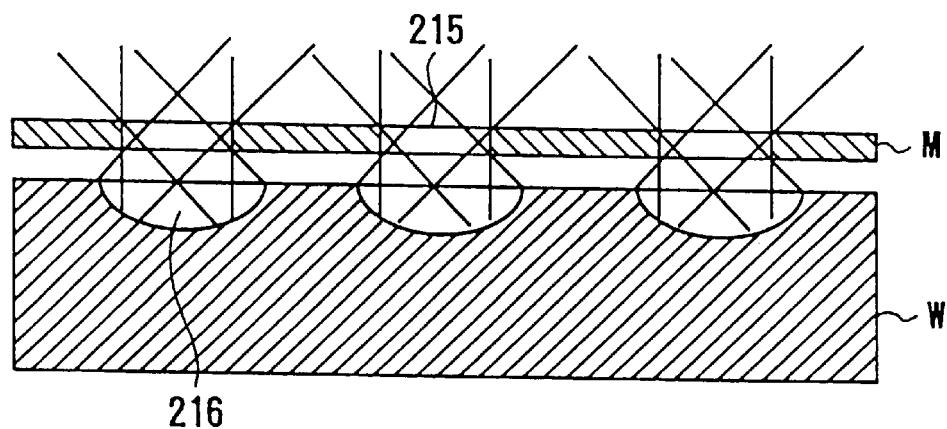
F I G. 116
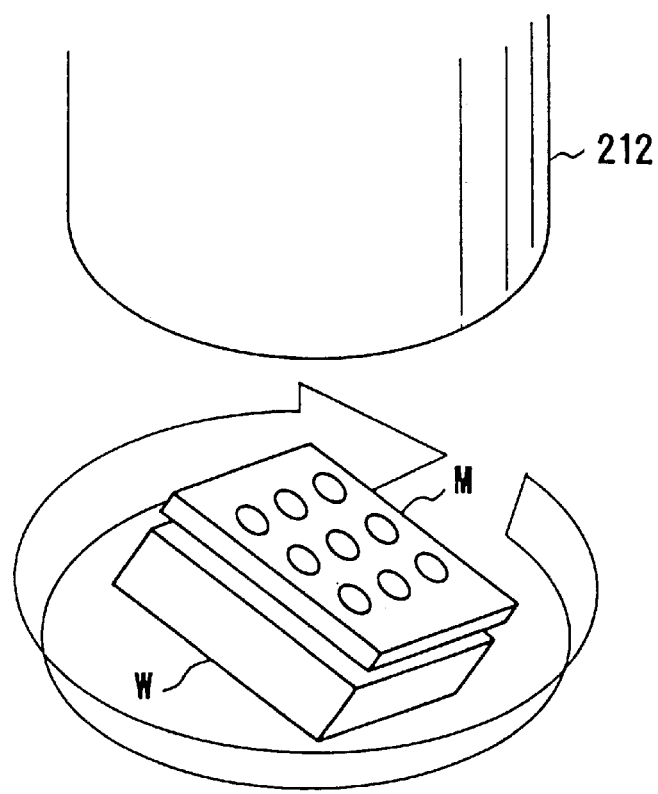

F I G. 1 1 7
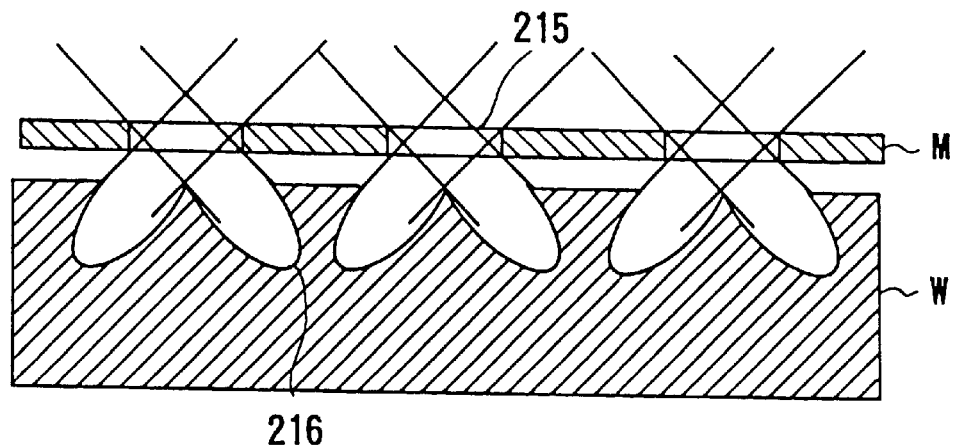
F I G. 1 1 8
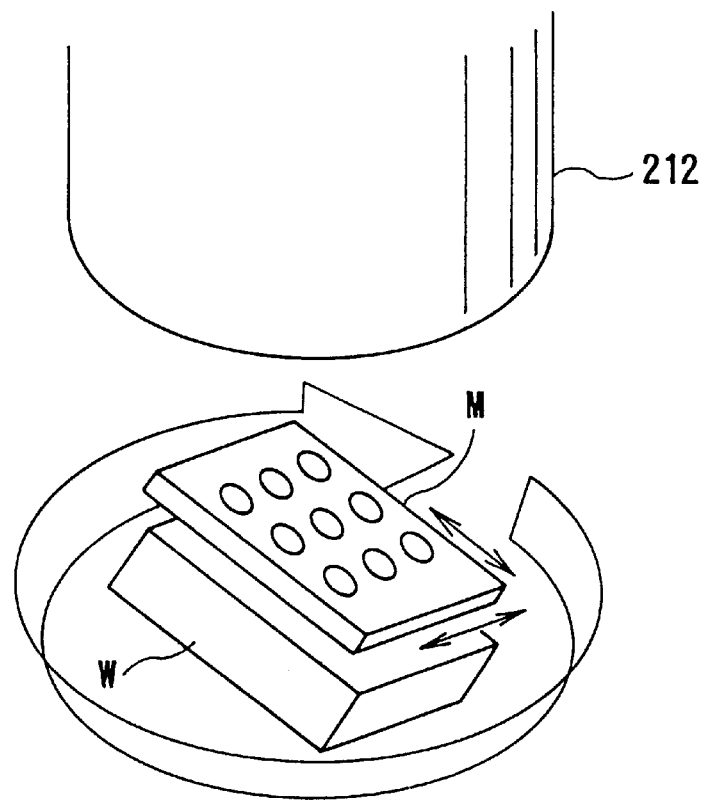

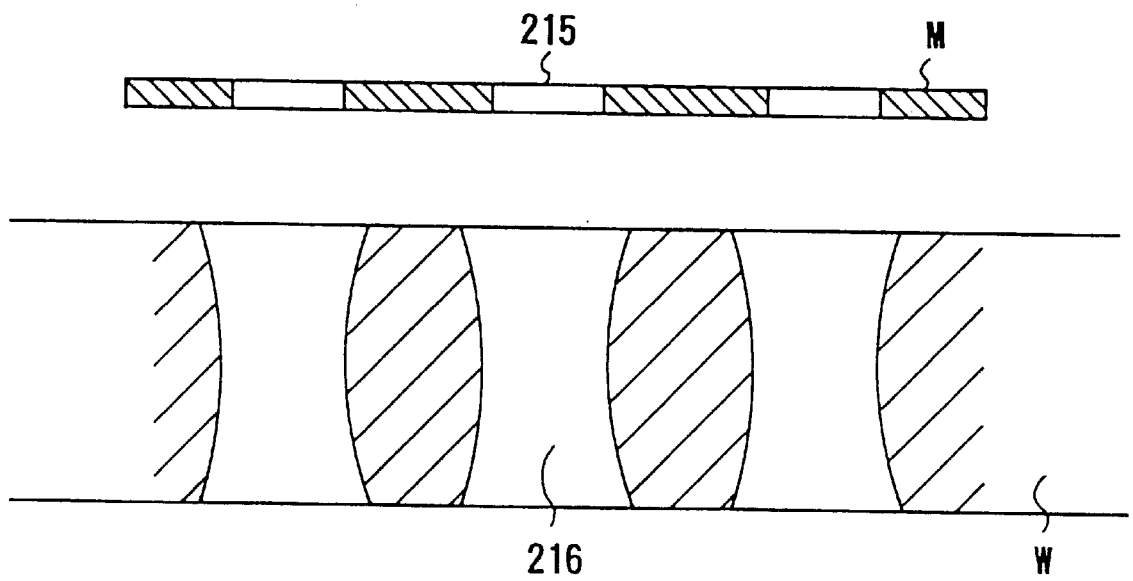
F I G. 1 1 9

→ mass production products

→ mass production products

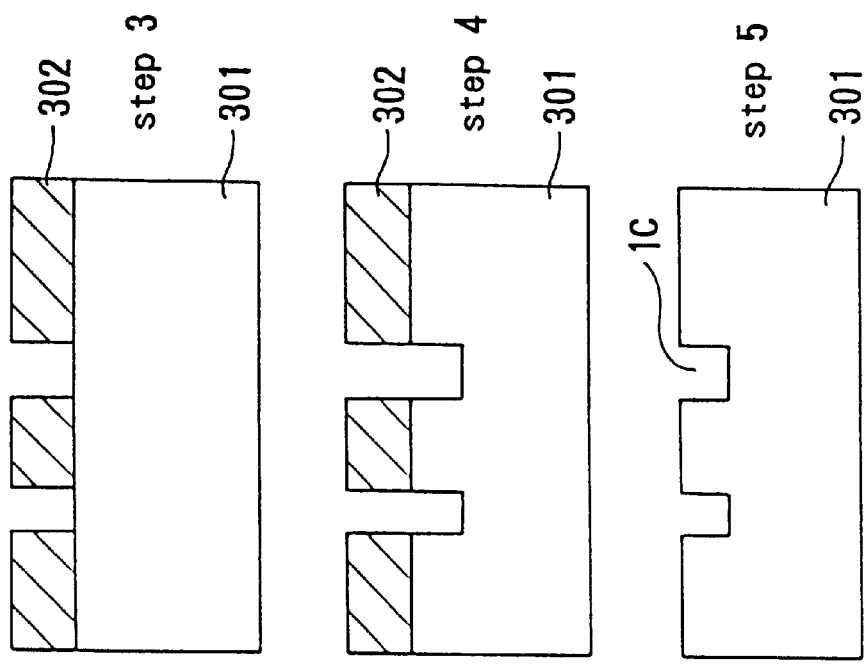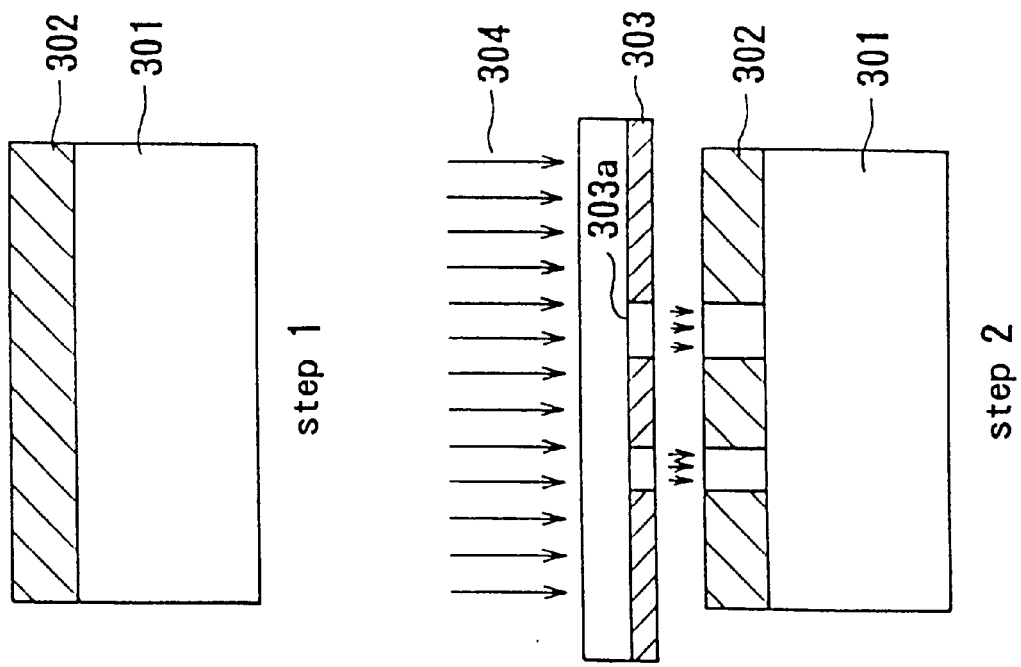
FIG. 121

FABRICATION APPARATUS EMPLOYING ENERGY BEAM

This is a divisional application of application Ser. No. 08/617,376, filed Mar. 18, 1996, now U.S. Pat. No. 5,868,952, issued Feb. 9, 1999.

BACKGROUND OF THE INVENTION

1. Field of the Invention

The present invention relates in general to a microfabrication apparatus using energy beams and relates in particular to an ultra-fine microfabrication apparatus which is applicable to making of quantum effect devices, optical lenses, friction reduction devices and fluid seals.

2. Description of the Related Art

Conventional semiconductor device fabrication has been carried out with the use of photolithography as illustrated in FIG. 121. In such a method, those regions of a substrate which are not to be fabricated are covered with a photomask, and the unprotected regions are exposed to an ultra-violet beam for photographic development, or energized ions in the case of plasma processing. The depth of fabrication is controlled by adjusting the time of material etching.

A more detailed explanation of the photolithographic method will be given below. In step 1, a photoresist material 302 is applied as a coating on the fabrication surface of a substrate base 301. In step 2, a photomask 303 is placed on the target surface which is irradiated with an ultra-violet beam 304, thereby transferring the device pattern 303a formed on the photomask 303 onto the photoresist 302. In step 3, the device pattern 303a is photographically developed to remove the photoresist 302 from the UV-exposed regions of the device pattern 303a so that the fabrication surface of the substrate base 301 will be exposed. In step 4, selective etching is performed using ions and radicals in a plasma discharge acting on the exposed surface of the base 301, and finally in step 5, the remaining photoresist 302 is removed. By going through the five steps outlined above, cavities 1c which are identical to the device patterns 303a are formed on the base 301. This basic cycle is repeated to complete the formation of device cavities.

The conventional photolithographic fabrication method is capable of forming cavities having a relatively simple cross sectional profile. However, curvatures and inclined depth profile shapes can only be made by preparing a series of patterns having gradually changing patterns. Fabrication is performed by successively exchanging the patterns and repeating the exposure and development processes to form the curves and complex profiles in stages. This approach is not only time consuming and laborious, but also the precision of the final product is not suitable for microfabrication of advanced devices such as quantum effect devices.

The basic process of photomasking inherently is a complex process involving the steps of: application of photoresist coating, washing, exposure, baking and photographic development. The exposed surface must then be processed by some energy beam to remove the base material, after which the masking must be removed. The overall process is cumbersome and laborious and results in high cost of production. Furthermore, surface roughness and flatness of the fabrication surface affect the precision of pattern making, and thus severely lower the yield of the process.

Further, the residual photoresist masking material, after the completion of the photolithographic processing step, must be removed somehow, and if ashing is used, for example, the quality of the surface may be damaged, and if a solution is used, contamination or obscurity of shape may result, both of which adversely affect the post-fabrication surface of the product.

The use of plasma for fabrication processing presents a problem of random incident beam angles of ionic particles, and the variation in the incident beam angle is further aggravated by the local charge accumulation in a small surface area. These problems result in a prominent tendency for homogeneous etching, particularly in the case of microfabrication processing, and produces devices with low flatness at the bottom of etched grooves and low verticality of the side walls of the grooves. These problems present a severe limitation in the precision of fabrication, particularly for making device patterns in the ultra-fine range of less than 1 $\mu$m.

SUMMARY OF THE INVENTION

It is an object of the present invention to provide an ultra-fine micro-fabrication apparatus, having a high degree of freedom in making fine-structural patterns, with high precision even on curved or slanted surfaces of a workpiece.

Such object is achieved by a micro-fabrication apparatus for processing a fabrication surface of a workpiece for producing a fine-structure on the fabrication surface by irradiating the workpiece with an energy beam generated from an energy beam source, and interposing a mask member, having a fine-structural pattern, between the energy beam source and the workpiece, wherein the mask member is disposed directly on or distanced from the fabrication surface of the workpiece so as to produce a fine-structure on the fabrication surface of the workpiece.

According to the invention, because the mask member is provided as a separate body, processing of the fine-structural pattern is facilitated, and fine and complex patterns can be generated. Because the mask member is not attached to the fabrication surface, the technique is not restricted by the nature or the shape of the fabrication surface.

An aspect of the invention is that it includes at least one process of etching, forming of a film, joining and bonding.

Another aspect of the invention is that the mask member is made flexible so as to enable deformation to conform to contours of the fabrication surface so that an uneven surface configuration will not interfere with fabrication.

Another aspect of the invention is that a plurality of fabrication surfaces can be processed so as to simultaneously or successively expose the fabrication surfaces to the energy beam, thereby eliminating the requirement of charging a workpiece and removing the processed workpiece from a reaction chamber for each processing operation on a workpiece surface.

Another aspect of the invention is that the mask member is repeatedly made to undergo relative movement with respect to the workpiece so as to superimpose the fine-structural pattern repeatedly on a fabrication surface, thereby enabling production of a superimposed fine-structure in one location or several fine-structures in different locations.

Another aspect of the invention is that the relative movement about an axis so that a fine-structure may be produced on a peripheral surface or on multiple side surfaces.

Another aspect of the invention is that at least one of the energy beam source, the mask member and the workpiece is made to undergo a relative movement with respect to the remaining components while controlling a duration of exposure to irradiation of the fabrication surface with the energy beam so as to produce a fine-structure on the fabrication surface, whereby fine-structures can be produced without being limited by the surface configuration such as the height and depth of the fine-structure to be made on the fabrication surface. The separated mask member facilitates making of fine-structural patterns to enable making fine and complex patterns. There is no need to attach the mask member to the workpiece, and thus the technique is not limited by the surface configuration.

Another aspect of the invention is that at least one of the energy beam source, the mask member and the workpiece is made to undergo a continuous relative movement with respect to the remaining components so as to produce a fine-structure having a smooth or an inclined surface, thereby enabling fabrication of not only simple fine-structures but also those having curved surfaces or complex surface configurations.

Another aspect of the invention is that the mask member is moved along the surface configuration or along a particular direction while the workpiece is being irradiated, and then along a fine slanted-structure extending in the direction of the movement in accordance with a variation in the speed of the movement. This approach enables production of a three-dimensional fine-structure by using a mask member having a simple structural pattern. Schedules of speed changes can be easily stored in a computer, thereby enabling numerical control accurately and automatically.

Another aspect of the invention is that the mask member is a stationary mask member to define a maximum area of exposure to irradiation, and the stationary mask member may be exchanged with another mask member to produce a more complex fine-structure on the fabrication surface.

Another aspect of the invention is that a degree of exposure to irradiation is controlled on a basis of a distribution of openings in a fine-structural pattern, thereby enabling production of a fine-structure using a mask member having different beam transmission areas of fine-structural patterns along a direction crossing a movement direction. By combining the effects of different degrees of exposure to irradiation widthwise with the effects due to different speeds, even more complex fine-structures can be produced.

Another aspect of the invention is that the mask member is made of a material having a different reactivity than the workpiece, so that only the workpiece will react selectively to the beam and the fine-patterns on the mask member are preserved. This approach will ensure not only that the service life of the mask member is prolonged but that contamination from the material of the mask will be prevented. It is also permissible to provide a coating only on the surface of the mask member.

Another aspect of the invention is that the mask member is provided with a fine-structural pattern comprising a repetition of a common shape, thereby enabling reproduction of a fine-structure with the use of only one mask member.

Another aspect of the invention is that the energy beam includes a fast atomic beam, an ion beam, an electron beam, a laser beam, a radiation beam, an X-ray beam, an atomic beam and a molecular beam, i.e., an electrically accelerated energy beam. Combined with pretreatment to generate an energy beam of good linearity and directionality, fabrication can be made selectively, and a fine-structure can be accurately produced according to the fine pattern in accordance with the position and the movement speed of the mask member. By using an energy beam of high directionality, beam energy can be transmitted to even narrow regions of the fabrication surface so that a fine-structure having a high aspect ratio, which is difficult to produce with plasma processing, can be produced.

A fast atomic beam (FAB) is an electrically neutral beam, and its directionality is excellent, therefore, an FAB is applicable to a wide range of materials, and the beam is able to penetrate into fine holes or deep recesses so that even the bottom surface of the fine-structure can be processed to be precisely flat and vertical side walls can be made precisely vertical.

Ion beams are useful in processing electrically conductive materials such as metals. An electron beam is adaptable to various beam shapes, such as a shower beam or a fine beam, both of which can be highly controlled and used in conjunction with reactive gases to provide enhancement in surface reaction.

Laser, radiation and X-ray beams have particular energies and wavelengths and produce different effects on the fabrication surface. These beams can be used to remove materials from the surface to produce a fine-structure, or used in conjunction with reactive gas particles adsorbed on the fabrication surface to induce activity to remove material from the surface with the activated particles.

The selection of a beam from among the laser, radiation and X-ray beams depends on the size of the fine-structural patterns, the nature of the fabrication surface and the different behaviors of reactive gas particles. When the size is extremely small, for example, structural patterns smaller than the wavelength of a laser beam would be difficult to fabricate so that shorter wavelength beams such as X-ray or radiation beams will have to be used. Atomic or molecular beams are low energy particle beams, and fine-structures having low surface damage may be produced. It can be seen that the choice will have to be made on the basis of the nature of each application.

By using an energy beam which is a focused beam, reduced projection imaging is made possible. The size of the fine-structural pattern on the mask member is reduced in size and is projected onto the fabrication surface, thereby enabling production of a fine-structure having a pattern of reduced size compared to the size of the pattern of the mask member. To control the degree of reduction, the beam focusing angle or the separation distance between the mask member and the workpiece is adjusted. Thereby, a degree of size reduction of the order of tens of thousands is possible.

The reduced projection imaging technique is particularly useful when making a fine-structure pattern on the mask member is difficult, for example when a 0.1 nm line width is required but the structural pattern can be made only to a 10 nm size.

Another object is to provide an apparatus for use with the micro-fabrication method presented above. The apparatus includes an energy beam source, a specimen stage disposed in a beam axis for holding a workpiece, a mask member having a fine-structural pattern, and a positioning device for providing a relative movement of at least one of the energy beam source, the mask member and the workpiece with respect to the remaining components.

The positioning device may be made so that it can be moved continually relative to at least one of the beam source, the mask member and the workpiece to produce a fine-structure having a smooth or inclined surface.

Still another object of the present invention is to provide a mask member to use with the micro-fabrication method presented above. The minimum size of the fine-structural pattern on the mask member is in a range of 0.1 to 10,000 nm. A beam transmission opening may be produced by thinning a region of the mask member and forming an opening in such thinned region.

BRIEF DESCRIPTION OF THE DRAWINGS

FIGS. 1A–1C are perspective views of a first embodiment of the ultra-fine microfabrication apparatus of the present invention.

FIG. 15 is a perspective view of another mask member used in the fabrication apparatus.

FIG. 17 is a perspective view of a post-fabrication step of the processing of the mask member shown in FIG. 16.

FIG. 19 is a perspective view of still another mask member used in the fabrication apparatus.

FIGS. 25A–25B are schematic views of still another mask member used in the fabrication apparatus.

FIG. 27 is a perspective view of still another mask member used in the fabrication apparatus.

FIGS. 33A–33B are perspective views of an embodiment of a quantum effect device made by the fabrication apparatus.

FIGS. 34A–34B illustrate an example of a bearing having a labyrinth seal made by the fabrication apparatus of the present invention.

FIG. 35 illustrates a method of making the bearing shown in FIG. 34.

FIG. 41 is a schematic illustration of an example of the fabrication apparatus based on reduced projection imaging of the present invention.

FIG. 42 is the mask member for use with the apparatus shown in FIGS. 6A–6C.

FIG. 47 is an example of a fine-structure produced by the method shown in FIGS. 46A–46B.

FIGS. 48 to FIGS. 76 are views illustrating various examples of the fabrication apparatus.

FIG. 88 is an illustration of still another example of the fabrication apparatus of the present invention.

FIG. 89 is an illustration of the movement of the beam transmission hole.

FIG. 90 is a cross-sectional view of the fine-structure produced by the apparatus shown in FIG. 89.

FIG. 91 is an illustration of still another example of the fabrication apparatus of the present invention.

FIGS. 92A–92B are illustrations of an example of a fine-structural pattern having beam blocking patches and movements of the patches.

FIG. 95 is an illustration of still another example of the fabrication apparatus of the present invention.

FIG. 96 shows various patterns of beam transmission holes and beam blocking patches formed by the apparatus shown in FIG. 95.

FIG. 100 is an illustration of still another example of the fabrication apparatus of the present invention.

FIG. 101 is a cross sectional view of the fine-structure made by the apparatus shown in FIG. 100.

FIG. 102 is an illustration of still another example of the fabrication apparatus of the present invention and showing time of motion of the mask member.

FIG. 105 is an illustration of the fine-structure made by the mask member shown in FIG. 104.

FIG. 106 is an illustration of still another example of fabrication using the mask member shown in FIG. 104.

FIG. 109 is an example of a mask member having lattice structured beam transmission holes.

FIG. 110 is an illustration of movement of the mask member shown in FIG. 109 based on a square trace.

FIG. 113 is a perspective view of the fine-structure produced by the mask member shown in FIG. 112.

FIG. 114 is an illustration of still another example of the fabrication apparatus of the present invention.

FIG. 115 is a cross sectional view of the fine-structure produced by the apparatus shown in FIG. 114.

FIG. 116 is an illustration of still another example of the fabrication apparatus of the present invention.

FIG. 117 is a cross sectional view of the fine-structure produced by the apparatus shown in FIG. 116.

FIG. 118 is an illustration of still another example of the fabrication apparatus of the present invention.

FIG. 119 is a cross sectional view of the fine-structure produced by the apparatus shown in FIG. 118.

FIG. 121 illustrates basic processing steps related to a conventional energy beam fabrication method.

DESCRIPTION OF THE PREFERRED EMBODIMENTS

FIGS. 1A–1E shows the basic approach to the fabrication apparatus of the present invention. A method of operation thereof comprises the steps of placing mask members M1 on a fabrication surface of a target workpiece w|W1 and irradiating the workpiece W1 with an energy beam B as illustrated in FIG. 1A. The mask members M may be rods (for example fine wires) having a width dimension in a range of either 0.1–10 nm (nanometer); 10–100 nm; or 100 nm–10 $\mu$m (micrometer). By choosing a proper type of energy beam, the workpiece W1 can be fabricated as illustrated in FIG. 1B by the etching effect of the beam on the workpiece W1.

The energy beam may be chosen from a number of fast atomic beams (FAB) whose particles are not electrically charged and whose beam directivity is controllable. The FAB may be generated from a FAB source based on chlorine-or fluorine-containing gas, such as the one disclosed in Japanese Laid-open Patent Publication No. 5-121194. The highly directional FAB generated from such a source reaches the fabrication surface of the workpiece W1 after passing through the mask member M1, In the illustrated embodiment, the material of the workpiece W1 is Si-GaAs, but other semiconductor materials, insulators such as glass and quartz, and metals may be used. The mask member M1 may be made from materials such as tungsten, gold, silver, platinum and nickel which can be fabricated into fine wires by electro-forming to about 50 $\mu$m diameter. The mask member M1 is retained on the surface by some suitable means.

A process other than material removal method such as etching may also be utilized by varying the type of the process gas and the amount of the energy of the beam, for example, to form a thin film on the surface of the workpiece W1 as shown in FIG. 1C. In this case, the beam energy may vary between several eV to several hundreds of eV, and the type of gas can be any carbon-containing gas such as methane or any of aluminum-or titanium-containing gases. When the surface is irradiated with such a beam, insulating or conductive film may be formed on the irradiated regions, depending on the type of the gas, thereby transferring the pattern of the mask members M1 onto the fabrication surface.

Figure 2:
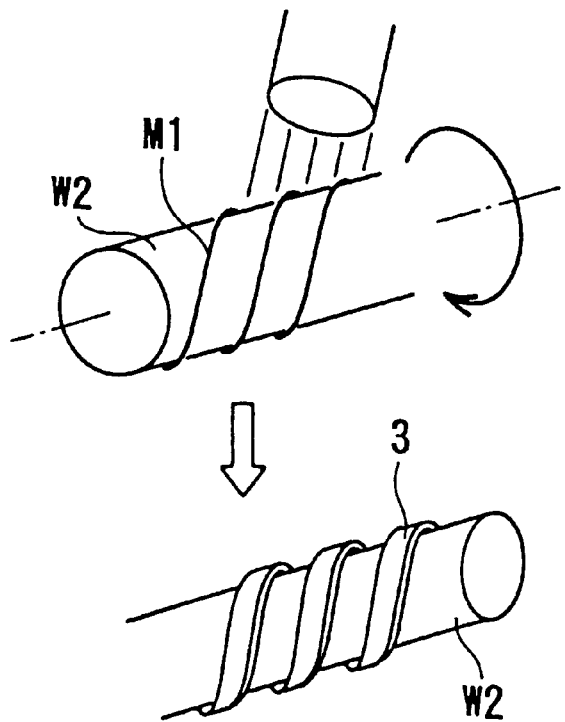
FIG. 2 is a perspective view of another embodiment of the ultra-fine microfabrication apparatus of the present invention.

FIG. 2 shows another embodiment in which the mask member M1 is laid directly on a workpiece W2. A fine mask wire M1 is spirally wound on a cylindrical workpiece W2 which is rotated about its rod axis in an energy beam. The resulting fine-structure after removing the material from the exposed region of the workpiece W2 is a spiral protrusion 3 formed below the mask member M1. It can be seen that a complex fine-structure can be formed by a relatively simple method of winding a mask member M1 directed on a three-dimensional workpiece W2.

Figure 3:
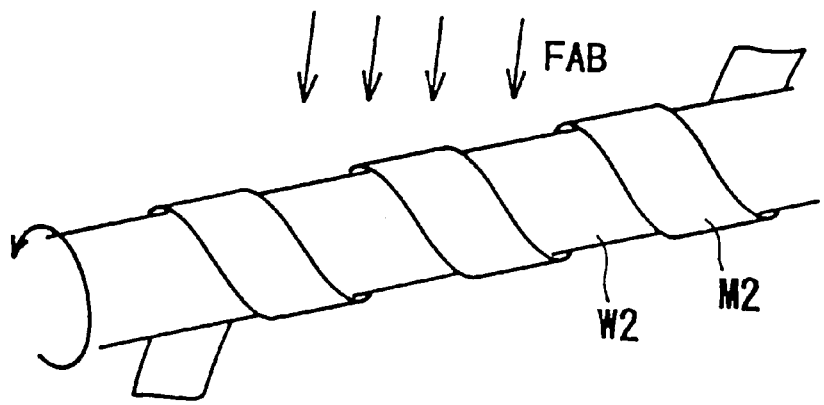
FIG. 3 is a perspective view of another embodiment of the ultra-fine microfabrication apparatus of the present invention.

FIG. 3 shows another application of winding a ribbon shaped mask member M2 (rather than wire-shaped) directly on the workpiece W2, thereby enabling formation of a wider spiral protrusion than the one shown in FIG. 2. The method is applicable to any shape of workpiece, for example, square rods, rectangular bodies, cones and spheres. It is also possible to fabricate a series of local regions to produce a final complex fine-structure. The mask member M2 may be provided with a patterned opening to produce more complex fine-structures. As shown by these examples, fine wires or thin film or foil may be used for mask material M to provide efficient multi-faced three dimensional fabrication to avoid the inefficiency of fabricating each face separately.

Figure 4A:
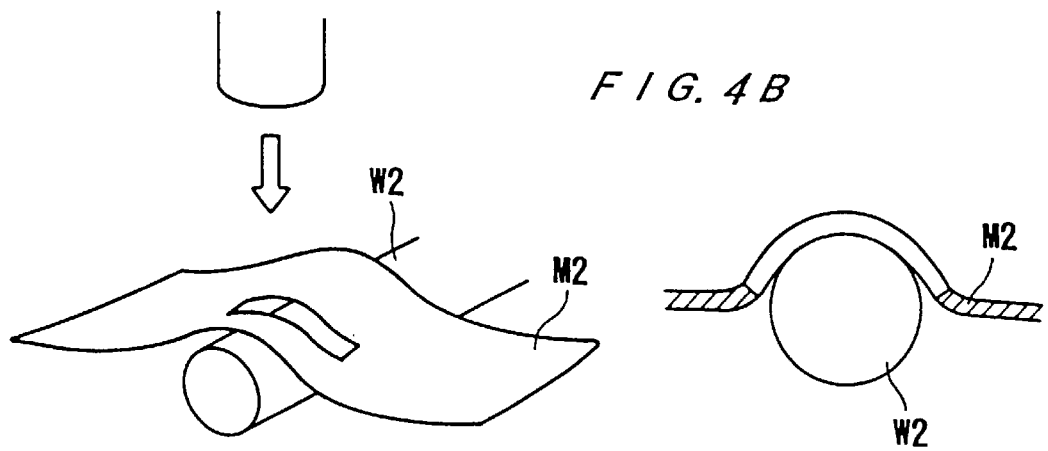
FIGS. 4A–4C are perspective views of another embodiment of the ultra-fine microfabrication apparatus of the present invention.
Figure 4B:
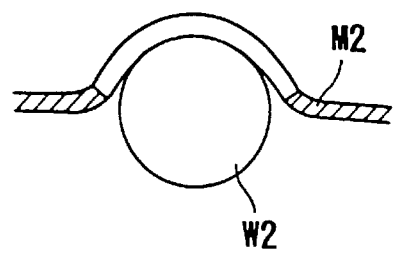
Figure 4C:
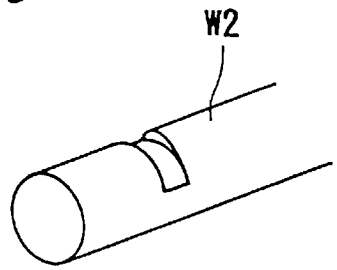

In the embodiment shown in FIGS. 4A–4C, a rod-shaped workpiece W2 is fixed on a stage together with a foil-shaped mask member M2. This arrangement is in contrast to a solid plate mask member M3 shown in FIGS. 5A–5C, and the advantage is that the mask member M2 can be made to intimately contact the workpiece W2 so that the separation distance between the mask member M2 and the workpiece W2 is short and constant, thereby permitting a well-defined pattern transfer. It is recognized that well-defined image transfer requires a separation distance of about 100 $\mu$m, and the contact is improved by the elasticity in the mask member M2. An elastic mask member M2 may be produced by using a composite material comprising resins or rubber mixed with suitable metals. It is also permissible to arrange a number of mask members M2 in layers.

Figure 5A:
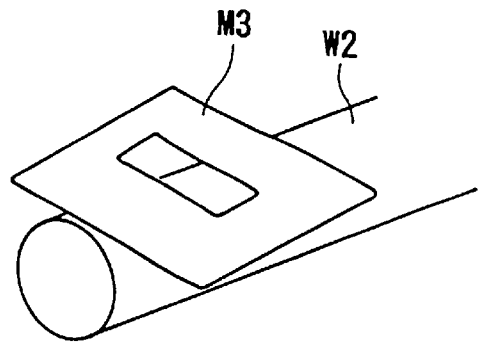
FIGS. 5A–5C are perspective views of another embodiment of the ultra-fine microfabrication apparatus of the apparatus of the present invention.
Figure 5B:
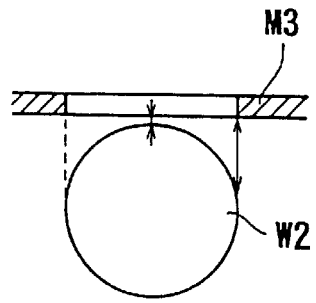
Figure 5C:
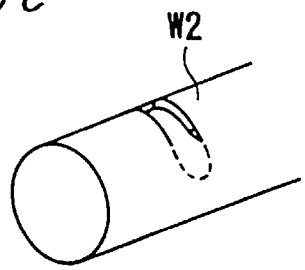
Figure 6A:
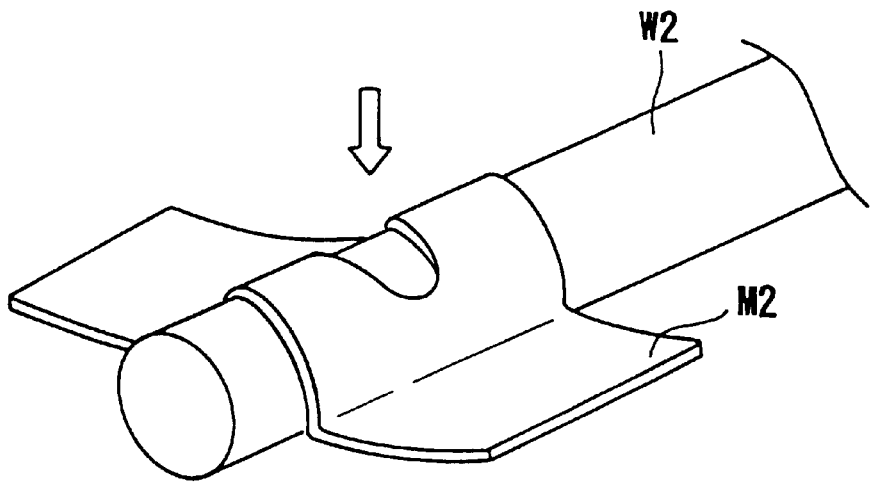
FIGS. 6A–6C are perspective views of another embodiment of the ultra-fine microfabrication apparatus of the present invention.
Figure 6B:
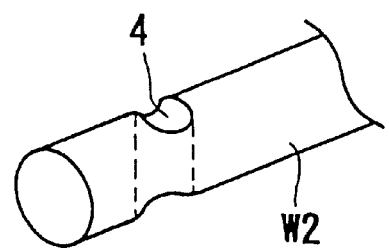
Figure 6C:
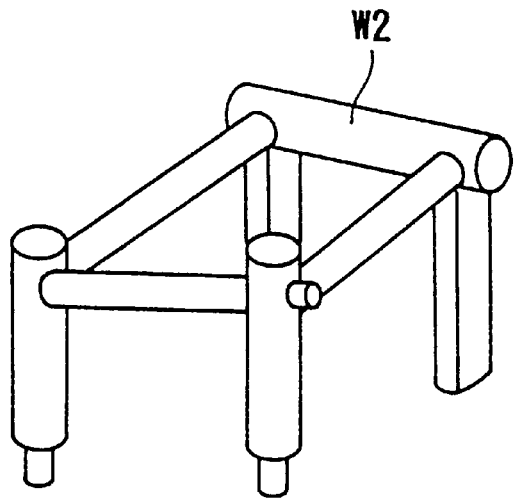

FIGS. 6A–6C illustrate an example of fabrication using the mask member M2 shown in FIGS. 4A–4B. The workpiece W2 is a polyimide rod of 0.5 mm diameter. As shown in FIG. 5A, a nickel foil of 10 $\mu$m thickness having a circular hole of 200 $\mu$m diameter is wound on a workpiece W2. Because of the thinness of the foil material, the masking can be wound tightly around the rod W2. When an oxygen-FAB is radiated onto the rod W2, a hole 4 of about 200 $\mu$m diameter is formed at right angles to the rod axis as illustrated in FIG. 6B. Such a component is useful as a basic element for making a micro-device such as the one illustrated in FIG. 6C.

In other embodiments of the fabrication apparatus described hereafter, the workpiece W and the mask member M are separated so that the relative positions of the FAB source, the mask member M and the workpiece W can be altered.

Figure 7:
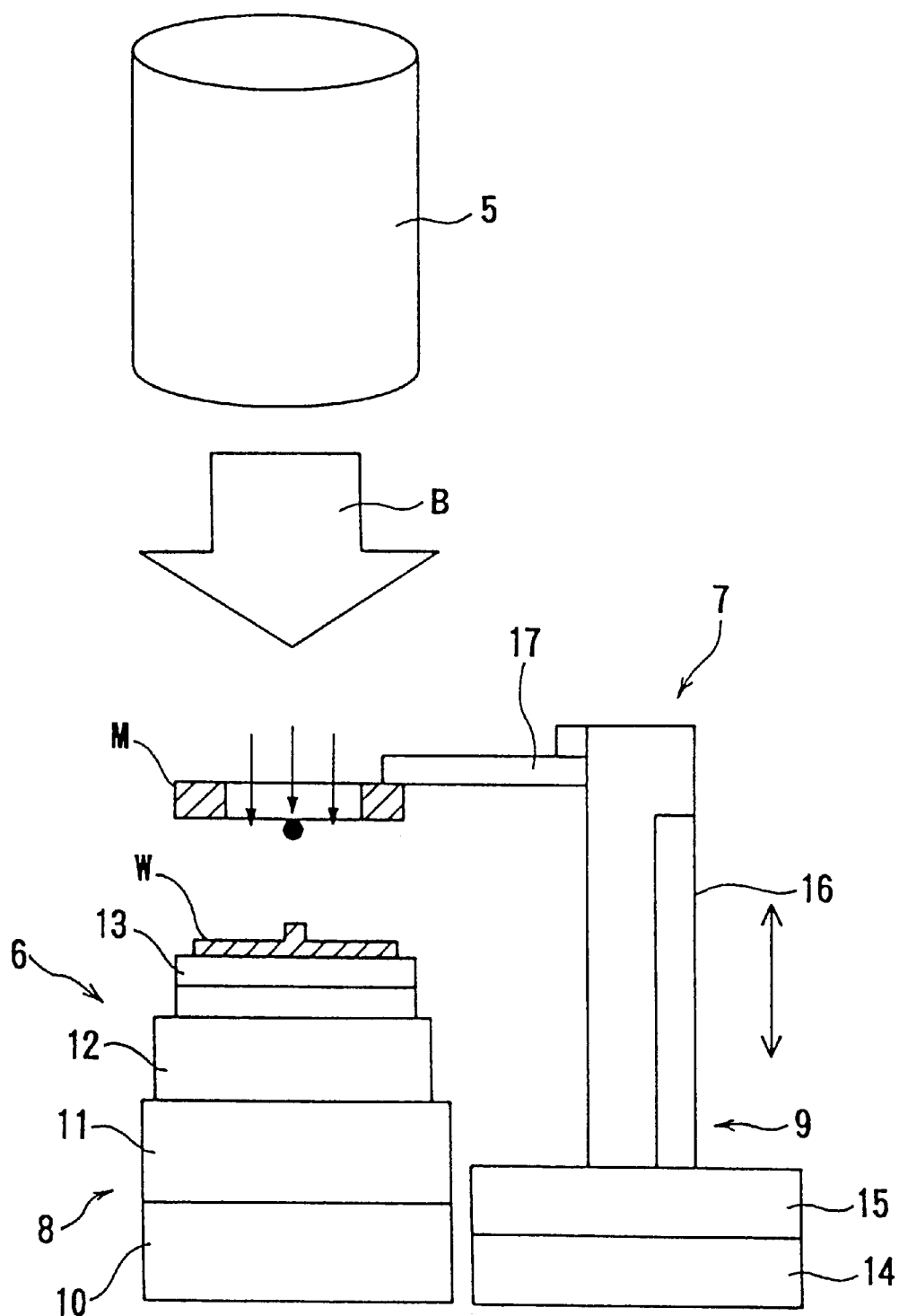
FIG. 7 is an overall schematic view of a fabrication apparatus using the energy beam of the first embodiment.

The apparatus shown in FIG. 7 comprises a FAB source 5 for generating a parallel beam of energized particles; a support stage 6 opposite to the source 5 for supporting the workpiece W; and a holding device 7 for holding the mask member M. The support stage 6 is provided with a work-manipulator 8 for providing micro-movement of the workpiece W, and the holding device 7 is provided with a mask-manipulator 9 for providing micro-movement of the mask member M. The work-manipulator 8 produces a rotation/parallel movement, and is provided with a vertical assembly comprising X-, Y- and Z- translators 10, 11 and 12, and a rotation device 13 which can rotate about the Z-axis. The mask-manipulator 9 comprises X-, Y- and Z-rotation devices 14, 15 and 16; and a parallelism-adjustment device 17 for adjusting the parallel orientation of the mask member M biaxially with respect to the workpiece W.

Figure 8:
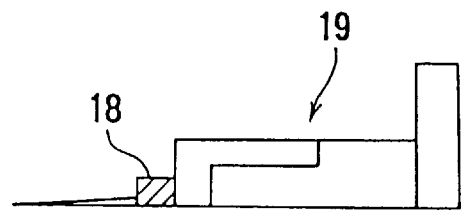
FIG. 8 is a side view of an ultra-fine micro-stage.
Figure 9:
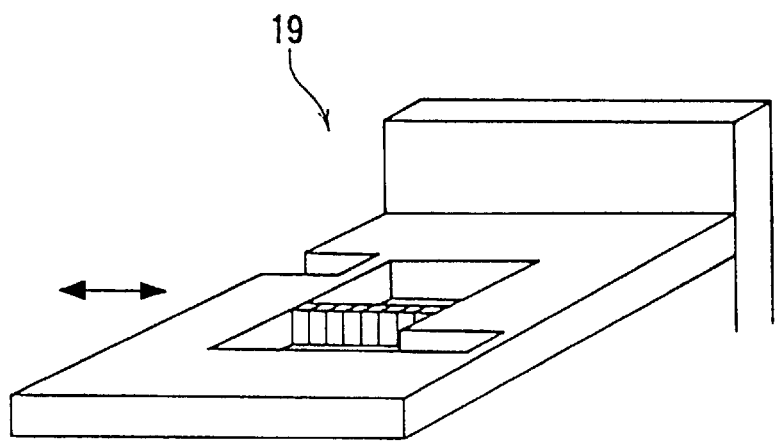
FIG. 9 is a perspective view of the ultra-fine micro-stage.
Figure 10:
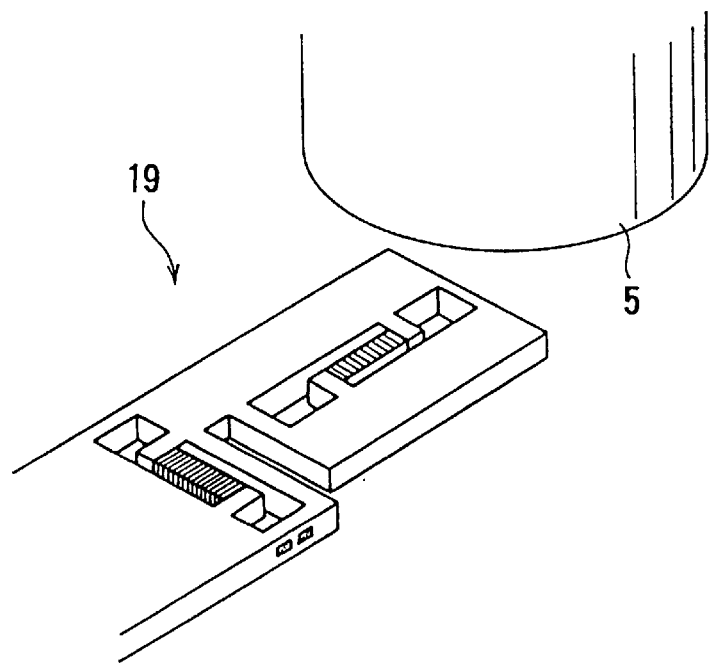
FIG. 10 is a perspective view of another example of the ultra-fine micro-stage.

As shown in FIG. 8, at the base of the mask member M, there is a micro-manipulator stage 19 utilizing a piezo-electric element 18 to enable shift adjustments in the direction of parallel movement on the order of 0.5–50 nm accuracy with the use of the piezo-electric element 18 in conjunction with a contracting or expanding micro-translator stage. FIGS. 9 and 10 show examples of the micro-translator stage 19. Control of the micro-movement using the piezo-electric device 18 is carried out by a device permitting a movement along at most three orthogonal axes, but a case of uniaxial control is shown in FIG. 9, while the example shown in FIG. 10 has a biaxial directional control.

Figure 11:
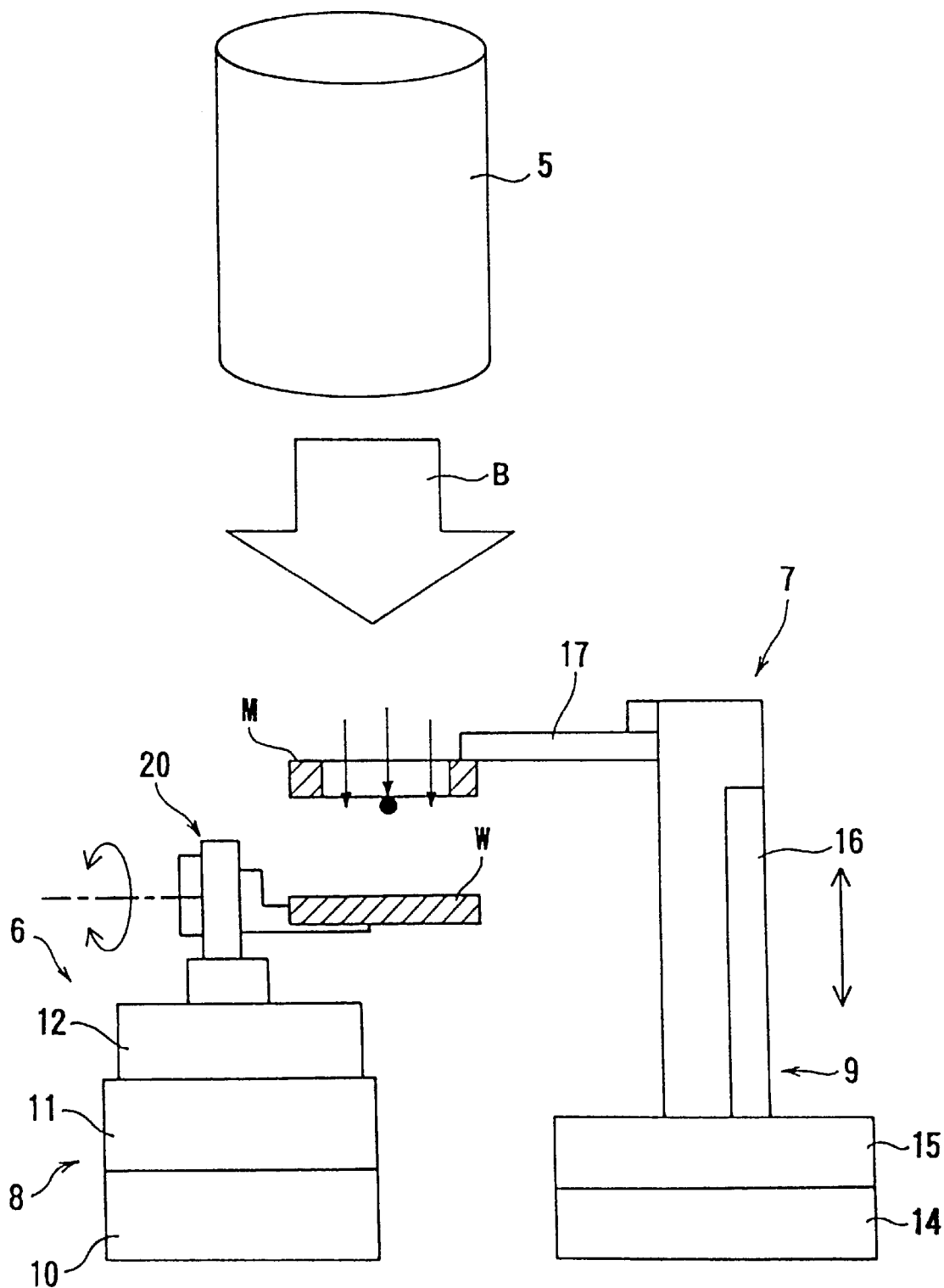
FIG. 11 is an overall schematic view of a fabrication apparatus using the energy beam of the second embodiment.

FIG. 11 shows a fabrication apparatus similar to the one shown in FIG. 7, but the difference is in the support device 20 for supporting the workpiece W. That is, the apparatus comprises triaxial parallel translator stages 10, 11 and 12; and a rotation device 20 for rotating the workpiece W in a plane about a work axis so as to enable rotating the workpiece W at right angles or at an angle to the beam path B. The mask-holding device 7 is the same as the one in FIG. 7, and the micro-manipulator with a piezo-electric element and a micro-movement along at most three orthogonal axes are also the same. Devices other than the piezo-electric device, such as magnetostrictive devices or thermal expansion effects devices, may also be used for micro-manipulation. Depending on the distance to be moved, a lever-based movement may also be utilized.

Figure 12A:
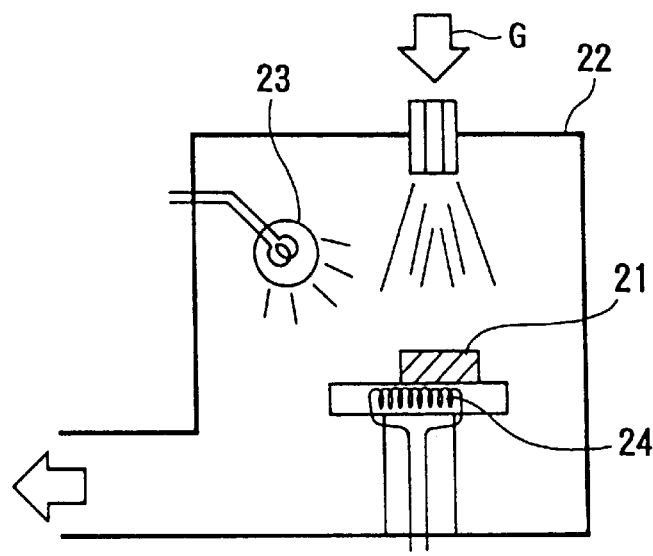
FIGS. 12A–12C are schematic views of making a mask member used in the fabrication apparatus.

Next, the construction and method of making a micro-mask member M will be explained. As shown in FIG. 12A, a fine-patterned element 21, made by electro-polishing or electro-forming, is placed in a sealed chamber 22 that is evacuated. A process gas G reactive to the element 21 is introduced into the chamber 22, thereby removing the surface material from the element 21 with the gas particles so as to gradually reduce the size of the element 21 uniformly in all directions.

The rate of chemical reaction is controlled by radiating a lamp 23 into the element 21 to control the activation of the gas G or by controlling the temperature of the element 21. To control the temperature of the element 21, it is permissible to use a heater 24 in addition to the lamp 23. By controlling the rate of chemical reaction on the surface, it is possible to control the size reduction on the order of 0.1–10 nm by adjusting the duration of reaction. Other methods such as immersion in a chemical reaction are not suitable because of the rapid rate of size reduction in such cases.

Figure 12B:
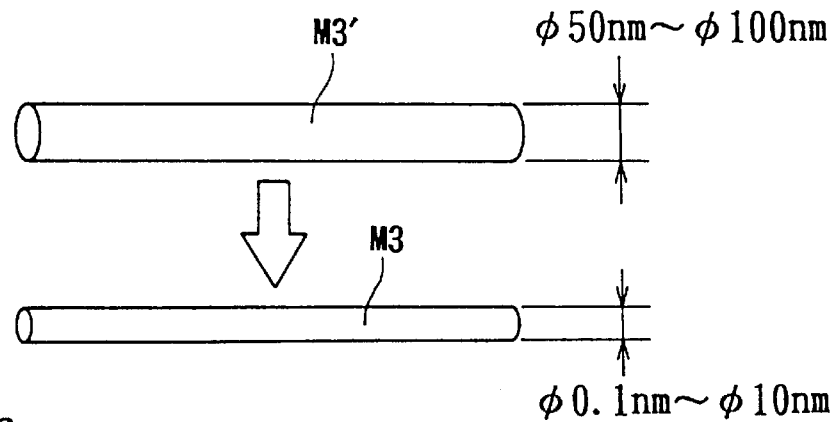

FIG. 12B shows an example of a rod-shaped mask member M3 fabricated by the method described above. A starting fine rod-shaped mask member M3' or 50–100 nm diameter is prepared by electro-polishing and the like, and then the starting member M3' is further processed by the method described above into a rod-shaped fine-structure to be used as a mask member M3. If the material of the fine-structure is GaAs or Si, a chlorine- or fluorine-group process gas is used, and if the material is tungsten, a fluorine-group process gas is used. Instead of a reactive process gas, reactive radical particles can also be used. The reaction rate with reactive radical particles is faster than that with a reactive gas in producing a uniformly etched product, and is suitable for processing a large quantity of mask members.

Figure 12C:
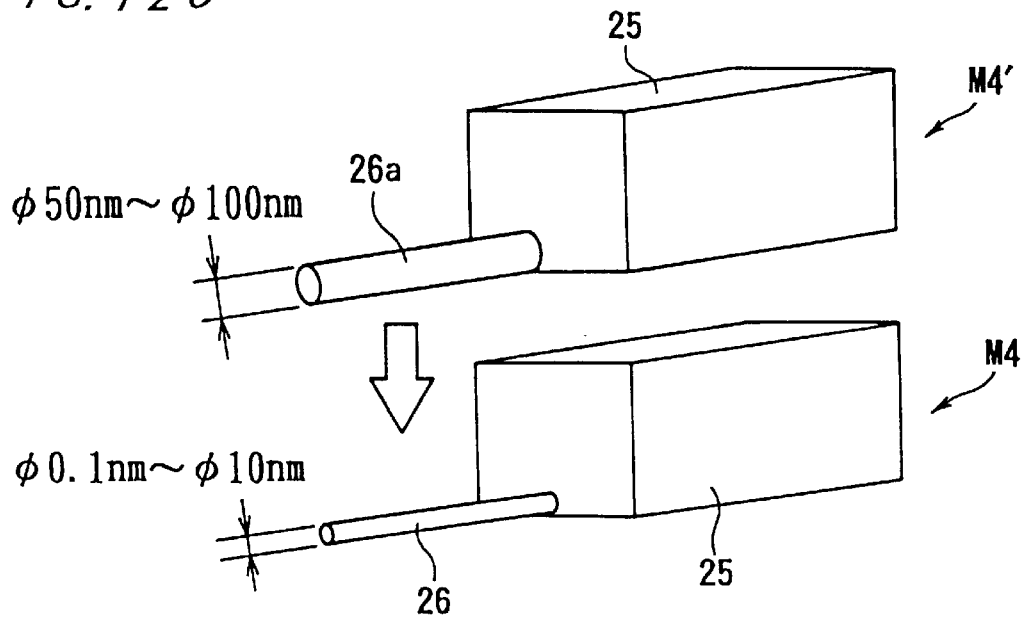

FIG. 12C shows another example of a fine-structure mask member M4 having a tetragonal-shaped base portion 25 at the root of a rod-shaped pattern portion 26. The base portion 25 of the mask member M4 is designed for handling of the mask member M4 whose rod-shaped patterning portion 26 performs the masking action. The size of the base portion 25 may be about 1 mm. Similar to the case shown in FIG. 12B, starting member M4' is prepared by the conventional method, and it is fabricated further by the fabrication method shown in FIG. 12A to produce the final mask member M4.

Figure 13:
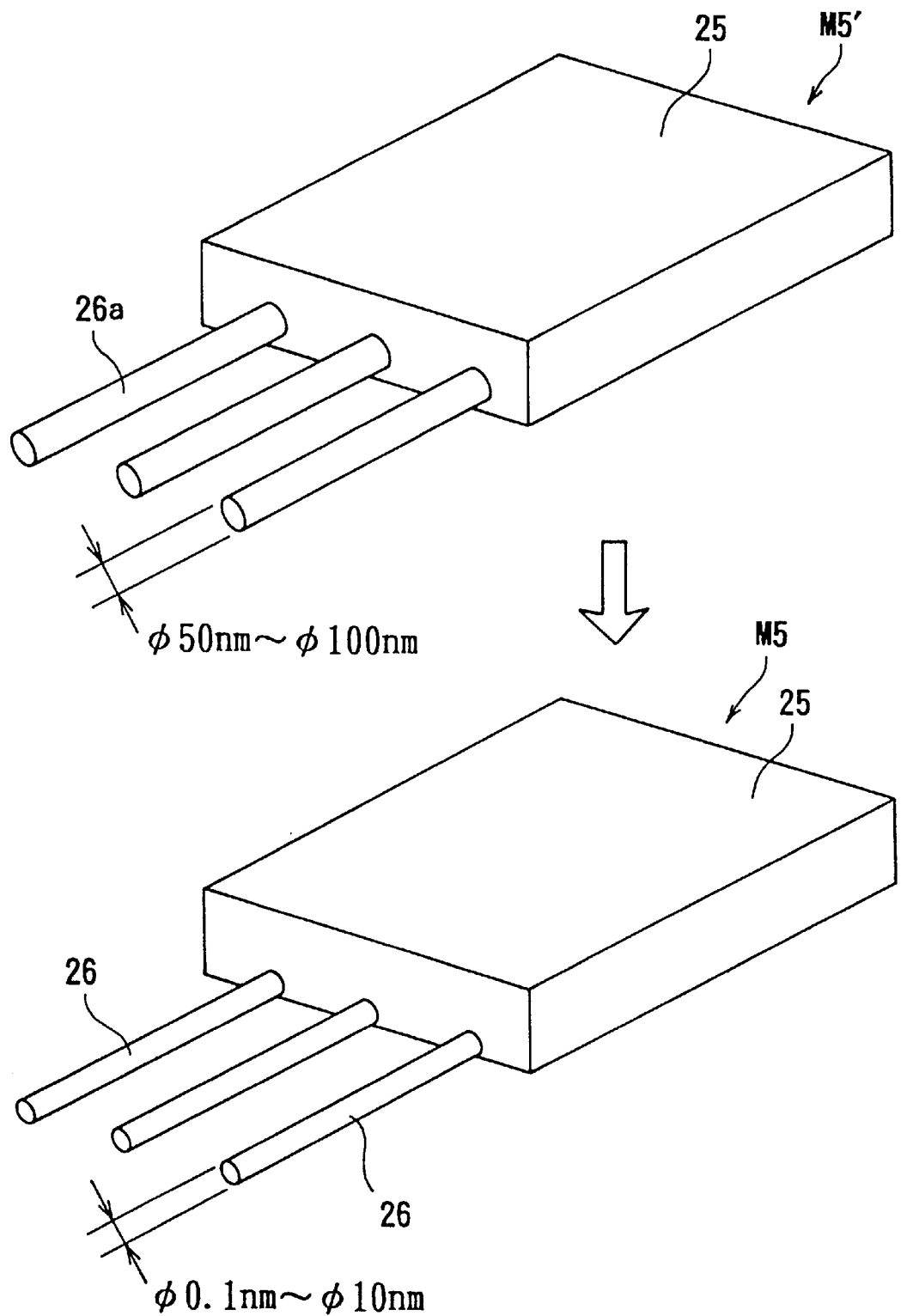
FIG. 13 is a perspective view of another mask member used in the fabrication apparatus.

During the fabrication process, the base portion 25 is coupled to the micro-manipulator or rotation/translator stage so as to permit micro-movement when necessary. It follows that, in contrast to the previous example, the mask member M and the workpiece W can be separated by a distance of up to about 100 $\mu$m. A separation distance larger than this is undesirable because of the effect of beam scattering. FIG. 13 shows a mask member M5 having a plurality of rod-shaped mask members 26a formed integrally with base portion 25.

Figure 14A:
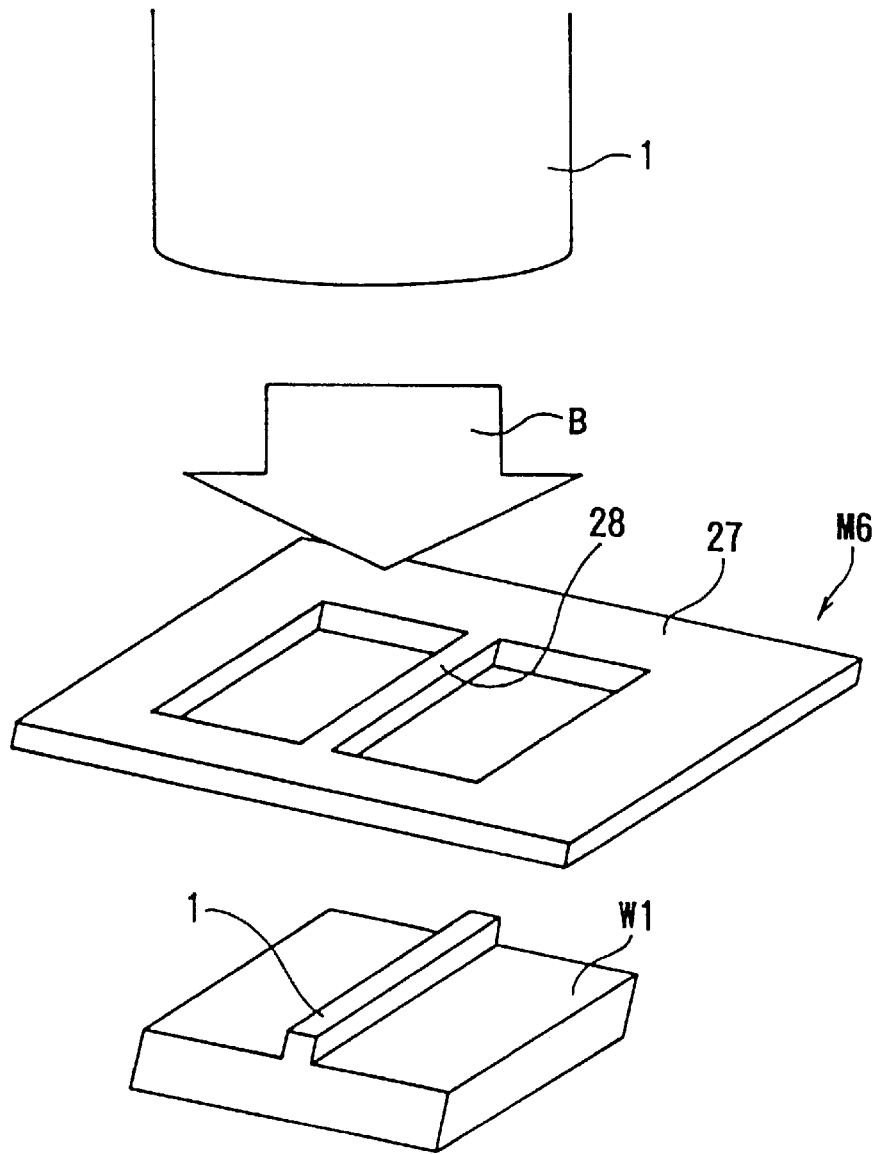
FIGS. 14A–14B are perspective views of another embodiment of the fabrication apparatus of the present invention.
Figure 14B:
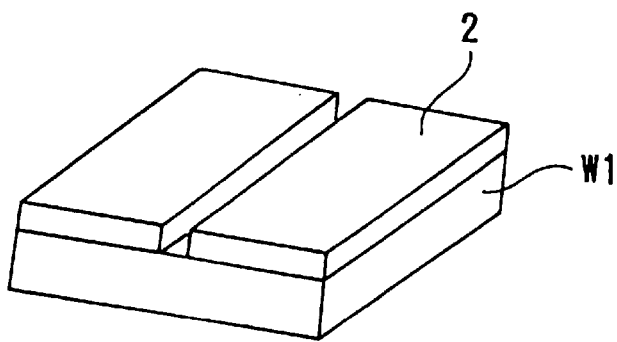

FIGS. 14A–14B show an example of a mask member M6 made of Ni to form a fine structure W1. The base portion 27 and a polygonal mask member 28 are formed integrally as a unit. As in the cases presented in FIG. 12C and FIG. 13, the fine-structure is coupled to a micro-manipulator or translator stage for micro-movement. As discussed in relation to the example presented in FIGS. 1A–1C, by changing the type of energy beam or process gas, it is possible to perform etching (FIG. 14A) or to form a film deposit (FIG. 14B).

FIG. 15 shows a modification of mask member M6. A mask member M7' prepared by electro-forming from a material such as Ni and the like has a fine-structure pattern portion 30a to be further reduced in size to produce a mask member M7. The apparatus and the process for making such a fine-structure mask member M7 is the same as those presented in FIG. 12A. When the material for the mask member M7 is Ni, chlorine-group gas may be used as a reactive gas or reactive radical particles. The temperature of the starting mask member M7 may be regulated within about 500–1000K by using a heater 24 or a lamp 23 (FIG. 12A). The overall uniform reduction in size of about 1–19 $\mu$m can be achieved.

Figure 16:
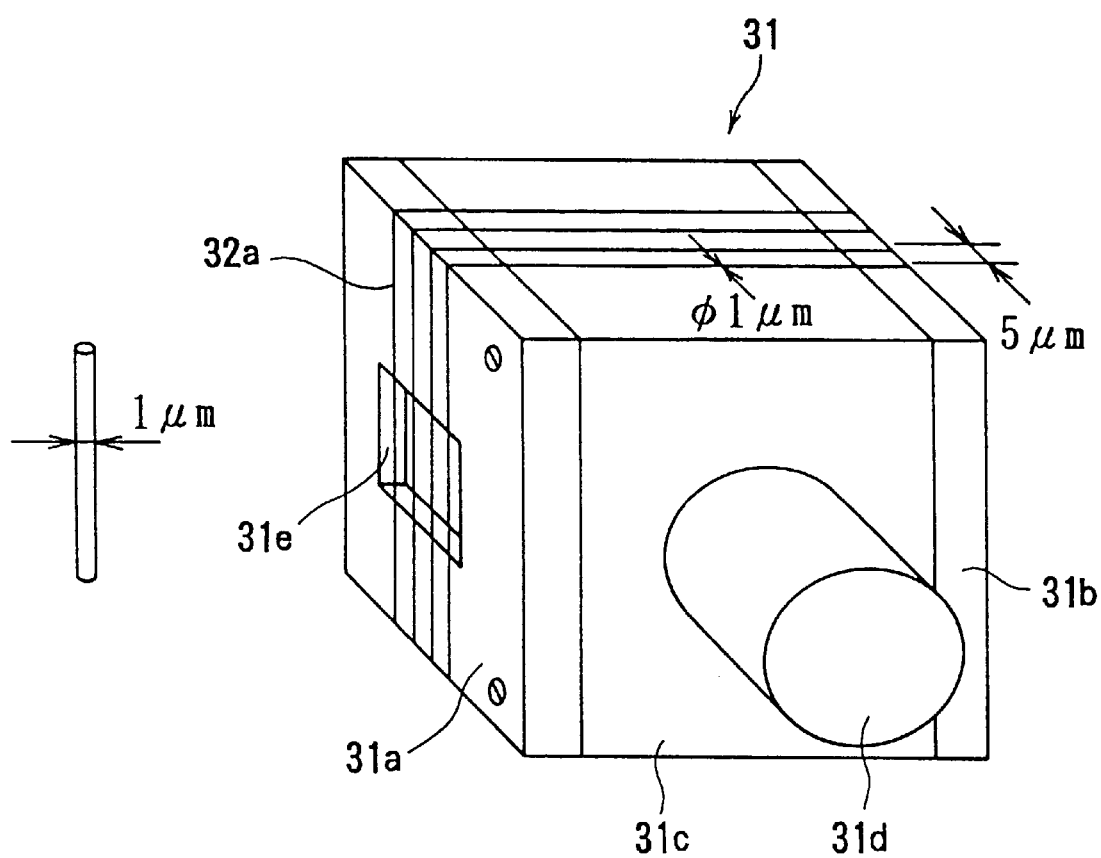
FIG. 16 is a perspective view of still another mask member used in the fabrication apparatus.

FIGS. 16 and 17 present another approach to making a rod-shaped mask member M8. As shown in FIG. 16, a jig 31 comprises two frame portions 31a, 31b, a middle portion 31c, and a shaft portion 31d, and the shaft portion 31d is attachable to a rotating machine. The frame portion 31a is provided with an opening 31e. The jig 31 is wound with fine wire 32a of about 1 $\mu$m diameter. The wire material may be a carbon-based material or quartz fiber and the spacing between the windings may be 5 $\mu$m, for example. Uniform and parallel winding is obtained by using a NC spindle to control the spacing. The wound wire 32a is attached to the surface of the frame portion 31a, after which the portions 31a and 31b are separated to produce a starting mask member M8' as shown in FIG. 17. The starting mask member M8' is placed in the apparatus shown in FIG. 12A, and a reactive gas or reactive radical particles are introduced into the evacuated chamber 22. The temperature of the starting mask member M8' or the reactivity/activity of the reactive gas/radical particles is controlled to remove the surface material from the starting mask member M8' so that the 1 $\mu$m diameter of the starting wire 32a may be reduced to the final diameter in a range of 0.1–100 nm for the fine-structure portion 32 of the mask member M8. The fine-structures shown in FIGS. 1B–1C are produced by fabrication with the use of mask member M8, similar to the case of production using the mask members shown in FIGS. 12B, 12C and 13.

Figure 18:
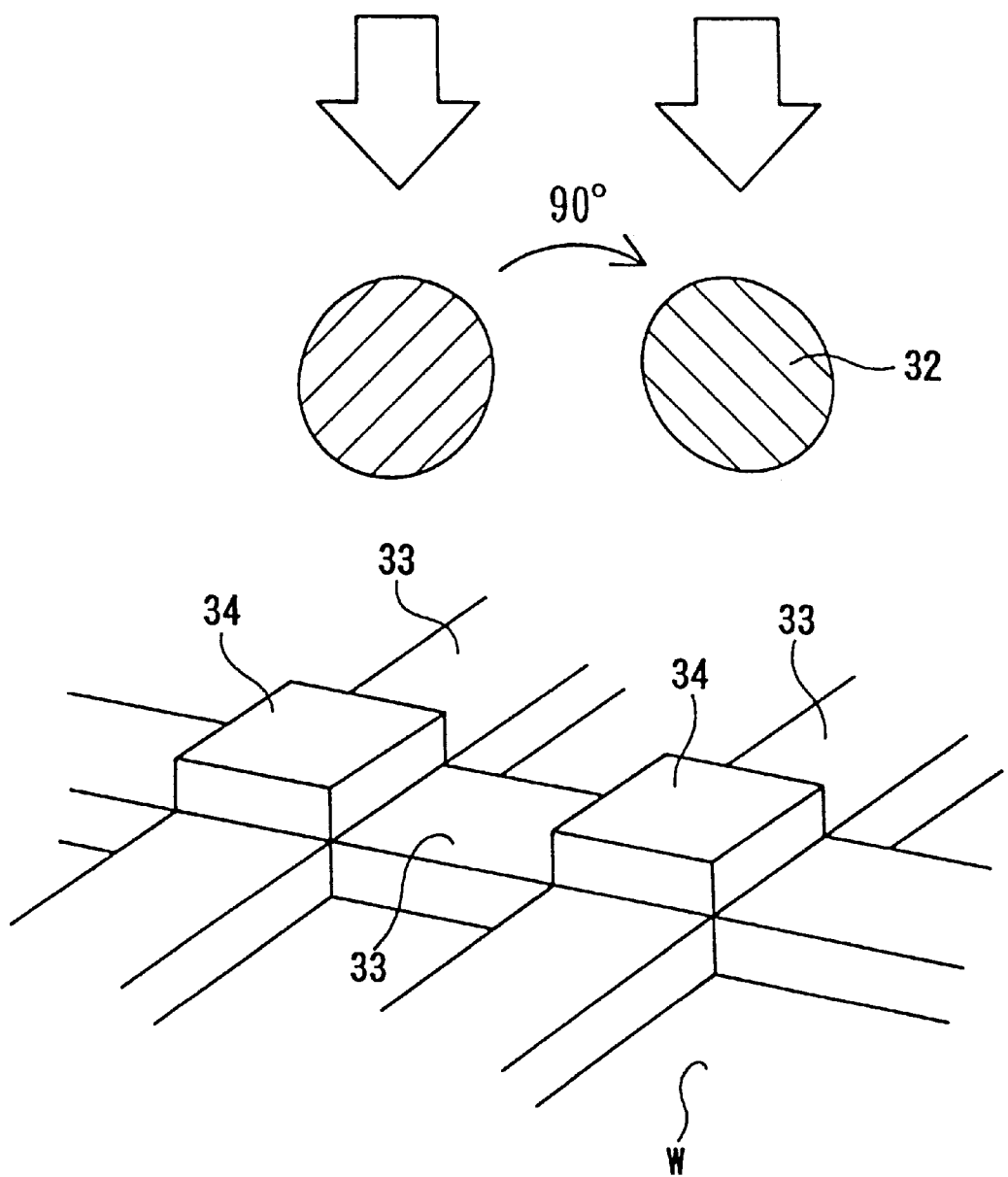
FIG. 18 is a perspective view of the fabrication method using the mask member produced in FIG. 16.

By using the mask member shown in either FIGS. 14, 15 or 17 and repeatedly altering the position of the workpiece W, a fine-structure shown in FIG. 18, in which two patterns are superimposed on each other (an island protrusion 34 formed at an intersection of line or protrusion 33), can be produced. The detailed steps are as follows. The mask member M8 is used in conjunction with irradiation with an energy beam. After rotating the mask member M8 90° with respect to the workpiece W, the above step is repeated. The rotation motion can be performed using a rotation device 13 shown in FIG. 7. The fine-structure thus produced is useful in reducing the friction when sliding motions are used in bearing devices for rotational shafts or for optical or magnetic disks to realize low-friction high performance of such devices.

Figure 20:
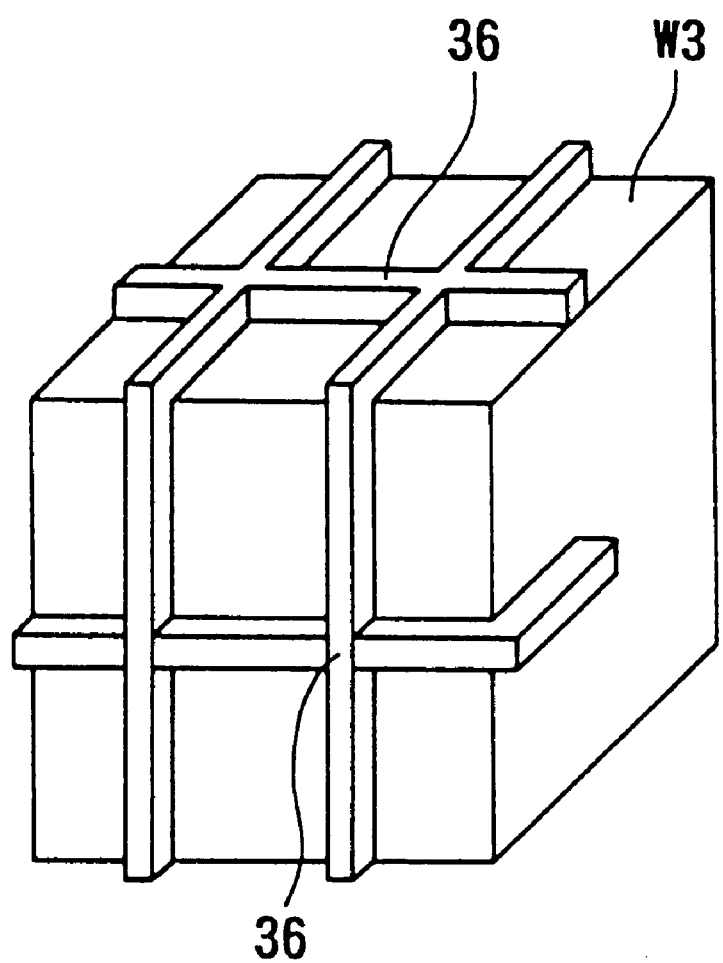
FIG. 20 is a perspective view of a fine structure produced by the fabrication apparatus.

FIG. 19 shows still another mask member M9 which is produced by attaching wires 32 on both sides of the frame portion 35, with the method of FIG. 16, and by further reducing the size by the apparatus and the method of FIGS. 12A–12C, thus producing a fine-structure. The mask member M9 produces an intersecting line pattern comprising line at protrusions 36. When this process of forming the pattern 36 is repeated for another faces of a polygonal workpiece, a fine-structure such as the one illustrated in FIG. 20 can be produced on a workpiece W3.

Figure 21A:
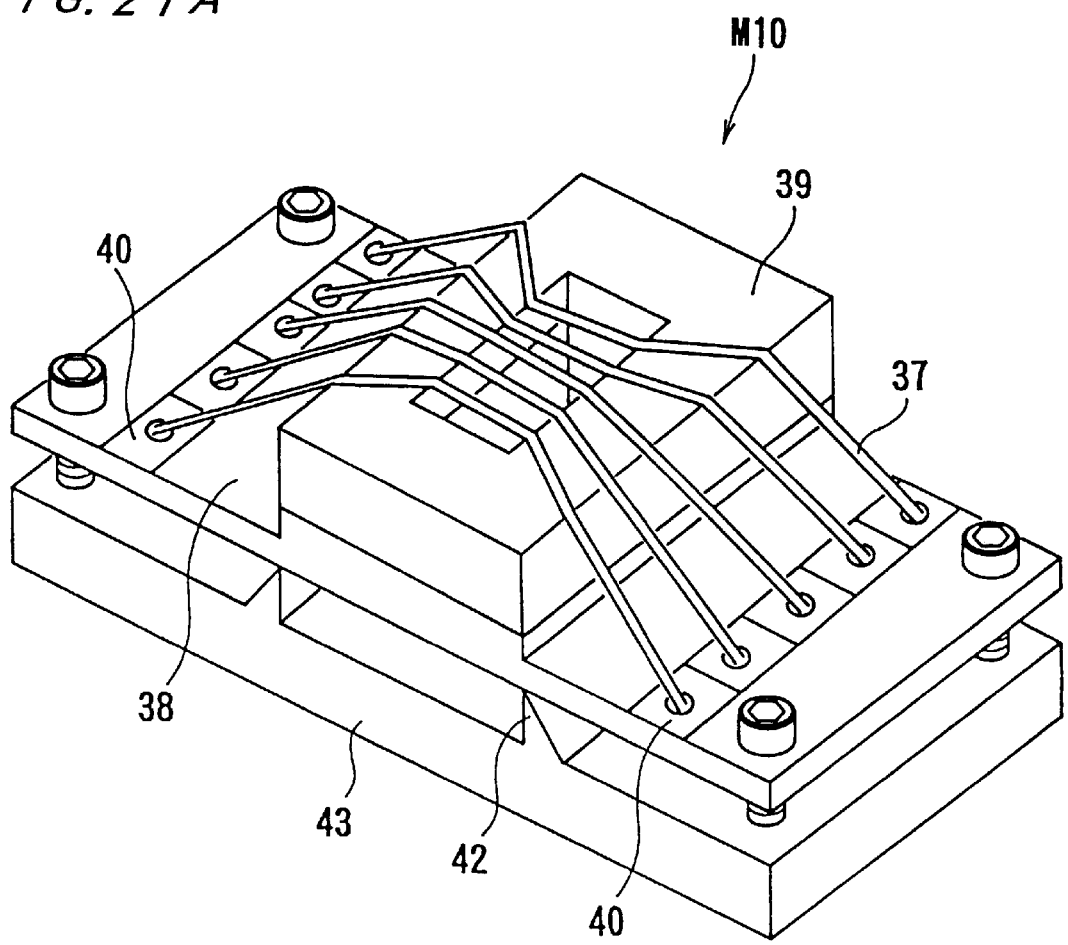
FIGS. 21A–21C are schematic views of making still another mask member used in the fabrication apparatus.
Figure 21B:
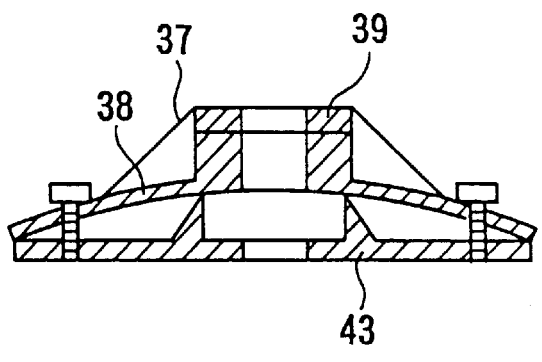
Figure 21C:
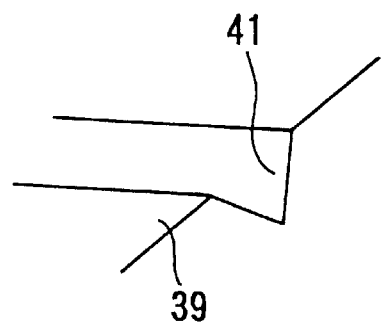

FIGS. 21A–21C illustrate another method for making a mask member M10 which was similar to the one shown in FIG. 17. The material for wires 37 is gold of 20 $\mu$m diameter. Using a wire-bonder used in semiconductor device manufacturing, the gold wires 37 are installed on an aluminum plate 38 on a Si base 39. The wires 37 are tensioned across respective V-grooves 41 on opposing pads 40 formed on the Si base 39. Using an ordinary wire-bonder, it is not easy to obtain a wire pitch of 20 $\mu$m spacing, however, when the wires are tensioned across the V-grooves, the wires become self-aligned. To avoid slack in the wires 37, the aluminum plate 38 is bolted to an aluminum base 43 having knife edges 42 so that the aluminum plate 38 is bowed, as illustrated in FIG. 21B, to tension the wires 37. Making of the mask member M10 is facilitated by using fine-wires 37. The surface of the wires 37 is smooth and the size of the wire is constant throughout, thereby providing dimensional precision. The strength of the wires 37 is relatively high, thus making it possible to achieve proper pre-tensioning so that even if the temperature rises during the use and the frame portion of the mask member M10 expands, there is no slack generated in the slits. Instead of gold wires, other metallic wires, for example aluminum wires, may also be used, and in this case, the wires installed with tension can be further processed by etching, for example, to further reduce the wire diameter.

Other methods for making the mask member include a method based on coating of a photoresist pattern on a stainless foil, etching to produce cavities and removing the resist coating; a method based on laser boring of a polyimide foil; a method similar to electro-forming in which a resist pattern is produced on a glass plate, followed by electroless nickel plating on the pattern and later removing the nickel plating.

Figure 22A:
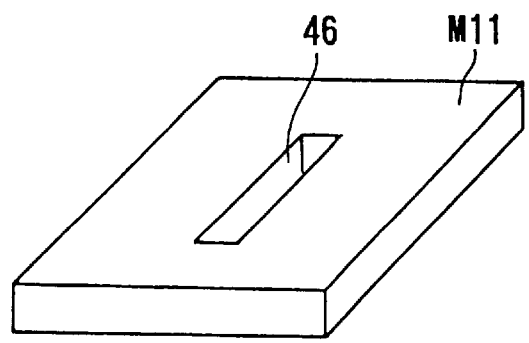
FIGS. 22A–22B are schematic views of still another mask member used in the fabrication apparatus.
Figure 22B:
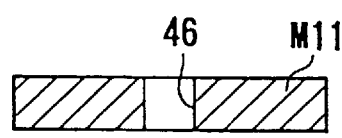

FIGS. 22A and 22B show an example of a slit plate mask member M11. The plate mask member M11 has a thickness suitable for use as a rigid member, and should be made of a stainless steel plate thicker than 100 $\mu$m. In this example, a stainless steel plate of 100 $\mu$m thickness is provided with a fine cavity pattern 46. The cavity is produced by laser drilling of the cavity. An infrared laser source such as a $CO_2$ laser or a YAG laser may be used in conjunction with an aperture control device to focus a fine spot and controlling the movement of the micro-manipulator stage and laser intensity to produce cavity 46 (100 $\mu$m by 500 $\mu$m) such as the one shown in FIG. 22B in the mask member M11. When the plate mask member M11 is to be used to transfer the cavity pattern to a workpiece, the thickness as well as size of the pattern shape of the plate mask member M11 are important variables affecting the precision of pattern transfer. The thickness of the plate usually associated with plate type material would not be suitable for producing a cavity of high precision, and additionally some scattering can occur at the side surfaces of the cavity to degrade the precision of the pattern transfer. For fine cavities, a thick plate would cause problems also due to scattering at the side walls and adhesion of sputtered particles on the fabrication surface. These problems are particularly severe for cavity patterns of less than 10 μm size.

Figure 23A:
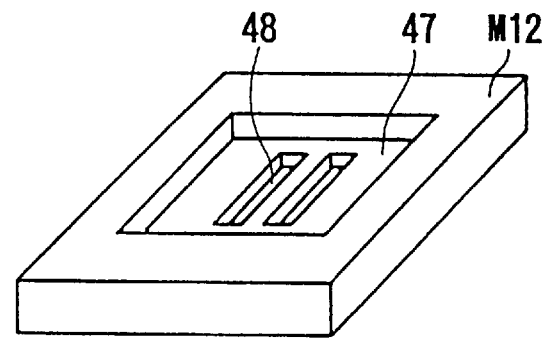
FIGS. 23A–23B are schematic views of still another mask member used in the fabrication apparatus.
Figure 23B:
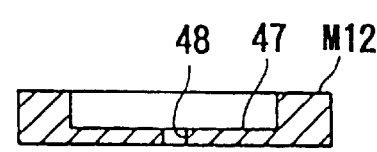

The example shown in FIGS. 23A, 23B is presented to solve the problems discussed above. In this example, the plate mask member M12 is provided with a thinned region 47 and at least one cavity 48 is formed in this region of the plate. In aluminum or stainless steels, the thinned region 47 is produced by covering all regions excepting the region to be thinned with a photoresist coating and immersing the plate in a chemical solution to remove the material from the uncoated region of the plate until the thickness in this region becomes about 10 μm. In Si, chemical etching is also possible but fabrication by FAB or energy particles from a plasma may also be used to remove the material from the thinned region 47. The thinned region 47 may further be subjected to photo-resist masking to produce a pattern, and in conjunction with FAB or plasma processing, cavities of less than 10 μm size can be produced. In this example the plate member of 10×10 mm is provided with a thinned region 47 measuring 500×500 μm, Fine openings 48 are then produced in the thinned region 47 to produce an array of slits measuring 5 μm in width and 5 μm spacing.

Figure 24A:
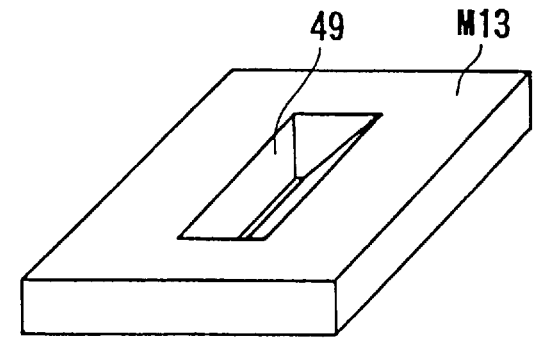
FIGS. 24A–24B are schematic views of still another mask member used in the fabrication apparatus.
Figure 24B:
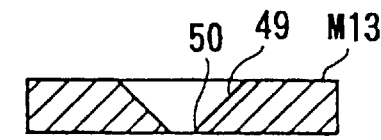

FIGS. 24A–24B show another example to solve the same problem. In this case the plate mask member M13 has a tapered region descending towards edges 50 of cavity 49. Because edges 50 are sharp, scattering is minimized and pattern transfer precision is improved.

When the plate thickness is over 100 μm, cavities of smaller than several tens of micrometers in the plate mask member M11 can be difficult to form because the size of the side walls becomes larger than the cavity size. Therefore, scattering from the side walls increases, and the pattern transfer precision is degraded.

Figure 26A:
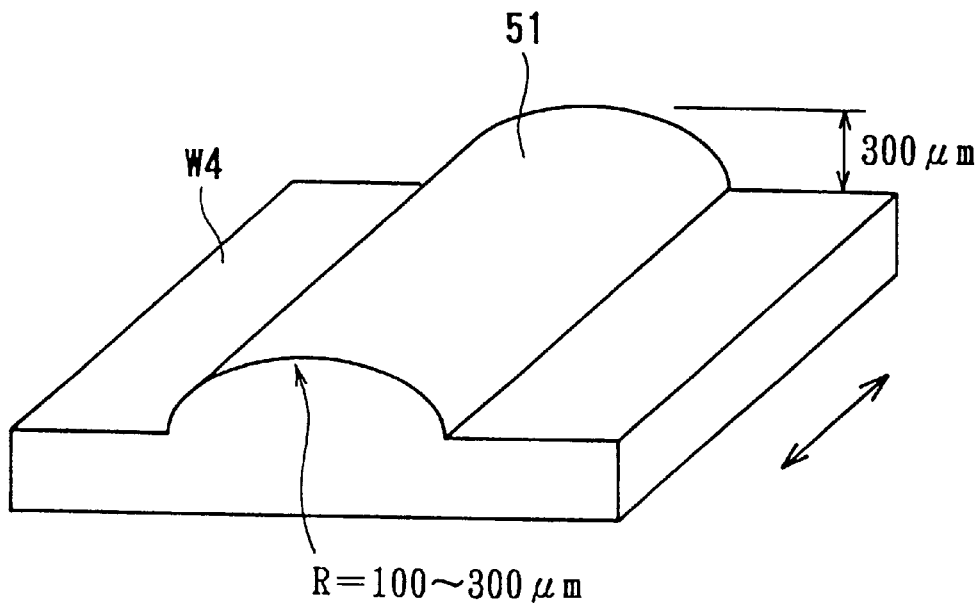
FIGS. 26A–26B are schematic views of another embodiment of the fabrication apparatus using the mask shown in FIGS. 25A–25B.
Figure 26B:
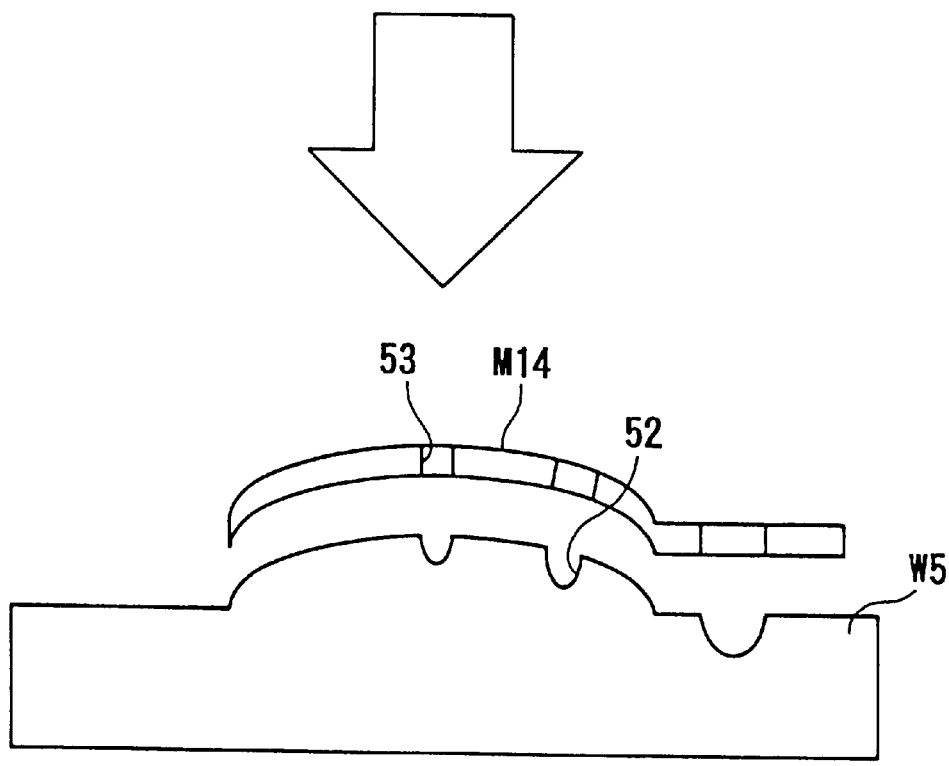

To solve the above problem, FIGS. 25A and 25B present a foil mask member M14. This member M14 is produced by electro-forming. A photoresist pattern is produced on a flat glass plate, and nickel is electro-formed on the surface. The resist coating is then dissolved, and the nickel foil is removed to produce a foil mask member M14. A cavity pattern measuring a minimum of 1×5 μm is produced in the foil material. Another example of a foil mask member M14 is a semiconductor foil made of SiGaAs using a sacrificial layer. Such foil mask members M14 may be used directly on a workpiece as illustrated in FIGS. 3 and 4, but can also be mounted, as shown in FIGS. 26A–26B, on a stage so that relative positioning can be adjusted. This example relates to forming holes or grooves 52 on a curved surface 51 protruding from a workpiece W5 (SiO$_2$). The mask member M14 is held in a jig (not shown) so that the separation distance between the curved surface 51 and the lower surface of the mask member M14 is constant along the curvature shown in FIG. 26B. The separation distance should be less than 100 μm for exposure with an energy beam for fabrication. The cavity formed in this example is a plurality of holes 53 of different diameters, and when the exposure is made by keeping the relative position of the mask member M14 and the workpiece W5 constant, different hole sizes may be generated on the curved surface 51. Hole sizes of 5, 10 and 15 μm are formed in this example. When the relative position is shifted by moving the jig, fine-grooves 52 of the sizes mentioned above can be produced. When the separation distance exceeds 100 μm, beam scattering and misalignment of the beam axis from the vertical can be caused, but because the mask member M14 is a foil material such problems are avoided by freely altering the shape of the curve. This example demonstrates that forming of patterns on a non-flat surface is possible with the fabrication apparatus of the present invention.

The mask member M15 shown in FIG. 27 has its width varying in three steps. This pattern is made by photolithography and electro-forming is used to duplicate the pattern in nickel. To make the photoresist patter, electron beam drawing is used to make a photomask as well as pattern making. In both cases, control can be exercised to produce ultra-fine patterns.

In the above examples cited, the energy beam may be FAB and if the mask material is made of Si, the mask may be coated with gold so as to prevent chemical reaction with the FAB.

Figures 28A, 28B:
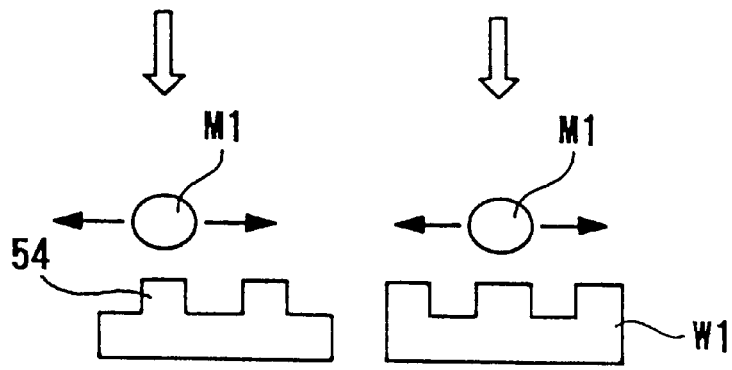
FIGS. 28A–28B are schematic views of still another embodiment of the fabrication apparatus.

FIGS. 28A–28B show another example of forming a pattern on a workpiece W1. In this case, the mask member M1 is moved laterally repeatedly during irradiation to generate a plurality of patterns. The mask member M1 is a single wire of ultra-fine diameter which is translated parallel to the workpiece W1 and stopped for a time at one position. The masked regions exhibit less material removal during the still exposure thereby forming a series of linear protrusions on the fabrication surface. The parallel translation can be produced by using translation devices 10, 11, 14 and 15 such as those shown in FIGS. 7 and 11. The advantage of this approach is that only one mask member M1 is necessary to make a plurality of parallel structures, and the spacing can be controlled by the translation device.

Figure 29:
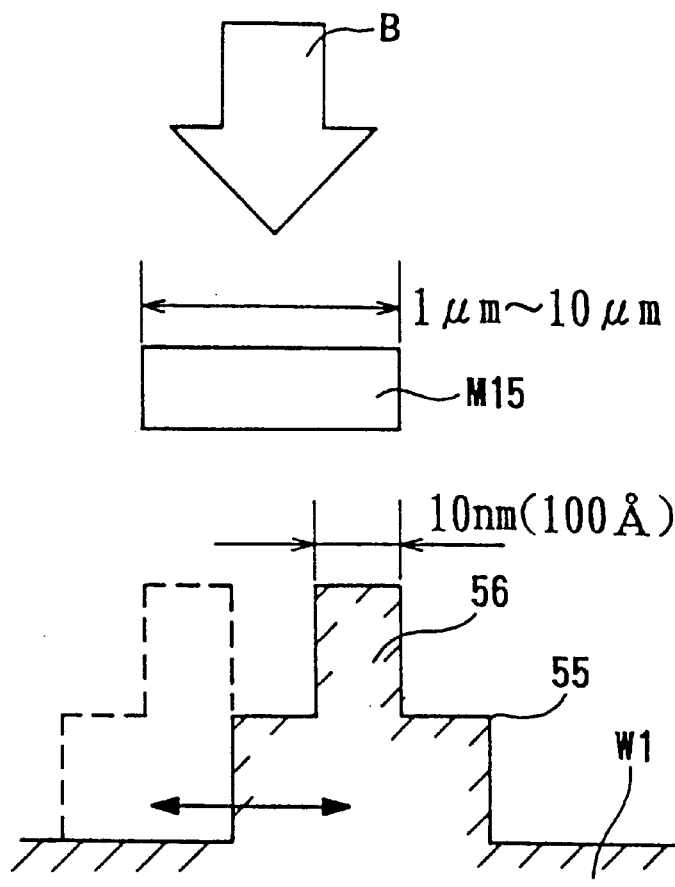
FIG. 29 is a schematic view of still another embodiment of the fabrication apparatus.
Figure 30A:
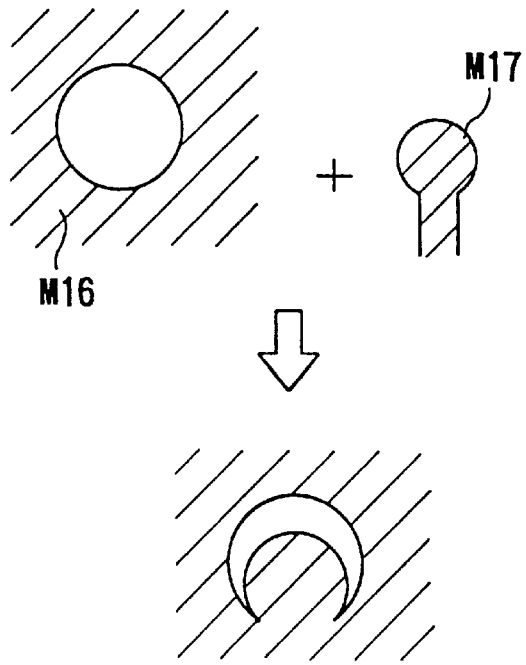
FIGS. 30A–30B are schematic views of still another embodiment of the fabrication method.
Figure 30B:
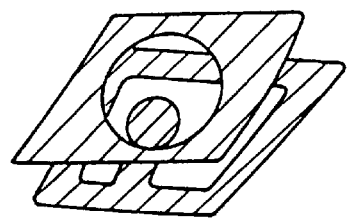

FIG. 29 shows an approach of fabricating a fine-structure when mask member M15 does not meet the fine-size requirements. For example, it is desired to make a cavity of 10 nm size on a workpiece W1, but the available mask member M15 measures 1 μm or more. In this case, fabrication may be performed by using the edges of the mask member M15 as illustrated in FIG. 29. The relative position of the mask member M15 and the workpiece W1 can be varied slightly (not to scale in FIG. 29) so that only a region of 10 nm width is completely masked from an energy beam. The resulting fine-protrusion structure has a width of 10 nm at the top section of a stepped structure.

The examples shown in FIGS. 30A to 32B relate to a technique of superimposing of a plurality of mask members to produce a pattern on a workpiece. A mask member M16 having a circular cavity is superimposed on another mask member M17 having a disc of a smaller diameter to produce a crescent shaped pattern on the workpiece. This is an example of making a complex pattern by superimposing patterns of simpler shapes. Fine complex patterns are usually difficult to make, and this approach is excellent for such patterns.

Figure 31:
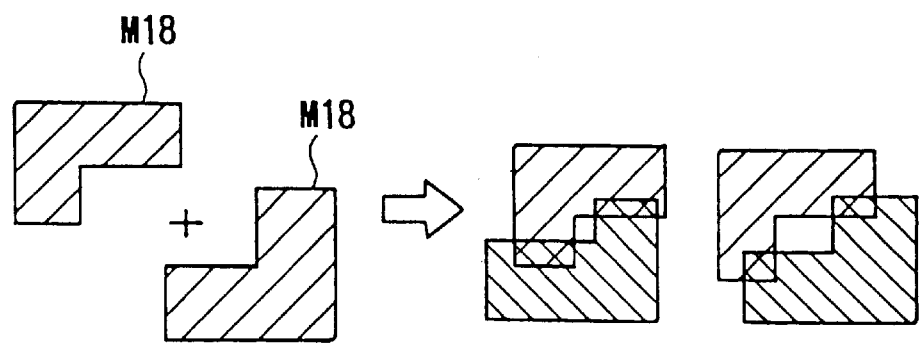
FIG. 31 is a schematic view of still another embodiment of the fabrication method.
Figure 32A:
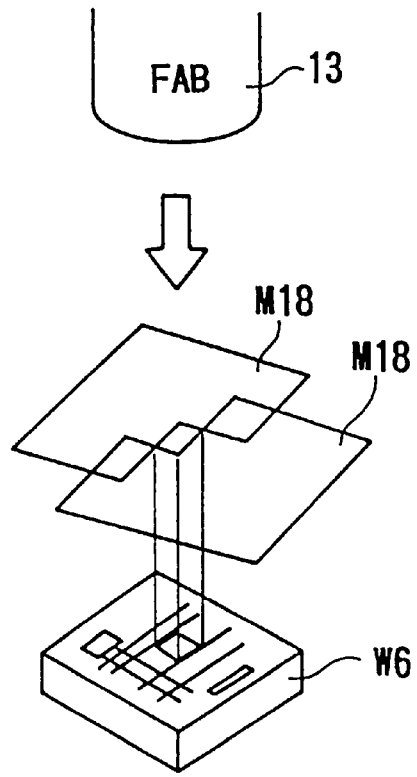
FIGS. 32A–32B are perspective views of still another embodiment of the fabrication apparatus.
Figure 32B:
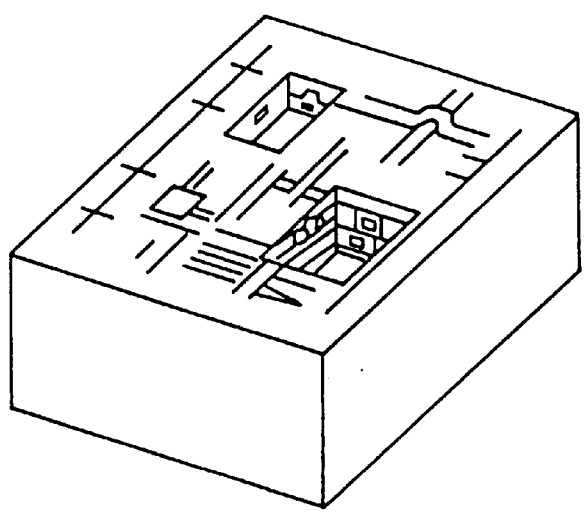

FIG. 31 shows still another example of superimposing mask members. The advantage is that the relative position of two mask members M18 can be changed to vary the shape and size of the space generated therebetween. In this example, two L-shaped mask members M18 are used to generate a rectangular shaped space. For example, as shown in FIGS. 32A–32B, this type of opening can be used to repair a specific local area of an IC circuit W6. The relative position can be adjusted by using a micro-manipulator devices with a piezo-electric element such as the one shown in FIGS. 8 to 10. This type of repair service can also be provided by scanning with a focused ion beam (FIB), but this method is much more time-consuming in comparison to the method presented here.

When the workpiece W is made of a III-V compound semiconductor material, such as GaAs, AlGaAs, InGaAs or Si-group semiconductors, the fabrication apparatus of the present invention is particularly suitable for making quantum effect devices. FIG. 33A shows an example of a quantum line effect device. This type of device is based on energy level change caused by the quantum effect to generate light or a laser beam of shorter wavelength than a bulk wavelength. The example shown relates to a quantum-line structure, but fabrication is equally applicable to making quantum-box or quantum-rod structures in accordance with the descriptions provided earlier by moving the mask member M with respect to the workpiece W.

FIG. 33A illustrates a quantum effect device comprising two types of quantum-structures to generate two output laser beams of different wavelengths ($\lambda 1, \lambda 2$) by excitation with a high magnetic field or by light excitation of a certain state. The workpiece W1 has protruding from a surface thereof, two rows of fine-structures 57, and the like generated by the excited electron states is amplified by resonator mirrors at the ends of the rows to emit laser beams from each end of the fine-structures 57. Because the dimensions of the fine-structures are different, the quantum effects are different and laser beams having different wavelengths are generated. FIG. 33B shows the basic method of making the quantum effect laser device. A mask member M19 having two rows of cavities 58 of different sizes is used to produce two rows of fine-structures 57 for generating two wavelengths $\lambda 1$ and $\lambda 2$. The mask M19 is placed directly on or some distance away from the workpiece W1, and the assembly is irradiated with an energy beam such as a FAB. This process transfers the pattern of the mask M19 onto the surface of the workpiece W1 to produce fine-structure protrusions 57 shown in FIG. 32A to generate the quantum effect.

FIGS. 34A–34B show fabrication of a bearing 61 having a labyrinth-structured seal which includes fine-grooves 62 extending on the inner peripheral surface of the bearing 61 which is in contact with a shaft 60. The bearing 61 is made by the method illustrated in FIG. 35. The bearing 61 is made up of two split half sections W5, and the inner peripheral surface is irradiated with an energy beam B through a mask member M20 to produce the fine-groves 62 therein. The mask member M20 provided with a plurality of fine slits 63 is placed above the inner surface of the split half bearing W5 and FAB B is irradiated onto the inner surface through the slits 63. The split halves are assembled together to form bearing 61 having a labyrinth structure.

Figure 36:
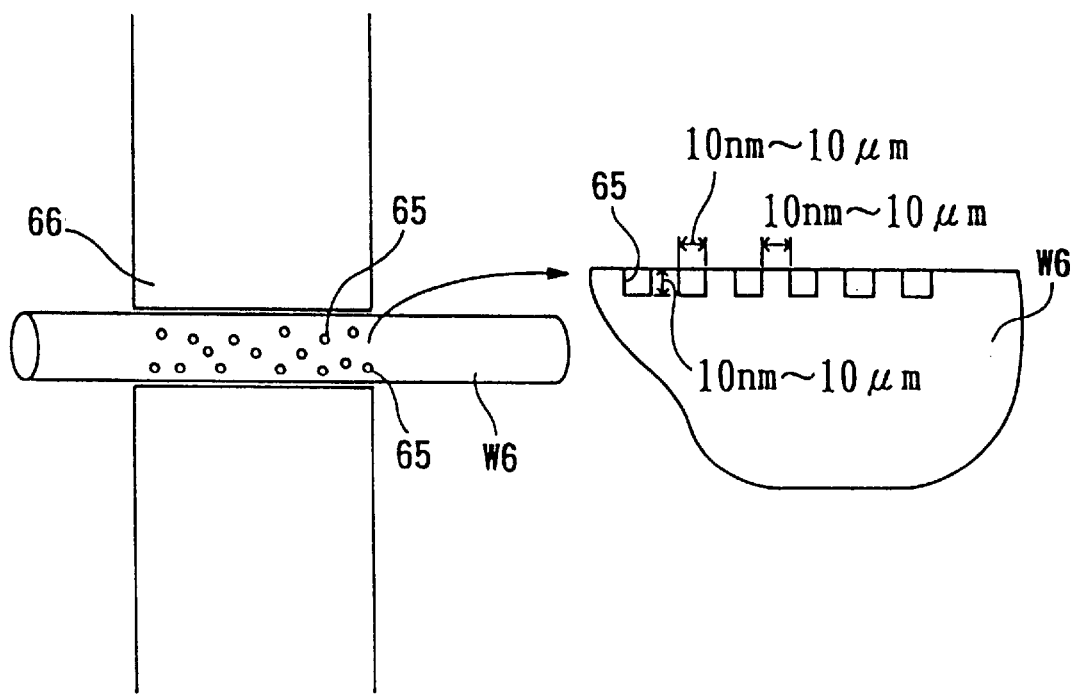
FIG. 36 is a schematic view of another embodiment of the bearing having the labyrinth seal.
Figure 37:
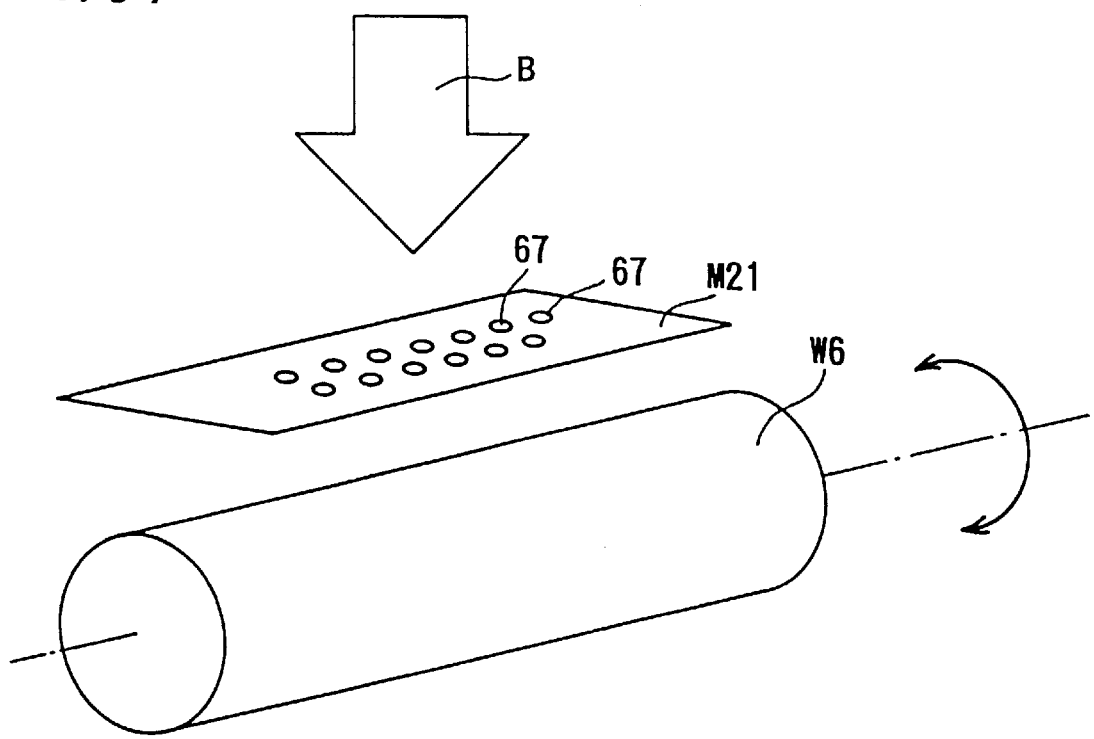
FIG. 37 illustrates a method of making the bearing shown in FIG. 36.

FIG. 36 shows another application of the technique of fabricating the labyrinth structure to form a plurality of fine depressions 65 on the surface of a shaft piece W6 to act as friction reducers between the shaft piece W6 and bearing 66. The fabrication technique of shaft piece W6 is shown in FIG. 37. A mask member M21 having holes arranged to correspond with the depressions 65 to be formed in the shaft piece W6 are placed some distance above the shaft piece W6, and an energy beam B such as an FAB is irradiated therethrough. In this example, the technique used was to use a mask member M21 large enough to cover the shaft piece W6, and irradiation was carried out for a fixed time. The shaft piece W6 was then rotated to successively position other portions of the surface in the path of the FAB irradiation. If uniformity of the depressions is important, a curved mask member M21 should be used and the energy beam should be made to focus on the shaft piece W6.

Figure 38:
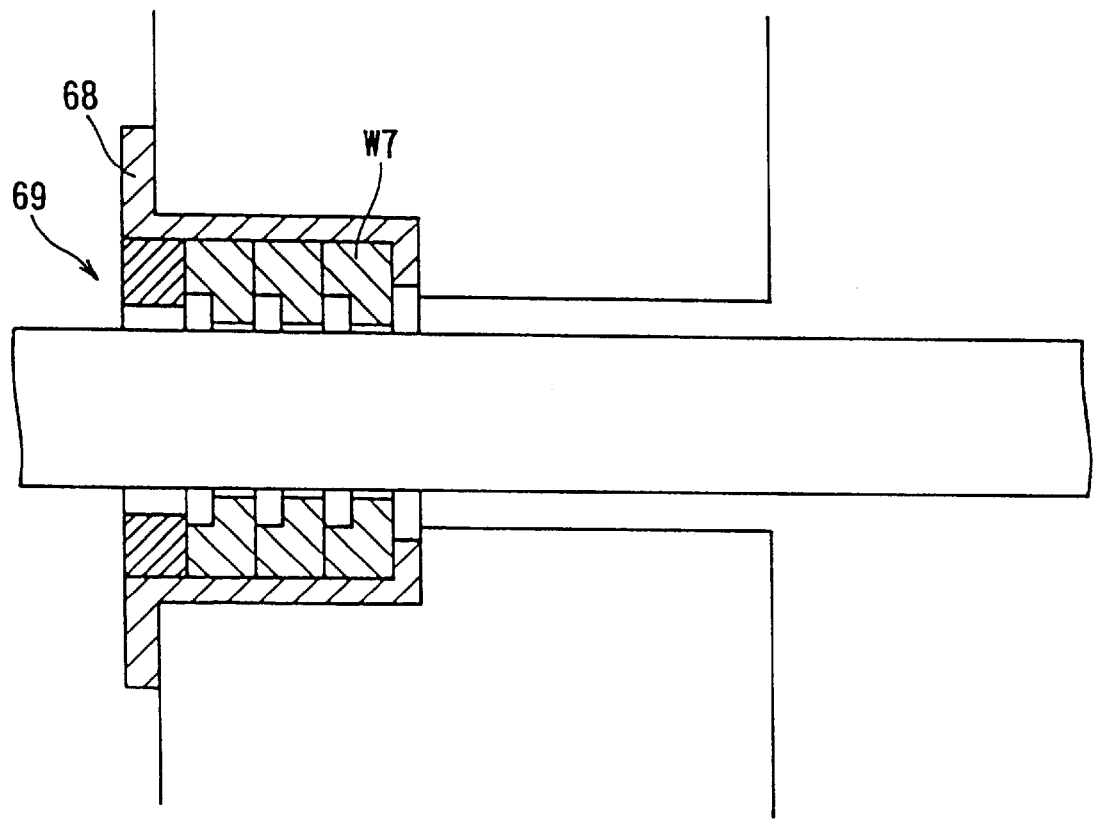
FIG. 38 is a schematic view of still another embodiment of the bearing having the labyrinth seal.
Figure 39A:
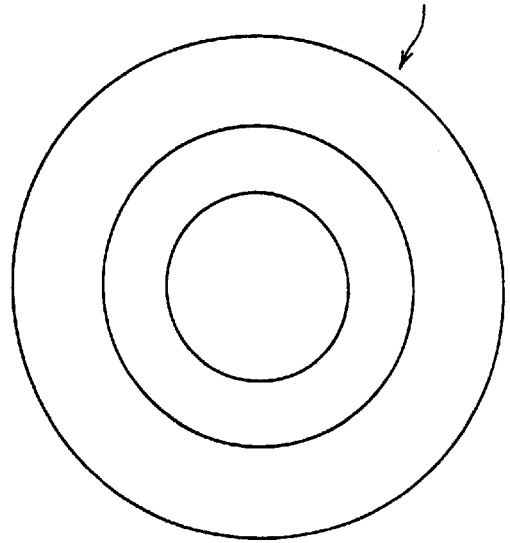
FIGS. 39A–39B are views of some essential parts of the bearing shown in FIG. 38.
Figure 39B:
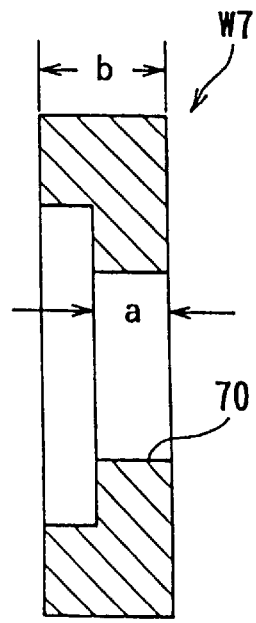
Figure 40:
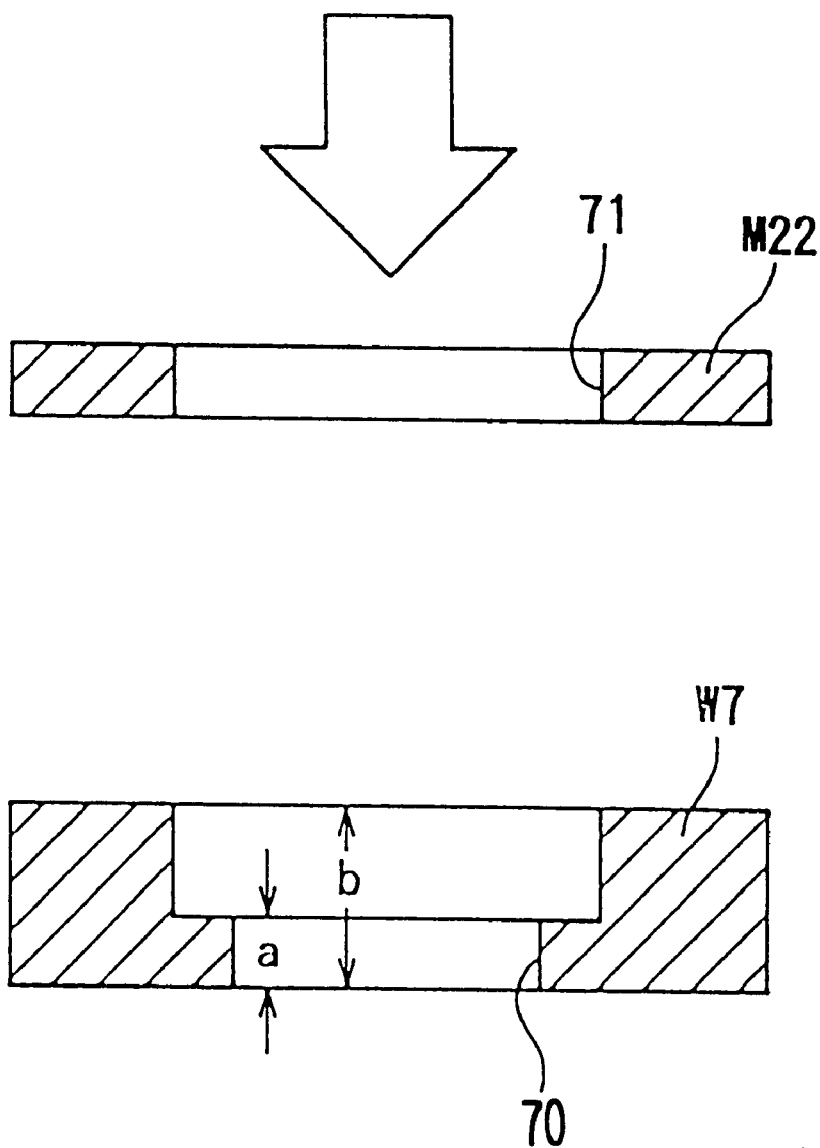
FIG. 40 illustrates a method of making the bearing shown in FIG. 38.

FIG. 38 shows still another fabrication of a bearing structure. Bearing 69 includes a flange 68 having interiorly thereof several layers of seal rings W7 spaced in the axial direction to form a labyrinth seal structure. The thickness of the seal rings W7 at a minimum section shown in FIGS. 39A–39B has a dimension "a" which should be made small to increase the efficiency of the labyrinth seal structure and reduce friction. FIG. 40 shows a step in the making of such a bearing structure. A hole 70 defining a minimum size clearance is pre-fabricated in a seal-ring piece W7, and the thickness of the clearance section is reduced by radiating an energy beam B through a mask member M22 having a circular opening 72 of a size slightly larger than the diameter of the hole 70. Fabrication with the energy beam is flexible because the amount of material removed is governed by the beam structure, and by adjusting the beam strength and varying the time of exposure to the radiation, the material removal rate can be controlled fairly precisely. The result is a high performance bearing for reducing friction with a fine labyrinth structure.

Figure 43:
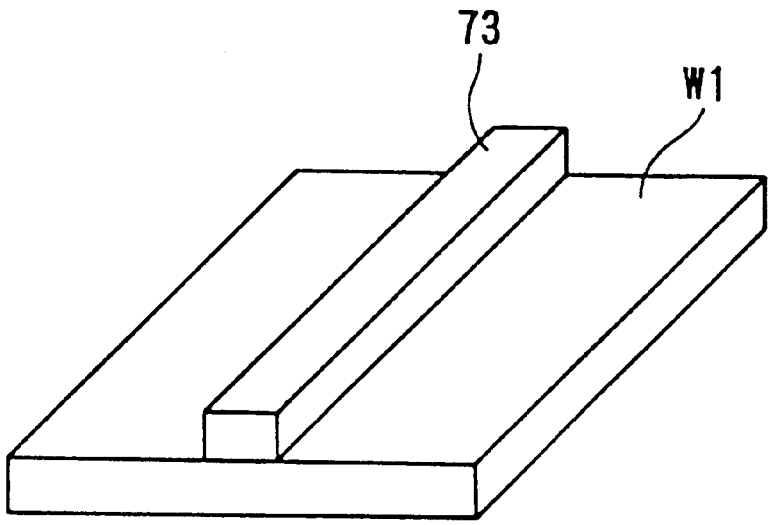
FIG. 43 is an example of a fine-structure produced by the apparatus shown in FIGS. 6A–6C.

FIG. 41 shows an example of the use of focusing an energy beam to reduce the size of the pattern of mask member M23 to be reproduced on the surface of the workpiece W1. The mask member M23 shown in FIG. 42 is made by electro-forming a Ni sheet. The dimension of the smallest section 72 of the mask member M23 is 10 $\mu$m. The energy beam used in fabrication is a focusing FAB which focuses at a point O, achieving a size reduction of $\frac{1}{1000}$. If the width of the section 72 is 10 $\mu$m, and the focusing angle is 1 degree at the focal point, then the width is reduced to 10 nm at a distance approximately L=286 $\mu$m from the focal point as illustrated in FIG. 41. The result is a fabrication of a workpiece W1 shown in FIG. 43 having a fine-structure protrusion 73 which is $\frac{1}{1000}$th of the section 72 of the mask member M23.

Focusing beams B usually have some aberrations, so the separation distance between workpiece W and mask member M should be adjusted until the desired dimension of the pattern is obtained on the workpiece W. When the aberration of the focusing beam is too high, the aberration may be turned to an advantage for allowing the beam intensity to vary to produce desired fine-structures. In this case also, adjustment of the separation distance is an important parameter.

Figure 44:
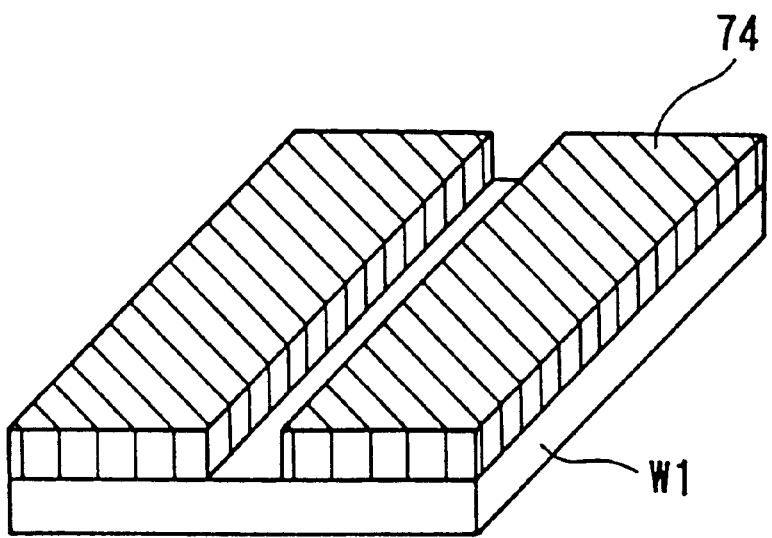
FIG. 44 is another example of a fine-structure produced by the apparatus shown in FIGS. 6A–6C.

FIG. 44 shows another application of the Ni mask member M23. The focusing beam B in this case is comprised of a radical atomic/molecular particle beam, for example, methane-containing gases or tungsten-containing gases such as $WF_6$. A deposit film 74 of the order of 10 nm thickness is formed on one or more surfaces of the workpiece W1.

Figure 45:
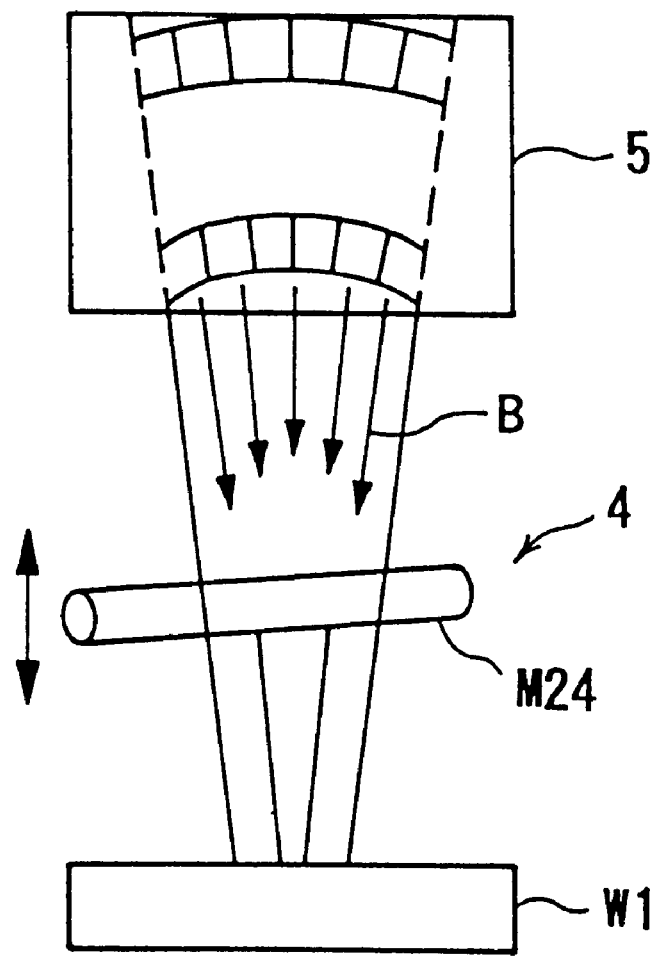
FIG. 45 is a schematic illustration of an example of another fabrication apparatus.
Figure 46A:
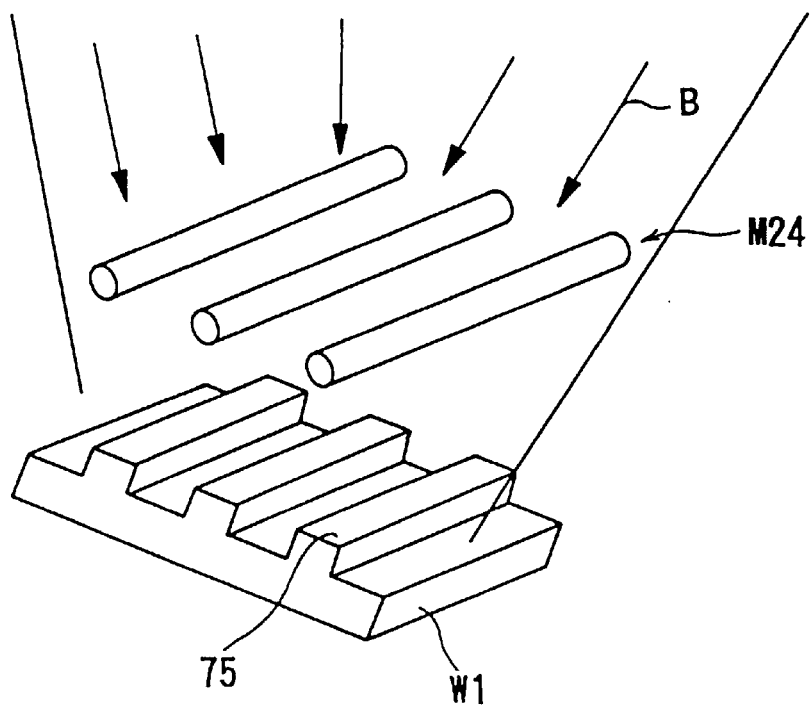
FIGS. 46A–46B are schematic illustrations of still another example of a fabrication apparatus.
Figure 46B:
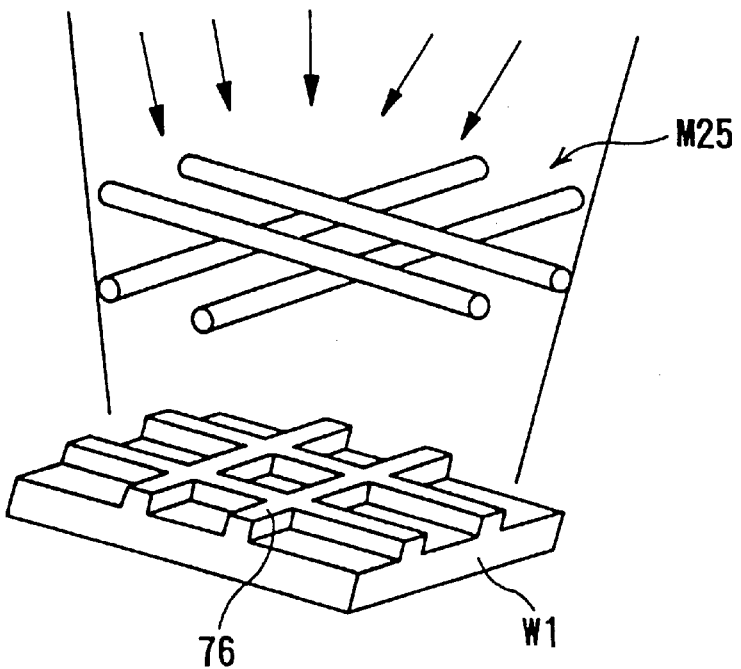

FIG. 45 illustrates an example of the use of a rod-shaped mask member M24. The mask member M24 is mounted integrally on a base portion, shown earlier in FIG. 12C, to facilitate handling of the fine rod. By adjusting the separation distance as in the case shown in FIG. 41, it is possible to form a fine-structure line protrusion 75 which is a size-reduced replication of the rod mask member M24. FIGS. 46A and 46B are two examples of fine-structures made by using several such rod mask member M24. In the case shown in FIG. 46A, horizontally-arrayed rod mask members M24 are used in conjunction with a FAB B to produce a plurality of parallel line protrusions 75. In the case shown in FIG. 46B, meshed rod mask members M25 are used to produce crossed linear protrusions 76.

FIG. 47 presents an application of the meshed rod mask members M25 made of Ni in conjunction with the technique of reduced projection imaging to form crossed protrusions 76 on different faces of a workpiece W3. This is an example of a three-dimensional micro-fabrication technique which has been difficult to perform using the conventional fabrication techniques. The products made by reduced projection imaging, having such fine-structures in a three-dimensional workpiece, are useful in many fields of new technologies such as advanced electronics, information communication, quantum effect devices as well as in specialized fields such as reduction of friction in severe environments.

Next will be described examples illustrating some of the products which can be made by moving at least one of the components of the fabrication system, comprising an energy beam source, a mask member and a workpiece. Control over material is achieved by adjusting the duration of the beam irradiation.

The technique utilizes the apparatus such as those shown in FIGS. 7–11. The micro-stage 14 of the micro-manipulator 9 is used to move either the mask member M or the workpiece W in the x-direction while the FAB source 5 radiates an FAB B. The duration of exposure to the beam B in the various regions of the workpiece W is governed by the track and speed of movement of the mask member M. The irradiated regions are attached in proportion to the duration of exposure to the beam, and the mask regions remain as protrusions in the proportion that is determined by the duration of masking received.

Figure 48:
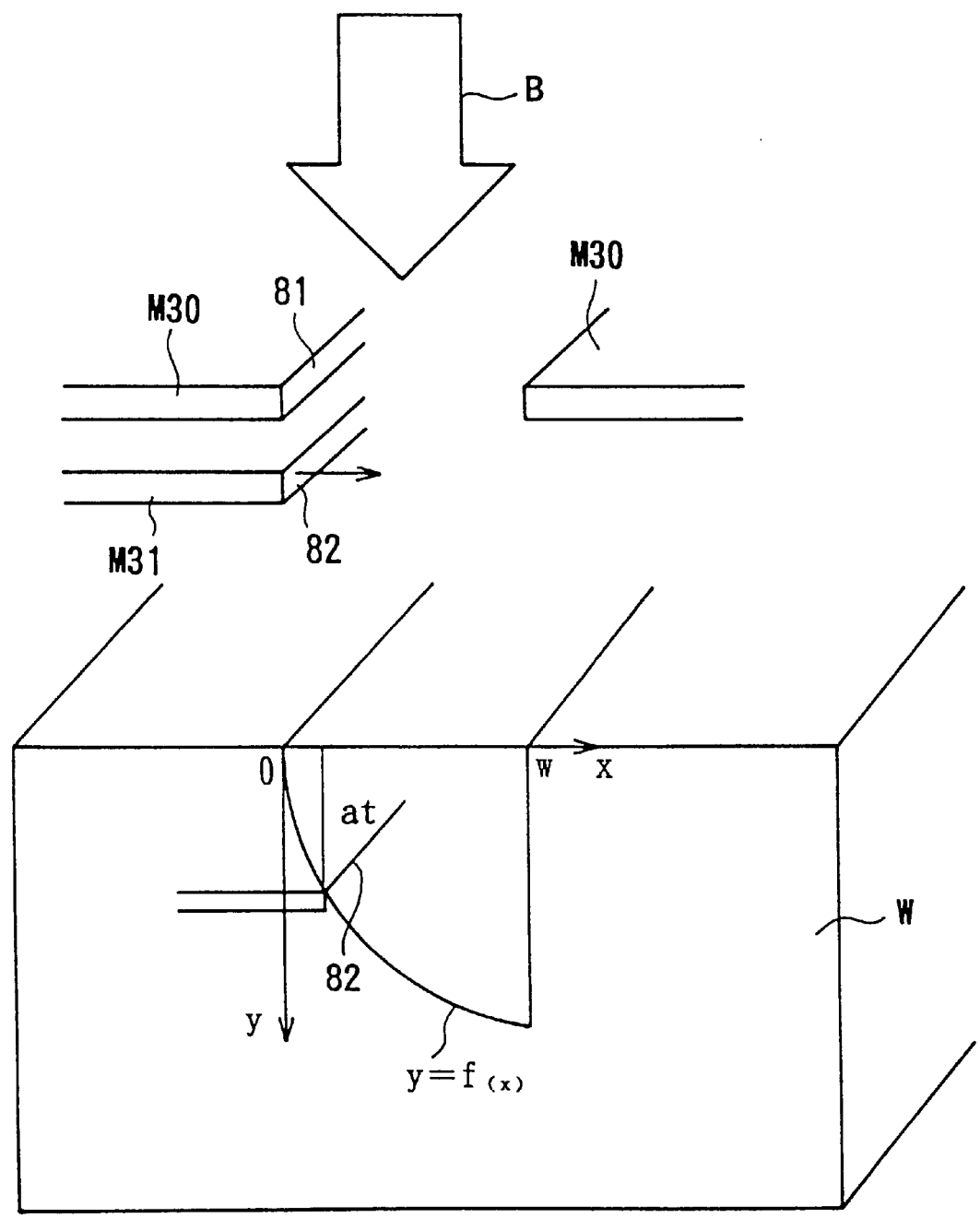

FIG. 48 illustrates an example of forming a groove having a width dimension w and a curvature, whose cross sectional shape is given by a function y=f(x). The process is carried out using a collimated energy beam B, a stationary slit mask member M30 having a slit 81 of width w and a movable mask member M31 having an edge 82 aligned parallel to the slit. The movable mask member M31 is moved at right angles to the edge (x-direction) while irradiating the workpiece W with the energy beam B so as to successively block part of the energy beam B.

The quantity of material removed is proportional to the duration of exposure, therefore it can be expressed as y=at. That is, at time "at", the edge of the movable mask M31 should be positioned at f(x). Starting from at=f(x), the material from the workpiece W is removed by moving the movable mask M31 to follow an inverse function of f(x), i.e., x=fi(at) to form the curvature. If a single-pass removal produces a rough surface, the process may be repeated in incremental steps. In this case, the movable mask member M31 may be reciprocated so as to follow the curve x=fi(at)/n at all times, where n is the number of reciprocations.

Figure 49:
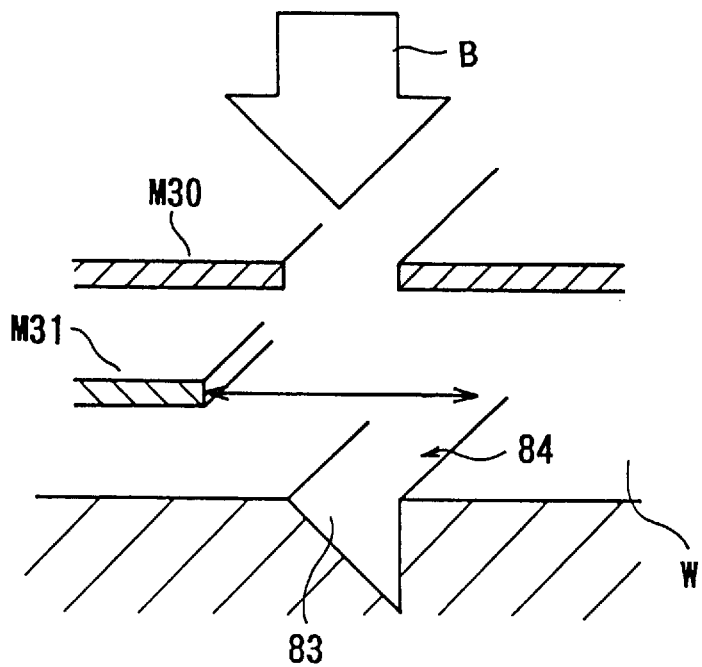
Figure 50:
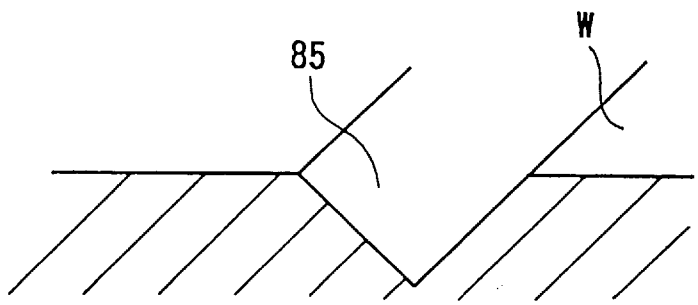
Figure 51:
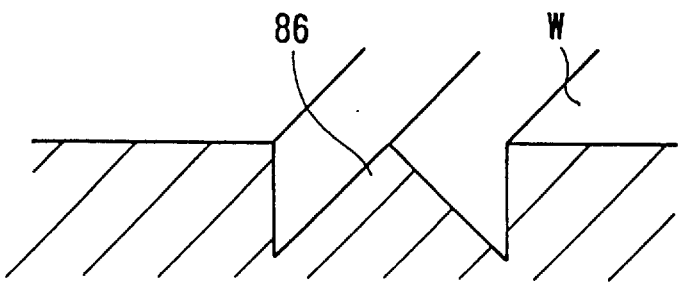
Figure 52:
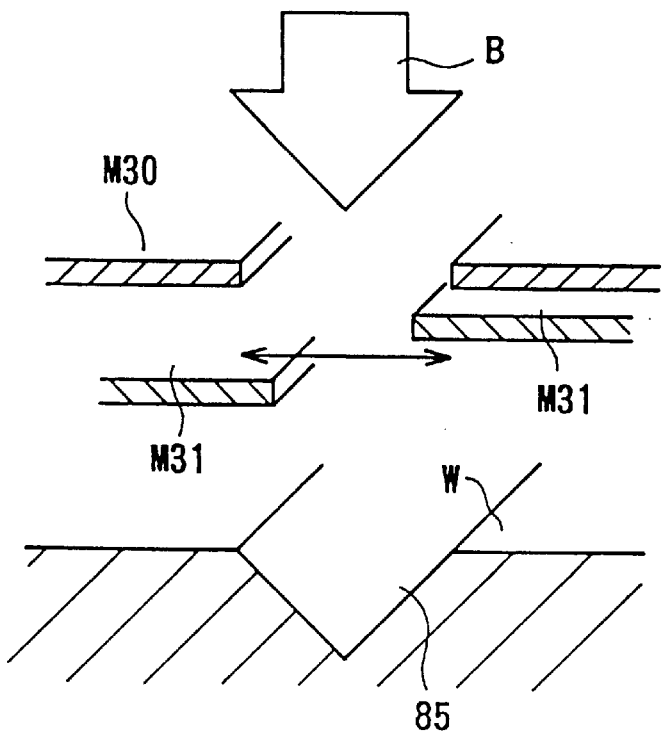

FIG. 49 shows a groove of a linear cross sectional shape, in which the slope can be expressed as f(x)=bx, where x=a/b. By moving the movable mask member M31 at a constant speed unidirectionally or by reciprocating the mask member M31, a groove 84 having an inclined surface 83 is fabricated. The process can be repeated by reversing the edge 82 of the moving mask member M31, a V-shaped groove 85 as shown in FIG. 50 can be produced, or an inverted V-shaped protrusion 86 as shown in FIG. 51 may also be produced. To quicken the fabrication speed for V-grooves, two movable mask members M31 may be used on both sides of the groove, as shown in FIG. 52, to move synchronously or in reciprocation.

Figure 53:
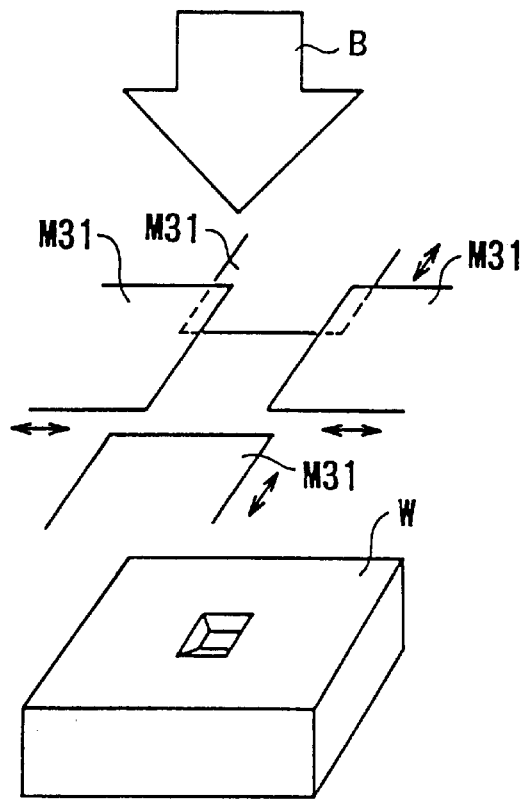

FIG. 53 shows the use of a multiple number, three or more, of movable mask members M31 instead of a single movable mask member M31 used in the above case. The illustration shows the movable mask members M31 moving at right angles, but any direction of movement can be utilized.

A simpler fabrication method for V-grooves is illustrated in FIG. 54. In this case, the slit width of movable mask member M32 is half of the width of the groove 85, and the movable mask member M32 is reciprocated laterally over a distance equal to the slit width. The stationary mask member is not necessary in this case, and the apparatus and the process are simplified greatly compared to the method illustrated in FIG. 49. At the point of reversing the movable mask member M32, there is a change in speed, but the groove shape is not affected significantly by such speed change, because the speed is usually slow.

To produce an intersection structure to correspond to the one shown in FIG. 53 using the above technique, the mask member M33 and the workpiece W are each moved in two directions. The grooves intersect to produce a depression as illustrated in FIG. 55. The same structure can be produced by moving one of either the movable mask member M33 or the workpiece W along with a rectangular shape given by summing each movement vector of these articles.

Figure 56:
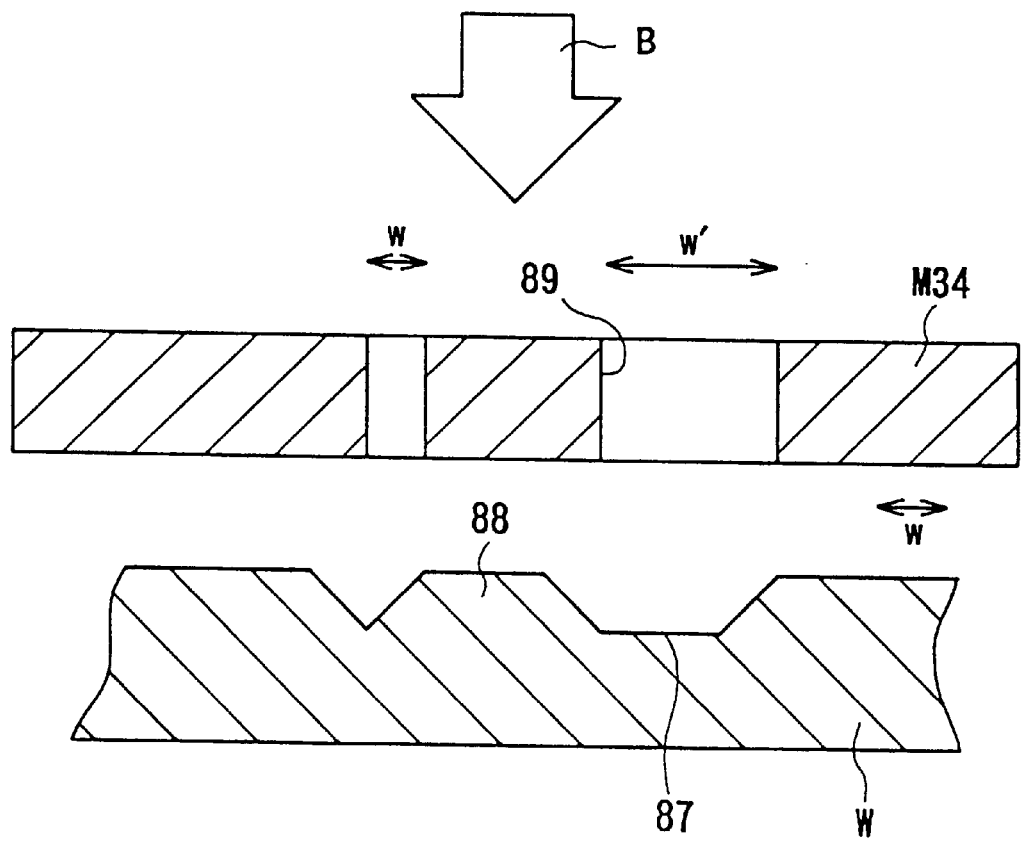
Figure 57:
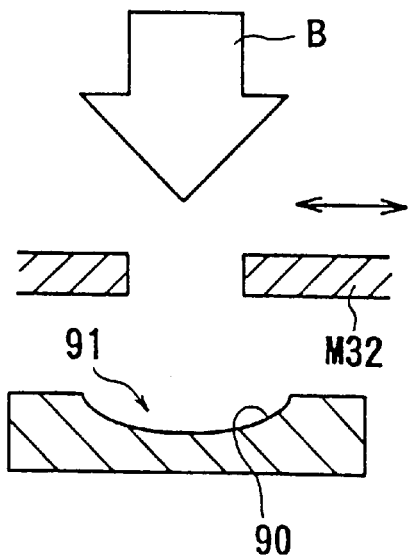

To produce a groove 87 or protrusion 88 having a flat surface at the bottom or the top, the slit width w' of the movable mask member M34 should be larger than the moving distance w (FIG. 56). The example shown has a sloped surface, but it is apparent that, by regulating the speed of mask movement, a curved surface 909 of a groove 91, shown in FIG. 57, can also be produced readily.

Figure 58:
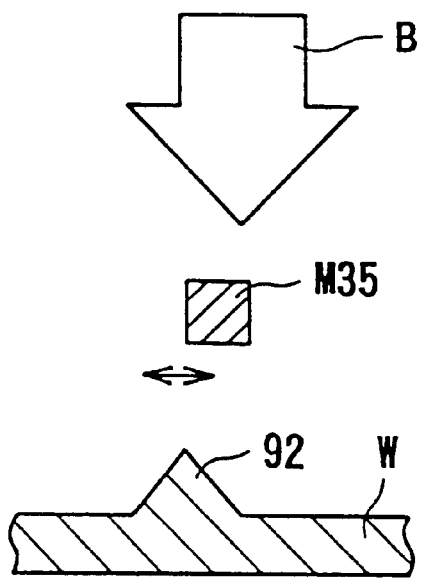
Figure 59:
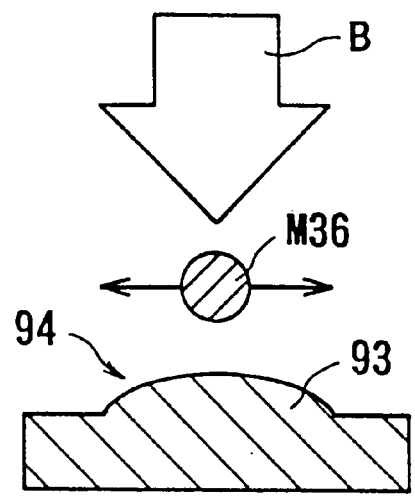

A sharp tipped linear protrusion structure is obtainable from the line protrusion structure 86 shown in FIG. 51 by further processing to plane the surfaces aside, but such a structure can also be produced by reciprocating a polygonal wire mask member M35 over a distance of the width required. This one step process shown in FIG. 58 is simpler for producing a tipped structure 92. By changing the moving speed of a circular mask member M36 shown in FIG, 59, it is possible to produce a protrusion 94 having a curved surface 93.

Figure 60A:
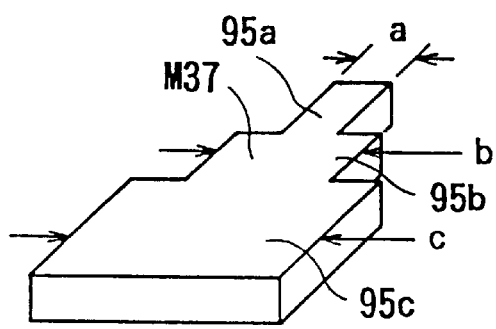
Figure 60B:
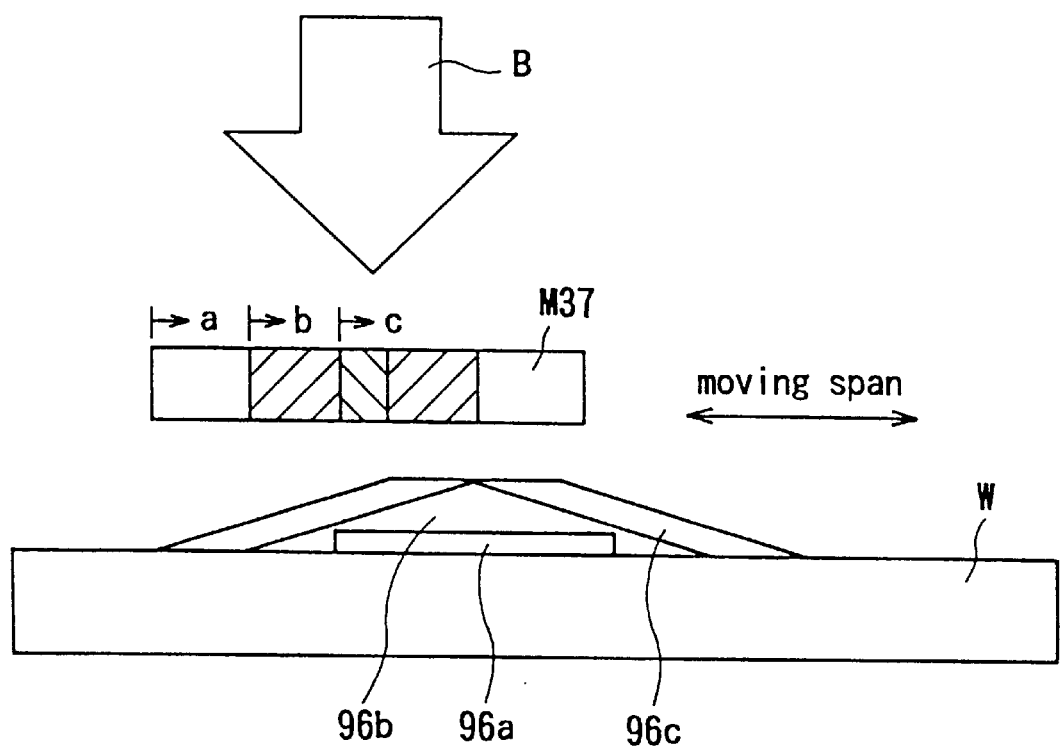

FIG. 60A shows an example of using a mask member M37 having a special patterned shape, a three-stepped pattern. The mask member M37 having this type of pattern can be produced by the electro-forming process. A photoresist pattern is formed on a flat glass plate, and a nickel film is then electro-formed thereon. Subsequently, the resist layer is dissolved and the nickel film is removed. The final Ni film measures 1–10 nm in thickness, and the minimum dimension of the mask member M37 in this case is 1–5 $\mu$m. The film material may be Si, GaAs and other semiconductor materials which can be made into thin films. Photoresist patterns and masking can be made by electron beam drawing, which can be controlled precisely to produce any type of desired patterns. The mask member M37 is provided with three different widths (95a, 95b and 95c), respectively, at 1 $\mu$m; 10 $\mu$m; and 20 $\mu$m. As shown in FIG. 60B, when the mask member M37 is moved over a distance equal to the width 95b (10 $\mu$m) while being irradiated with an energy beam B, it is possible to simultaneously produce a fine-structure having three different heights at the locations corresponding to 95a, 95b and 95c on the surface of the workpiece W, because of the variations in the energy density distribution across the surface of the workpiece W. The above case is an example of a three-dimensional fine-structure which can be produced by moving the mask member M relative to the workpiece W or vice versa. The method is efficient, simple and relatively quick. The products made by such a method can be used for advanced applications of electrical and optical micro-circuitries.

Figure 61A:
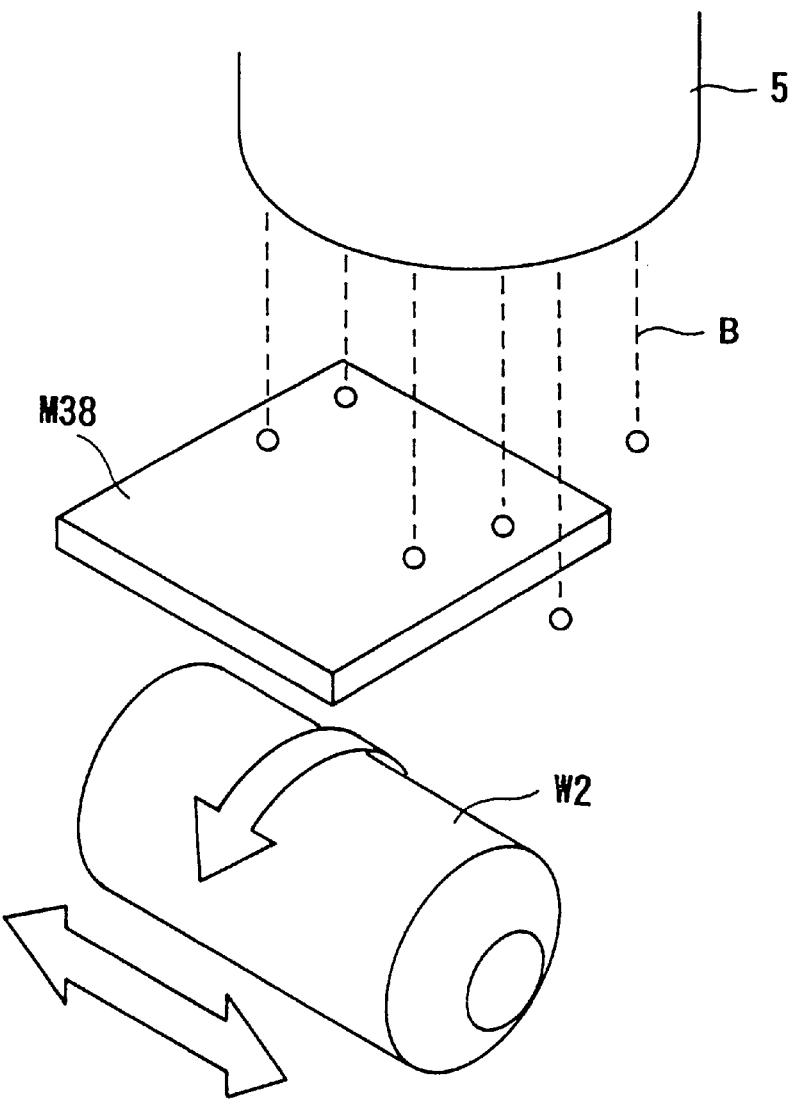
Figure 61B:
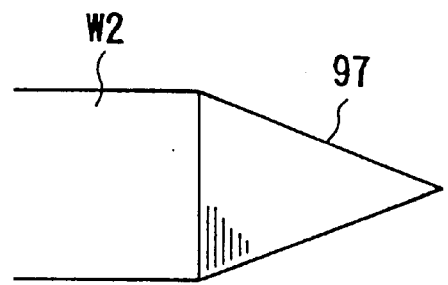

The examples shown in FIGS. 61A–61B further relate to fabrication with two directions of relative movement between the workpiece W and the mask member M. Typical directions are orthogonal, and the first direction is for making a structure in such direction, and the second direction of movement is for making the structure over a wider area. The basis movement is to move in the second direction at a particular location in the first path, and this step is repeated at different locations on the second path. FIG. 61A shows a method of producing a sharp tip on a cylindrical workpiece W2. The workpiece W2 is placed such that its axis lies at right angles to the beam, and the workpiece W2 is rotated about the axis while a plate mask member M38 placed between the beam and the workpiece W is moved axially. When the workpiece W is rotated repeatedly at a rotational speed higher relative to the lateral movement speed of the mask member M38, an approximately cone-shaped surface 97 can be fabricated, as shown in FIG. 61B.

Figure 62:
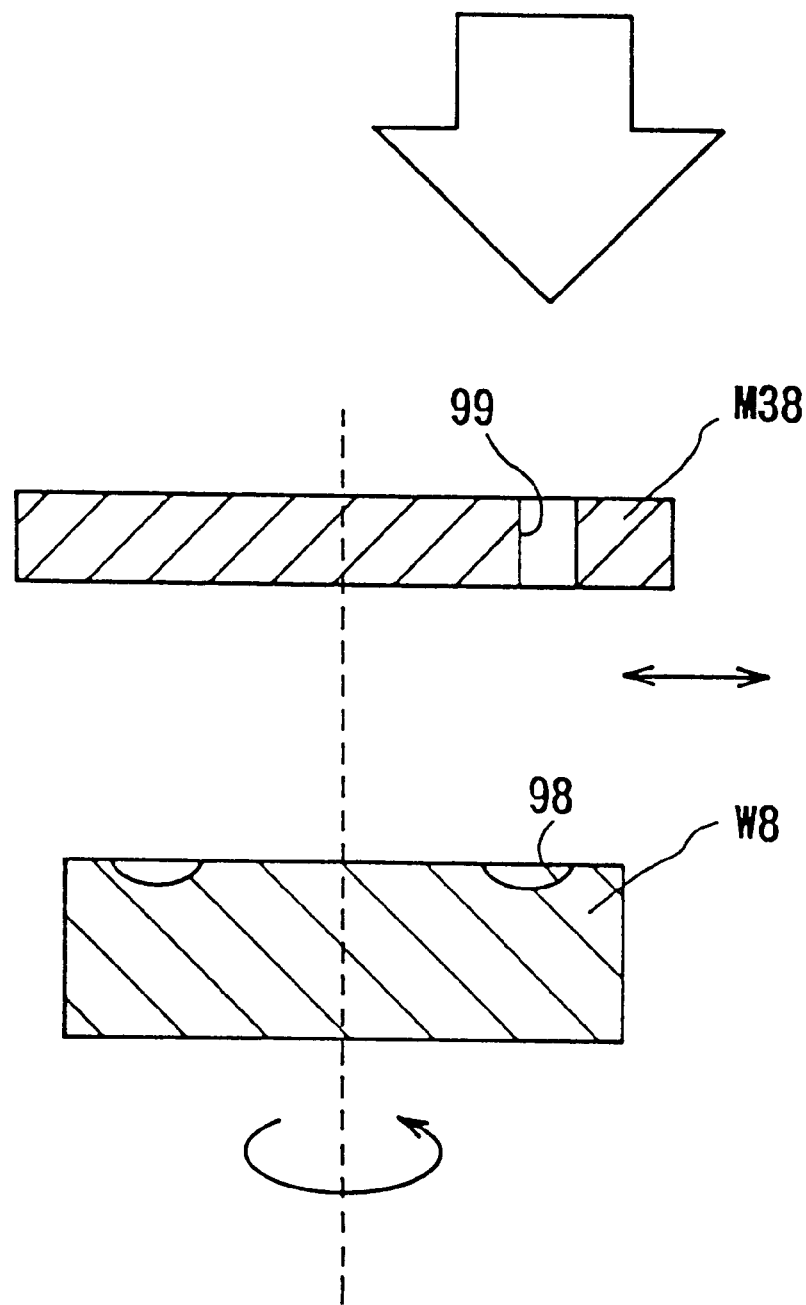
Figure 63:
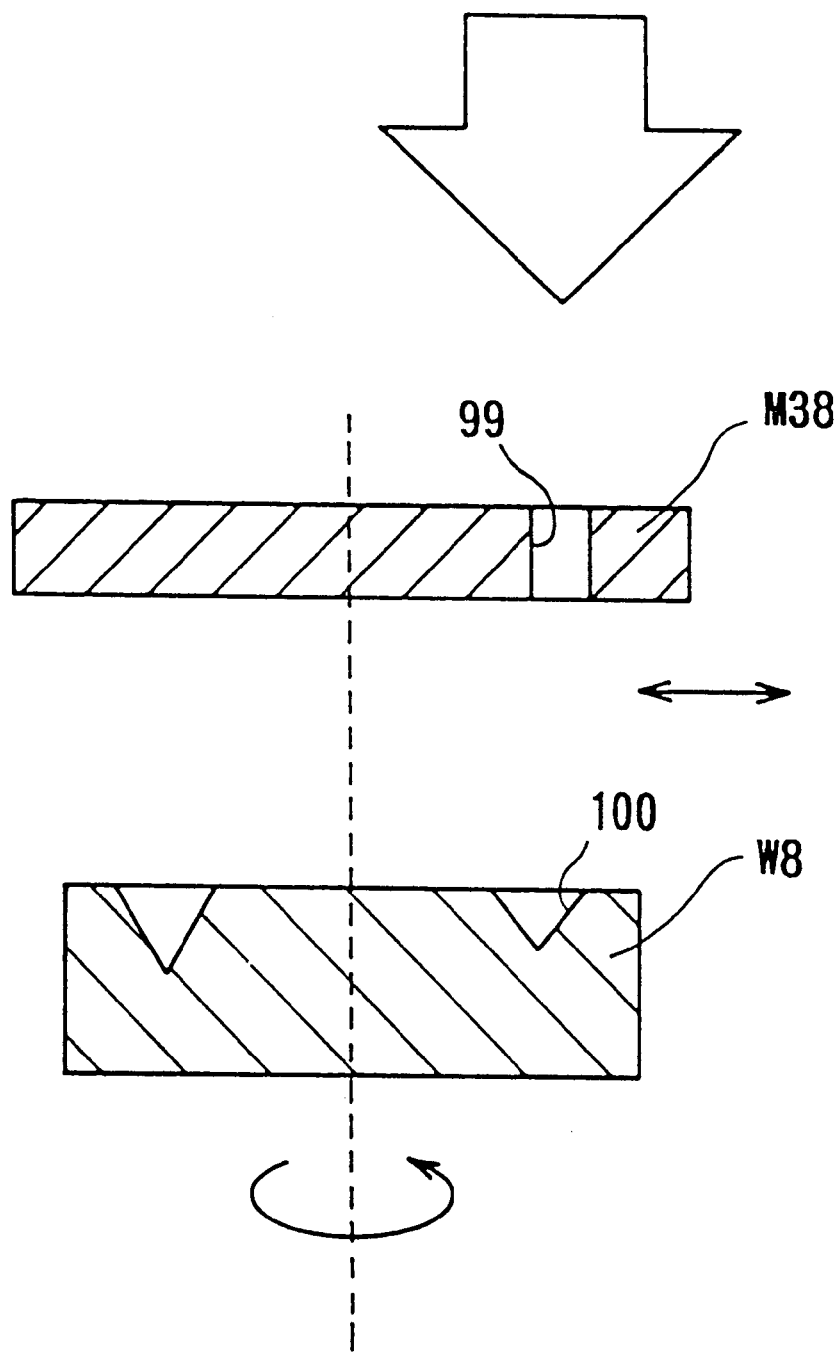
Figure 64:
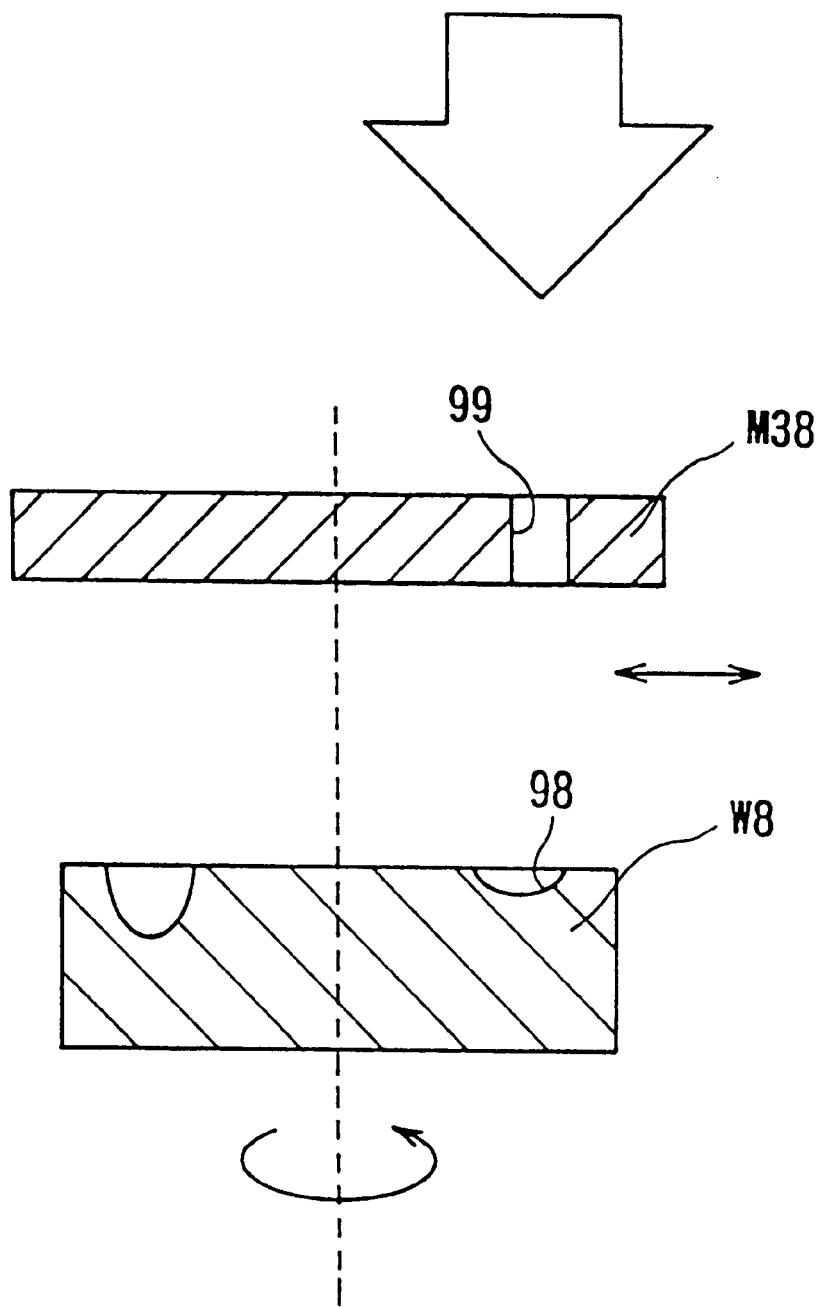

FIGS. 62 to 63 show a method of making a groove around a circumference of a disc-shaped workpiece W8 using the method illustrated in FIG. 54. A disc-shaped workpiece W8 is freely rotatably supported on its axis, and a mask member M38 having a circular opening 99 is radially reciprocated over a distance about equal to the size of the opening 99. By adjusting the reciprocating speed pattern as well as the shape of the opening 99, different shapes of grooves such as a curved surface groove 98 (see FIG. 62), a v-groove 100 (see FIG. 63) can be produced. By adjusting the rotational speed, the depth of the grooves 98, 100 can be altered (see FIGS. 63, 63).

Figure 66:
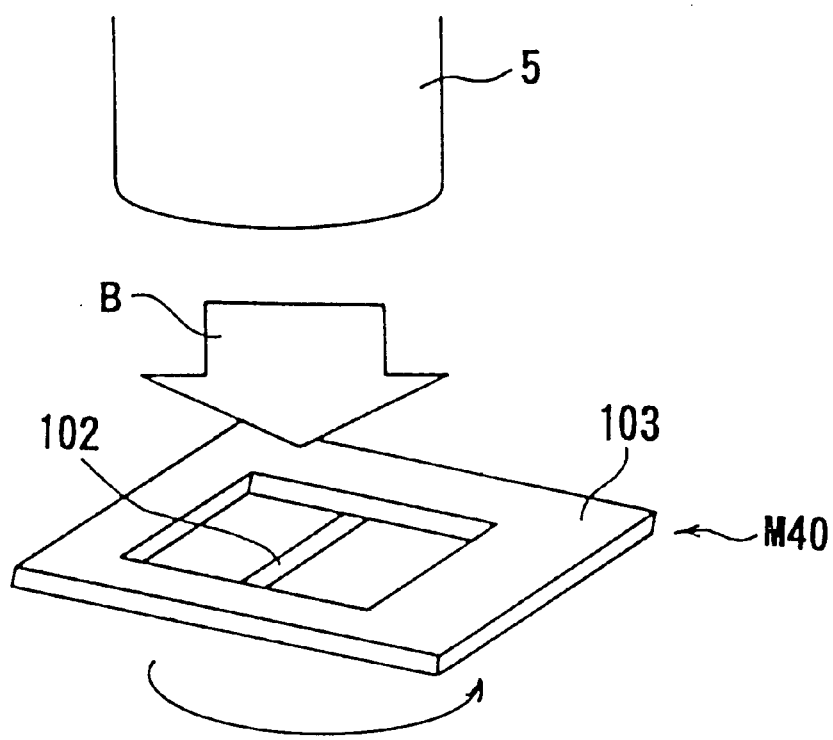
Figure 67:
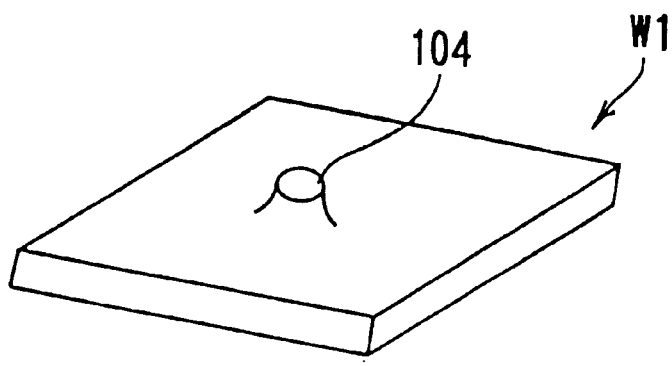

FIGS. 65 and 66 further relate to fabrication methods based on providing more complex relative motion between the mask member M and the workpiece W. The example shown in FIG. 65 utilizes the technique illustrated in FIG. 55. A sphere formed on an end of a cylindrical workpiece W2 is provided with a plurality of small protrusion portions 101. To make the depression regions in such a fine-structure, a mask member M39 having a circular opening 102 is reciprocated in the axial direction while the workpiece W2 is rotated and swung about its axis with an amplitude of swing about equal to the reciprocation distance. This basic step is repeated a number of times to produce a plurality of protrusion portions 101. The method illustrated in FIG. 66 relates to forming a fine-protrusion 104 having a sloping side surface and a flat surfaced top shown in FIG. 67 by rotating a frame mask member M40 having a fine wire 102 disposed within a frame 103 about an axis at right angles to the frame plane. When frame mask member M40 is provided with a slit, a depression is formed as explained earlier with reference to FIG. 55.

Figure 68:
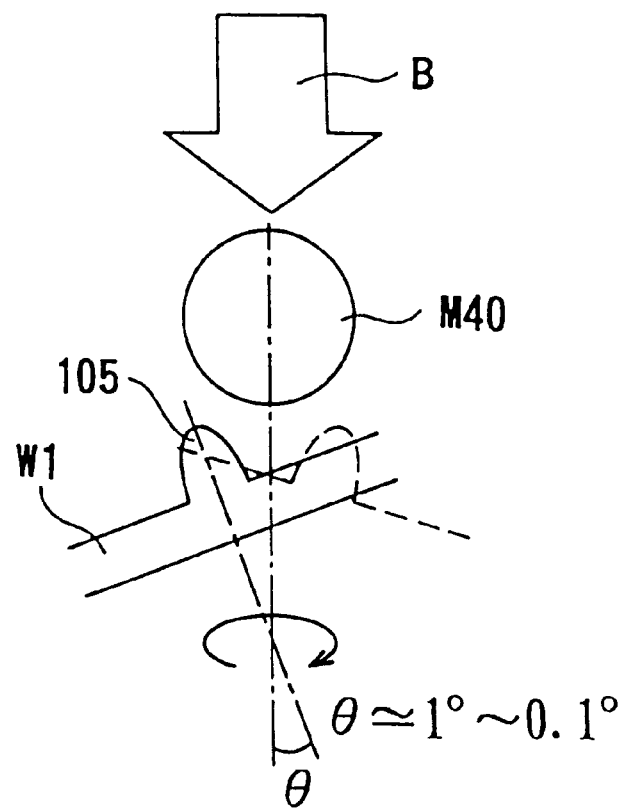
Figure 69A:
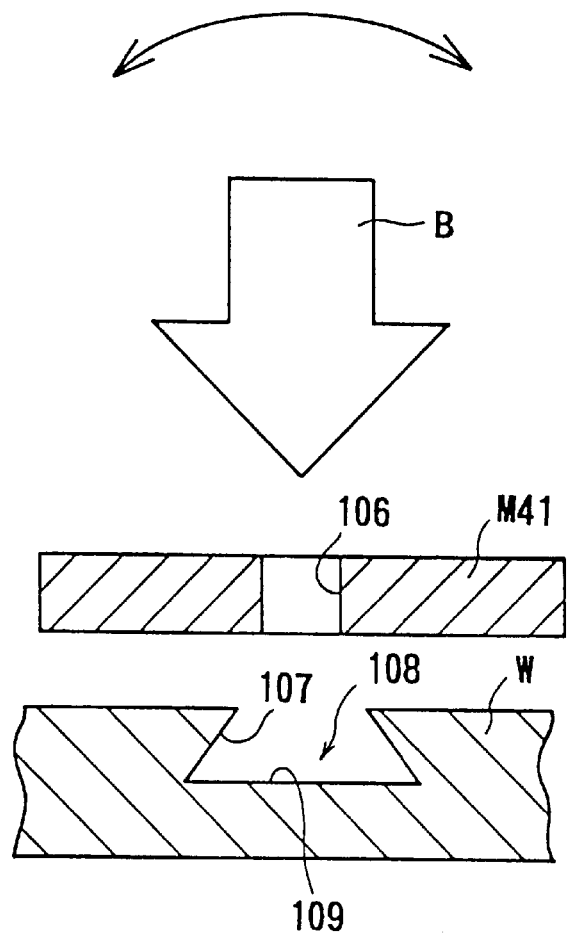
Figure 69B:
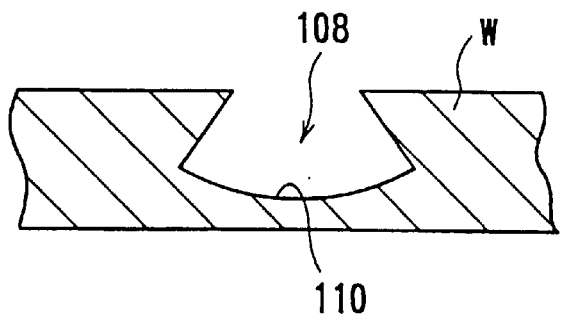
Figure 70:
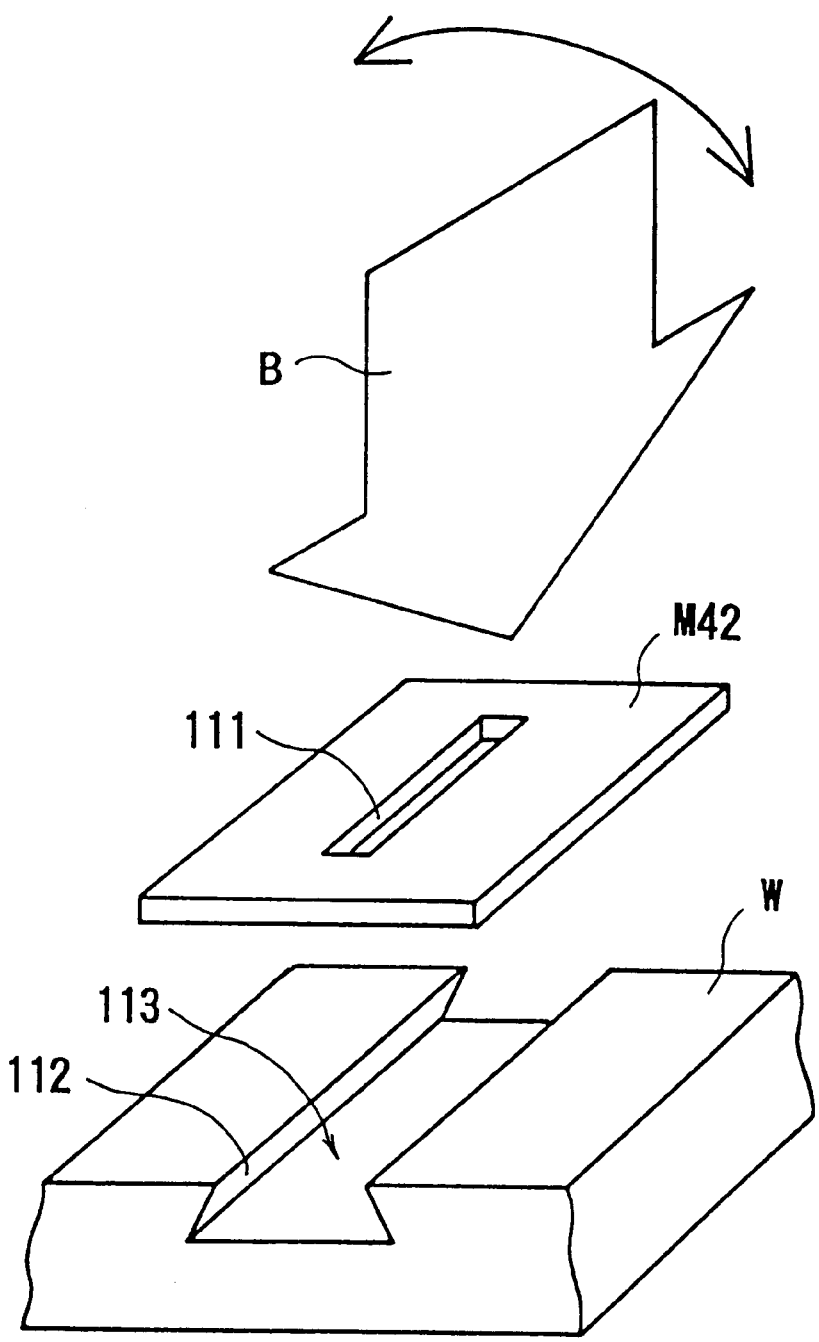

FIGS. 68 to 73 illustrate examples of making various fine-structures by altering the incident angle of the energy beam combined with relative motion of the mask member. FIG. 68 shows rotation of a substrate workpiece W1 oriented at an angle θ to the vertical using the apparatus shown in FIG. 66 to produce a three-dimensional spherical or oval lens-shaped fine protrusion 105 or a depression. FIGS. 69A and 69B show two methods of making cavities of different cross sectional shapes. A mask member M41 having a circular opening 106 is placed between a workpiece W and an energy beam B whose beam source is made to oscillate as shown in FIG. 69A. The incident beam angle is changed by this arrangement to produce a cavity 108 having a wider bottom and sloped side walls 107 as illustrated in FIG. 69A. By adjusting the speeds of various motions suitably, the bottom surface may be made a flat surface 109 as shown in FIG. 69A or a concave surface 110 as shown in FIG. 69B. FIG. 70 shows an example of using a slit mask member M42 having a slit 111. This arrangement produces a dovetail groove 113 with sloped side walls 112. This type of product is useful in making a fine rail-slider component.

Figure 72:
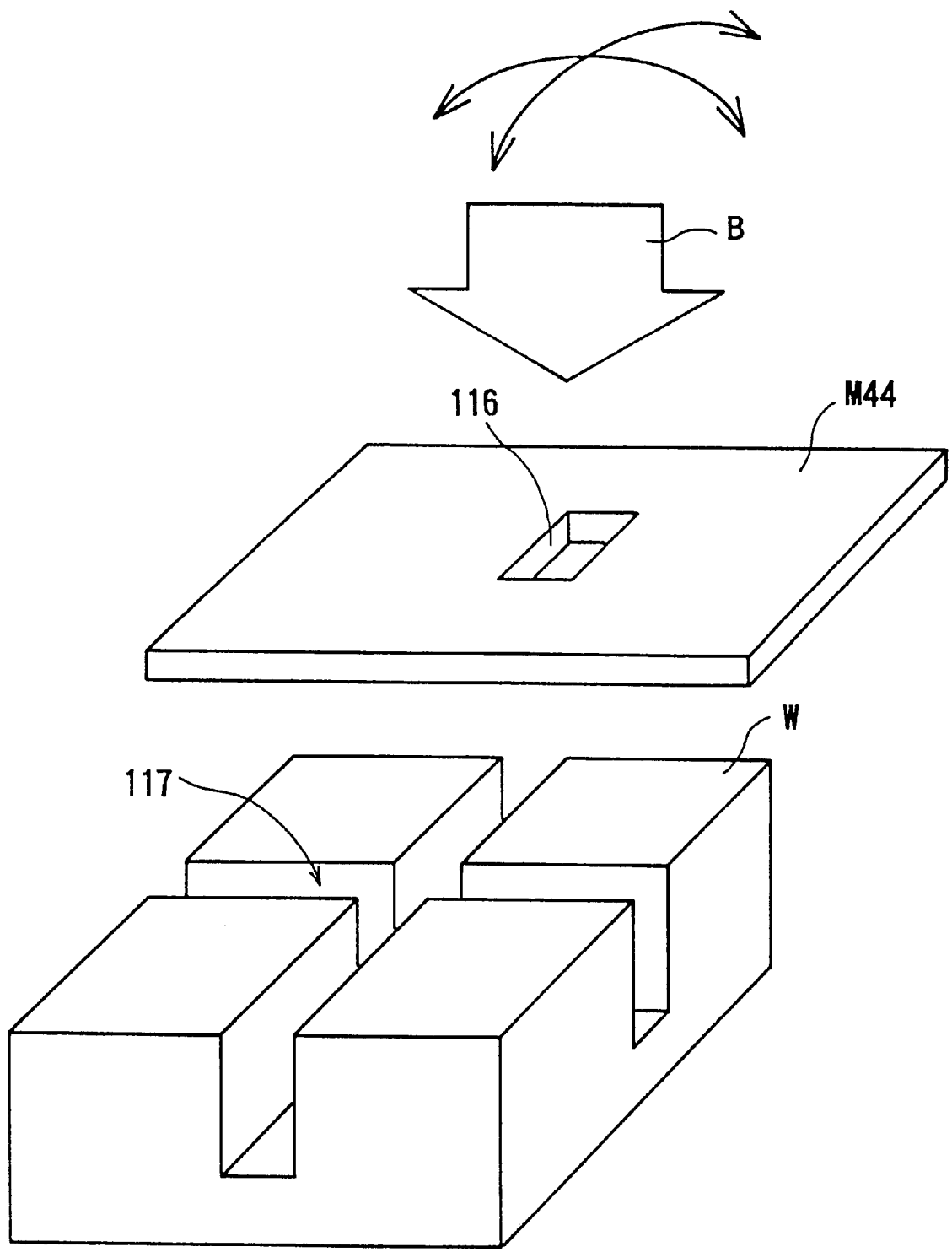
Figure 73:
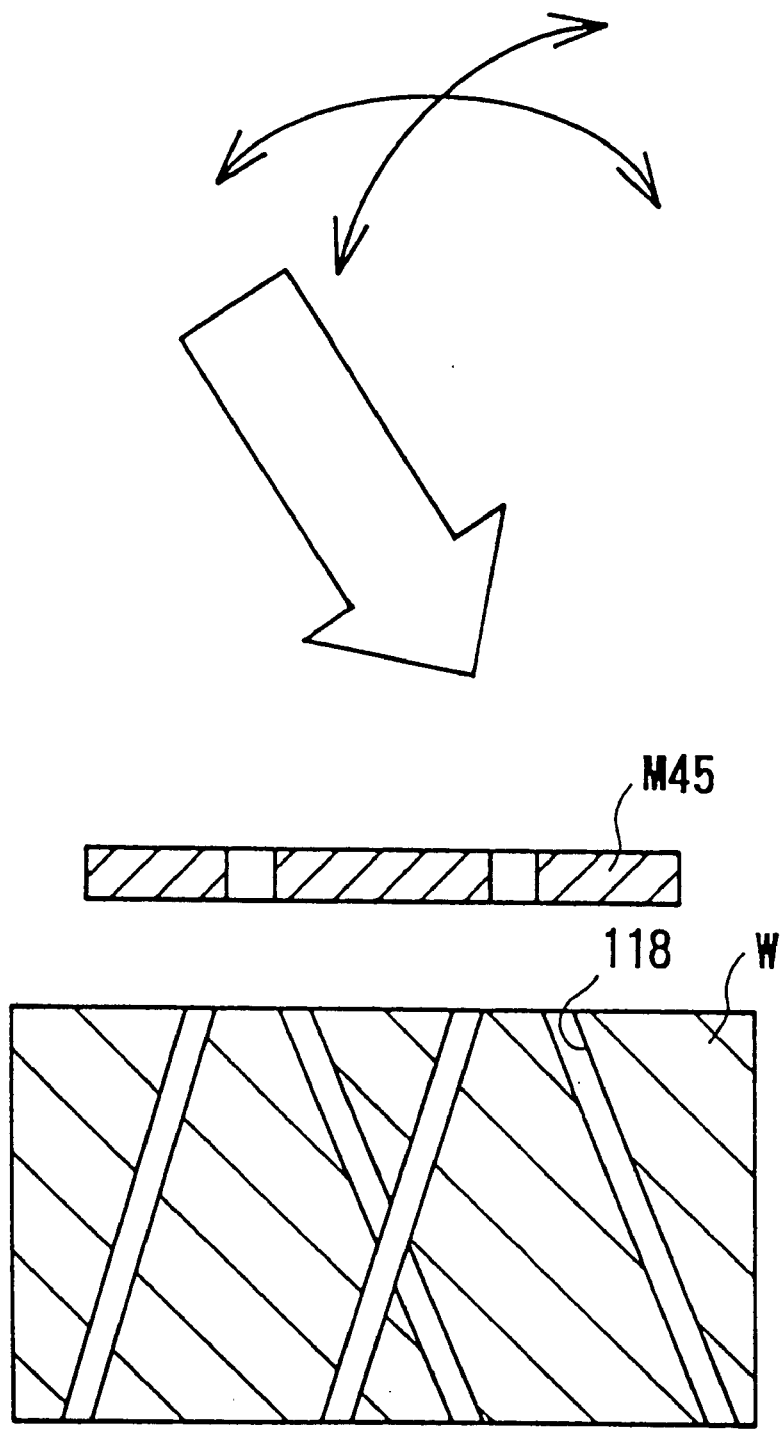

FIGS. 71A and 71B show a method in which the beam B is made to undergo a swiveling motion about the vertical axis of a circular opening 114 provided in a mask member M43. The product produced by this arrangement is a ring-shaped groove 115 having both inner and outer side walls inclined at the same angle, as illustrated in FIG. 71B. FIG. 72 shows a method using a mask member M44 having a square opening 116 to produce a cross-groove 117 having a flat bottom in a workpiece W by making the beam undergo a swiveling motion within two vertical planes orthogonally intersecting each other. FIG. 73 shows a method using a mask member M45 having a plurality of fine openings, and the beam is made to swing in various directions or made t undergo a swiveling motion. The product is three-dimensional inclined passages 118 through the workpiece W.

To summarize the basic features presented so far, it can be seen that a relative movement of a workpiece W with respect to a mask member M enables a significant increase in the degree of freedom in designing and producing complex three-dimensional fine-structures which have not been possible within the scope of the conventional fabrication methodologies. Complex curves and other fine features can be readily produced as demonstrated above. In general, the principle is to design a mask pattern to correspond with the pattern required on a workpiece, and to conduct fabrication by varying the relative speed and orientation. As demonstrated above, when one mask member produces only a limited pattern, a combination of different mask members can be used to perform fabrication repeatedly. It has been shown that various methods of fabrication can be combined to produce complex fine-structures which are not possible with one method. Additional flexibility is offered by altering the direction of an incident beam.

Figure 75:
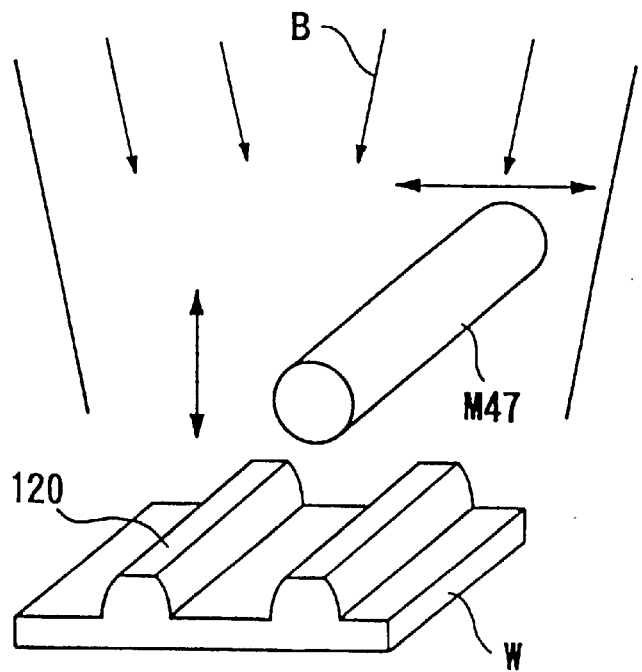
Figure 76:
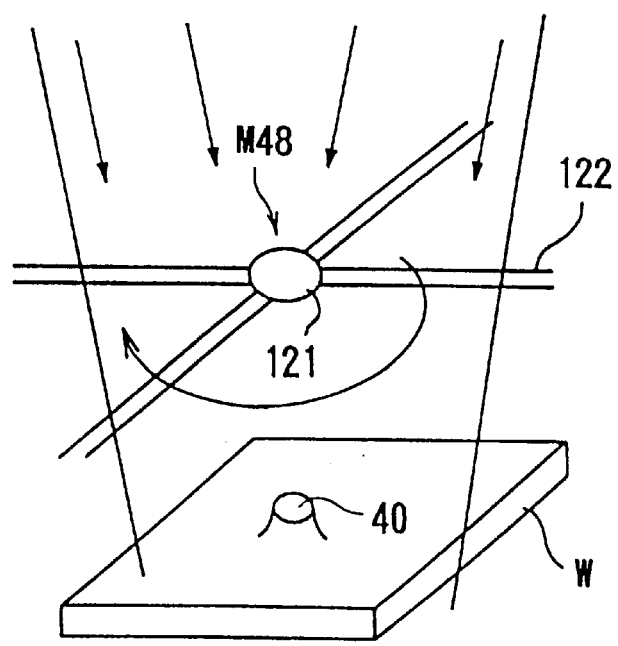

Most of the examples presented so far have been based on a premise that the energy beam is a parallel beam. FIGS. 74 to 76 illustrate examples of fabrication using focusing beams B. FIG. 74 shows a method of making a surface protrusion 119 having a smoothly curved surface by moving a fine-wire mask member M46 along the beam, i.e. vertically in the z-axis direction. Normal energy beams do not maintain complete parallelism, and exhibit a certain amount of scatter angle. In this method, this is used to advantage because the beam energy becomes unevenly distributed, when the separation distance between the mask member M46 and the workpiece W is increased.

FIGS. 75 and 76 relate to a method of utilizing an intentionally focused energy beam, which is quite useful when the mask member M or the pattern on the mask member M is too large to meet the fine size requirements of the fine structure to be produced on a workpiece W. In such cases, a focused beam is used to generate reduced projection imaging as discussed earlier. This technique allows varying reduction ratios of the size of the image projected onto the workpiece W, by adjusting the separation distance between the mask member M and the fabrication surface of the workpiece W.

FIG. 75 shows a method of using a focusing beam B in conjunction with varying separation distance between the mask member M and the workpiece W. In this case, the mask member is a fine-wire mask member M47 which is moved along an x-axis, and is stopped at two locations, for example, so as to control the degree of exposure received by the fabrication surface. The product formed by the reduced projection imaging technique is a line-protrusion structure 120 having a flat top surface and smooth side surfaces. If the vertical separation distance (z-axis) is varied during the irradiation step, the reduction ratio can be varied so that the fine-structures, produced at two locations, can be made the same size or different sizes.

FIG. 76 shows a method using a mask member M48 having a spherical center piece 121 from which four needles 122 extend outwardly. The mask member M48 is rotated about the axis of the spherical center piece 121 coinciding with the optical axis of the energy beam. The product produced by the reduced projection imaging technique in this case is a protrusion fine-structure 40. Because the needles 122 are revolving, the fabrication surface is exposed uniformly to the energy beam, and ultimately only the spherical center piece produces the effect of reduced projection imaging. Reduced image of the needles may be produced by periodically stopping the revolution while irradiating with the energy beam.

Figure 77:
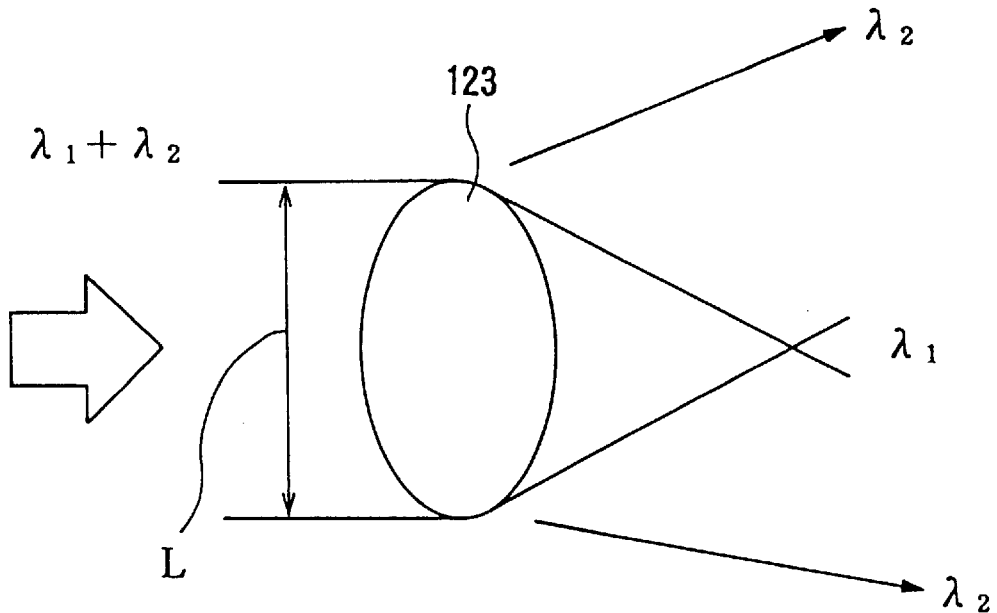
FIG. 77 illustrates an example of making a fine lens-structure by the fabrication apparatus.

Smooth surfaces created by the present invention enable the making of fine optical lenses. An example shown in FIG. 77 relates to an optical lens structure 123 of a size compatible with the wavelength of the order of white light. When the incident light strikes the lens structure 123, those wavelength components in the incident light larger than the lens structure 123 are scattered. For example, if the diameter of the lens structure 123 is 500 nm, longer wavelength components, mostly red components are scattered ($\lambda 2$), and the shorter wavelength components, mostly blue, are focused ($\lambda 1$) by the lens structure 123 as illustrated in FIG. 77. The product therefore can function as a wavelength selector, an optical filter or a laser diffraction element.

Figure 78:
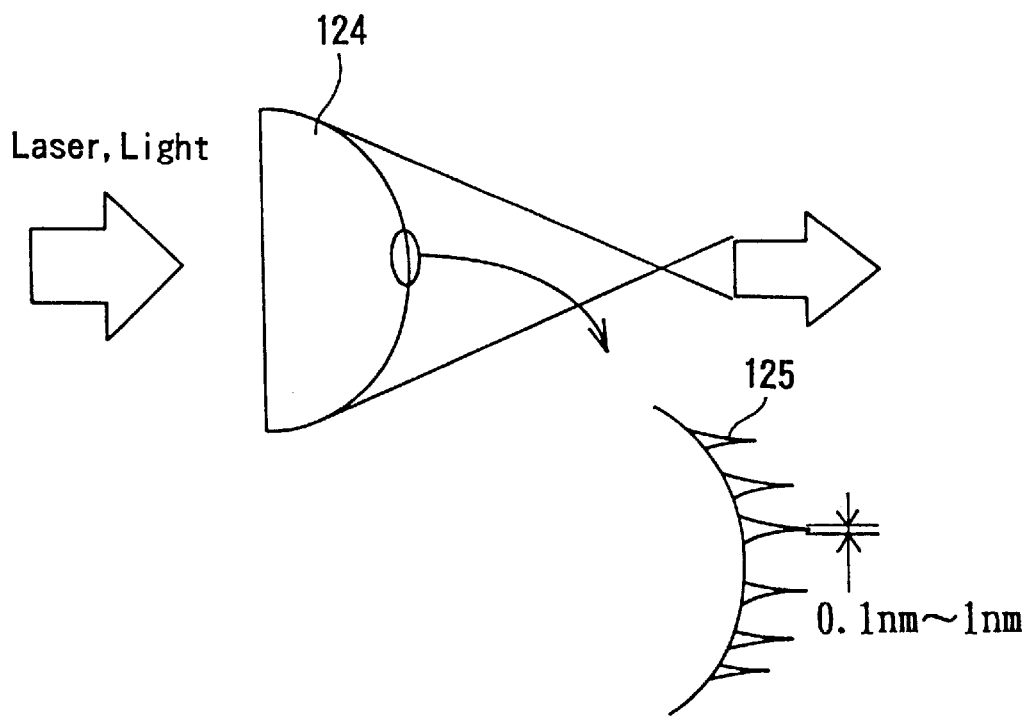
FIG. 78 illustrates another example of making a fine lens-structure.

FIG. 78 illustrates a method of making an optical lens structure 124 having needle protrusions 125 for quantum effect generation. The lens structure 124 is constructed such that the wavelength of the incident light L is in resonance with the wavelength of the light generated by the quantum effect at the tip of the needle protrusions 125. When the incident light reaches the surface of the needle protrusions 125 of the optical lens structure 124, induced emission is generated thereby causing amplification of the focused light.

Figure 79:
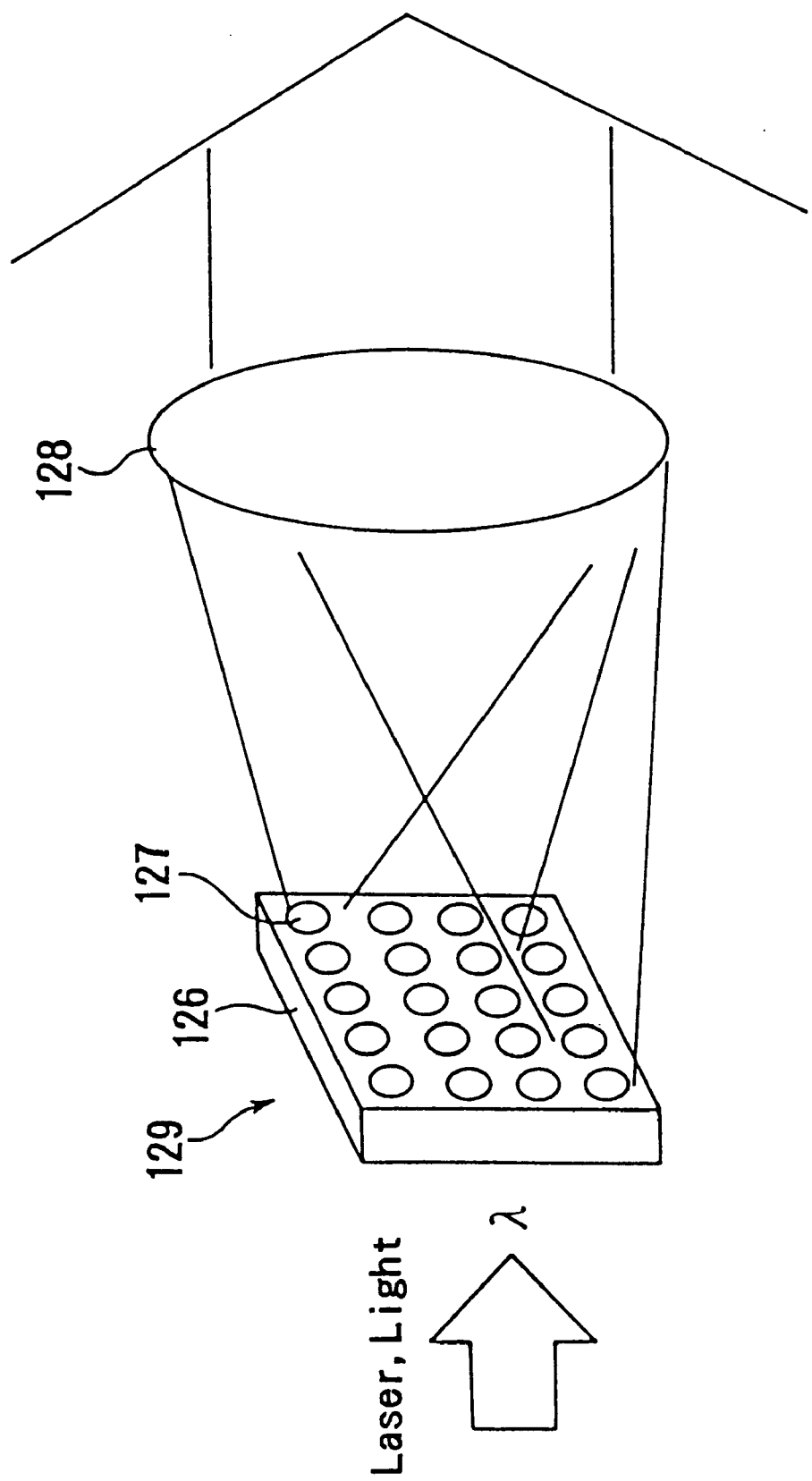
FIG. 79 illustrates still another example of making a fine lens-structure by the fabrication apparatus.

FIG. 79 shows an example of another optical product. The optical structure acts as an optical homogenizer 129 comprising a plurality of fine-lens structures 127 fabricated on a flat plate 126 to disperse an incident laser beam uniformly, and the dispersed beams are again collimated by a lens 128. The fabrication method formation of many more fine-lens structures 127 than the number possible by conventional methods, and the uniformity of the output laser beam is increased significantly.

Figure 80:
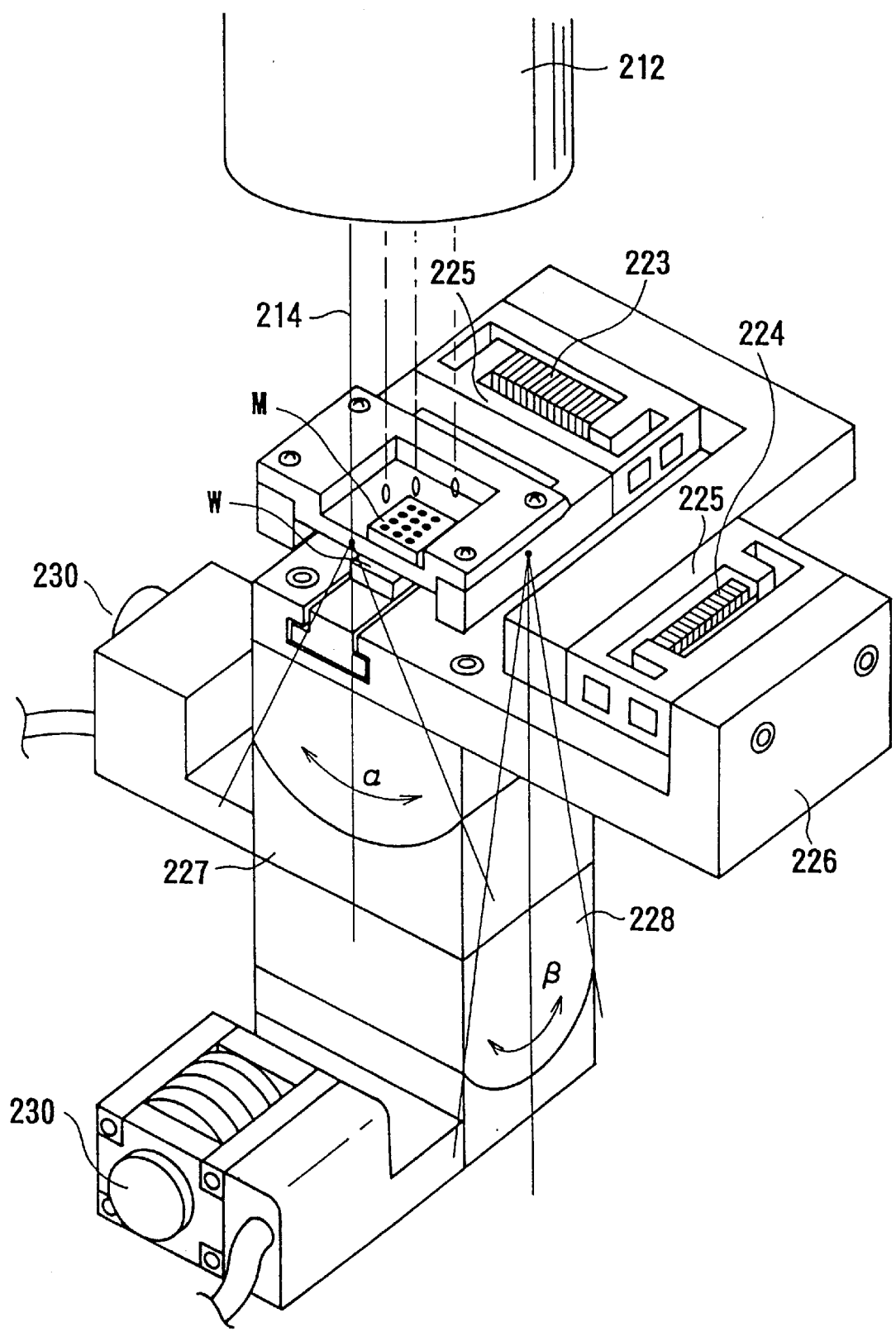
FIG. 80 illustrates an example of a micro-fabrication apparatus to perform the fabrication apparatus.

The following is a method of copying a large number of patterns. FIG. 80 shows a typical arrangement of an apparatus utilizing a piezo-electric element for control of a parallel movement of the mask member M with respect to the workpiece W, and parallel-plate or elastic hinges for guiding the direction of mask member movement. The apparatus has a vacuum chamber (not shown) which houses an energy beam source 212, a specimen stage 226 for placing a mask member M and a workpiece W, and goniometer stages 227, 228 for placing the specimen stage 226. The beam source 212 represents any energy beam 214, such as fast atomic beam (FAB), ion beam, electron beam, laser beam, radiation beam, X-ray beam or radical particle beam. The mask member M has an opening which permits the beam to be radiated onto the workpiece W. The workpiece W is subjected to fabrication by etching or chemical vapor deposition through the effect of beam irradiation.

The mask member M is controlled by piezo-electric elements. One piezo-electric element controls the movement in one direction only, and this is made possible by the use of a parallel-plates hinged device 225 which confines the movement of the mask member M in the direction of the extension/contraction movement of the piezo-electric element. The movement of the piezo-electric element is transmitted to a mask holder which holds the mask member M. Two parallel-plate hinged devices 223, 224 are disposed orthogonally in a horizontal plane to provide the horizontal parallel movement of the mask member M. When the hinged devices 223, 224 are driven by a time-motion patter of a sine or cosine wave imposed on the piezo-electric element, it is possible to move the mask member M in a circular shape of a radius of about 10 nm, for example, thereby permitting fabrication in the order of nm precision required for making quantum effect devices.

The movement guide for the mask member M may also be provided by the use of magnetostrictive or thermal stress devices. It may also be accomplished by providing an elastic cantilever attached to the unidirectional hinged device, or a sliding guide having a pre-stressed member. Such micromanipulator devices can also be used to move the beam source while the mask member is made stationary.

The specimen stage 226 is mounted on goniometer stages 227, 228 which are driven by a motor 230 to rotate the specimen stage 226 around the $\alpha$-axis and $\beta$-axis so that the mask member M and the workpiece W can be oriented suitably with respect to the beam axis. The alignment of the mask member M and the workpiece W is performed with the use of a microscope which can be any of an optical, electron, scanning secondary electron or laser microscope. Rough alignment may be performed using stage moving devices such as used in semiconductor manufacturing processes. The movement traces of the micro-manipulator for the mask member M is computed by an ancillary simulation device, and the mask member M is moved in the X-, Y-directions by the micro-manipulator in accordance with the computed results. When the required shape of the fine-structure to be fabricated on the workpiece W is input into a support device, operating parameters, such as the shape of the opening in the mask member M, traces of the movement of the mask member M and the necessary degree of exposure, are determined by the support device from the simulation based on the operating parameters.

Etching can be performed by selecting an etching agent suitable with respect to the material to be processed. For example, if the workpiece W is quartz, FAB of $SiF_6$ may be utilized. FABS can readily be made to produce a highly linear large diameter beam, because of the lack of electrical charges, and are particularly suitable for fabrication of insulating materials. Energy beams can be chosen from any of suitable energy beams, such as FAB, ion beams, electron beam, laser beams, radiation beams, X-ray beams or radical particle beams. The workpiece may be any of metal, semiconductor or insulator materials. Semiconductor materials include silicon, $SiO_2$ and quantum effect materials include GaAs, AlGaAs, InGaAs. Structural materials include Al, stainless steels, and super hard materials include tungsten, titanium, tungsten carbide, boron nitride, silicon nitride. Optical materials include plastics, polyimide, glass, quartz, optical glasses, ruby, sapphire, magnesium fluoride, zinc selenide and zinc telluride.

Figure 81:
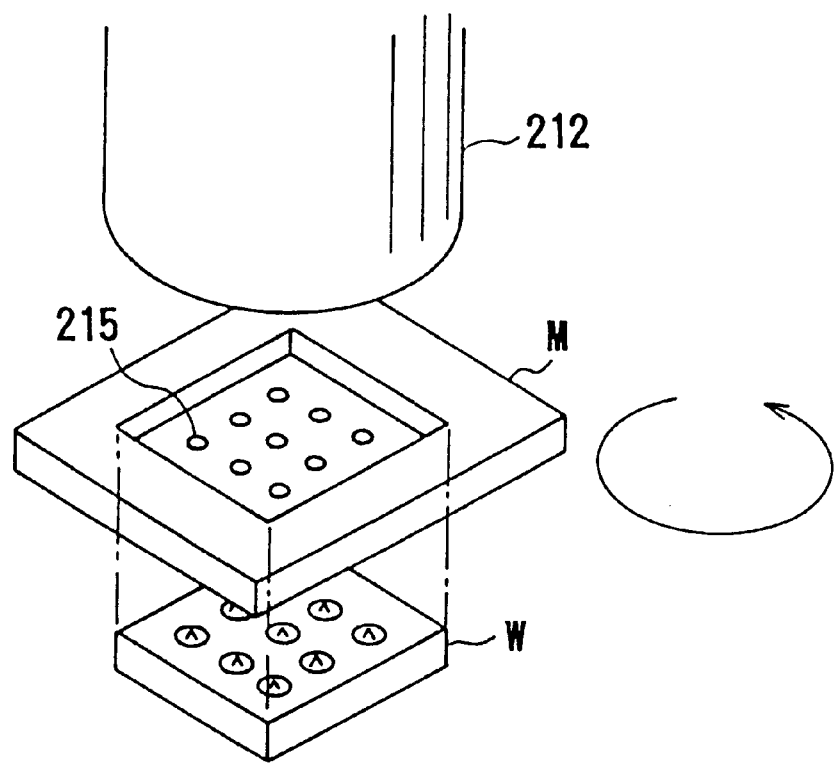
FIG. 81 is an illustration of the fabrication apparatus of the present invention.

FIG. 81 shows a method of making a plurality of needle-protrusion structures of the order of nm by etching a workpiece W of metallic or glass plate. The beam is an FAB of high linearity having a uniform energy density emitted from a beam source 212. The workpiece W is stationary and is disposed coaxially with the center of the circular spot beam. Between the beam source 212 and the workpiece W is a mask member M having a plurality of beam energy transmission holes 215 for controlling the exposure of the workpiece W to the beam. The beam energy transmission holes 215 are rotated in parallel with the workpiece W to control the degree of exposure to the beam received by the fabrication surface. In this example, the mask member M is made of Ni foil of 10 $\mu$m thickness, and the holes 215 are disposed in a lattice pattern with a spacing of 25 $\mu$m. The mask member M is rotated as illustrated in FIG. 81 in a plane parallel to the fabrication surface so that the holes 215 distribute the beam energy in such a way as to produce the needle-protrusion structures. The radius of the parallel circular motion is 6 $\mu$m in this example.

Figure 82A:
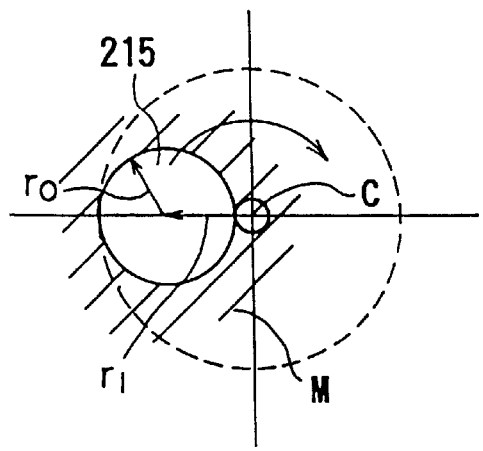
FIGS. 82A–82C are illustrations relating to the movement of the mask member and the fine-structure produced by a parallel circular motion of the mask member.
Figure 82B:
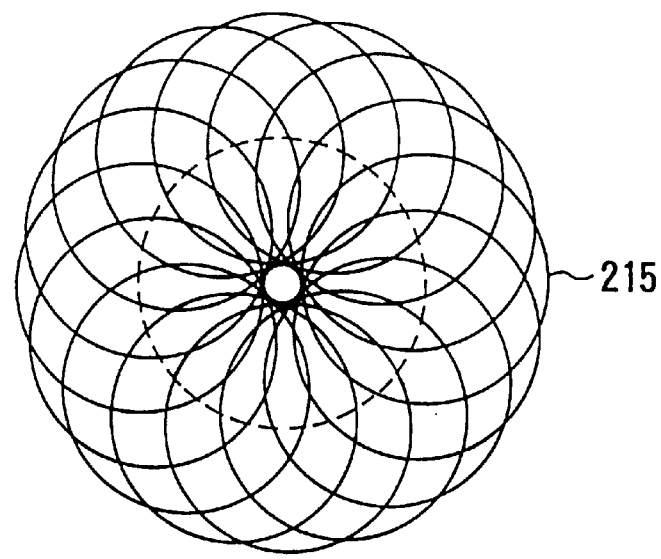
Figure 82C:
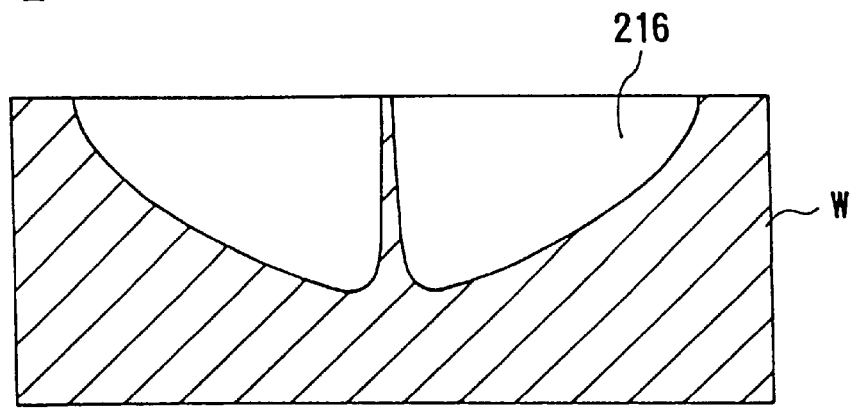

The process of forming the needle-protrusion structures will be explained in more detail in the following. FIG. 82A shows the relative radius $r_0$ of a hole 215 with respect to a larger radius $r_1$ of the circular motion of the mask member M about a center C. The arrangement causes an uneven distribution of radiation energy per unit time on the fabrication surface. FIG. 82B shows the traces of the circular motion of the holes 215. As illustrated, the exposure is the highest in the vicinity of the center C, and diminishes gradually towards the outer radial direction. At the center C, there is no exposure to the beam. Since the depth of fabrication into the workpiece W is proportional to the degree of exposure, therefore, the workpiece W assumes a shape illustrated in FIG. 82C, which is produced from one transmission hole 215, such that a narrow thin needle-shaped protrusion structure is produced in the center of a crater structure 216. The mask member M has a plurality of transmission holes 215, and the resulting structure on the workpiece is a plurality of craters having a needle-protrusion structure in the center region of each crater 216.

Figure 83A:
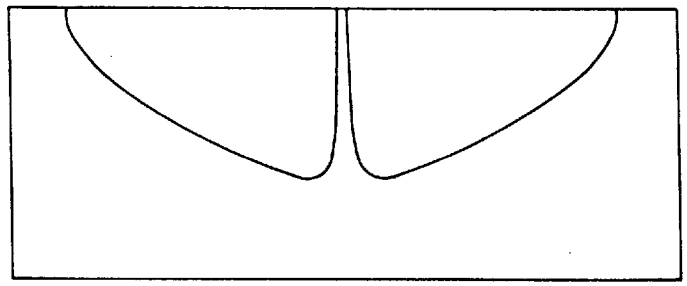
FIGS. 83A–83D are illustrations relating to steps in producing uniform etching of the fine-structure shown in FIG. 82C.
Figure 83B:
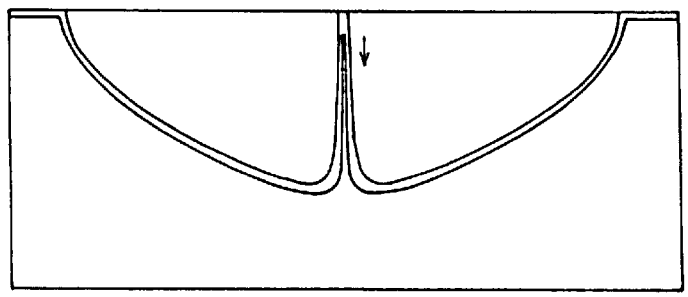
Figure 83C:
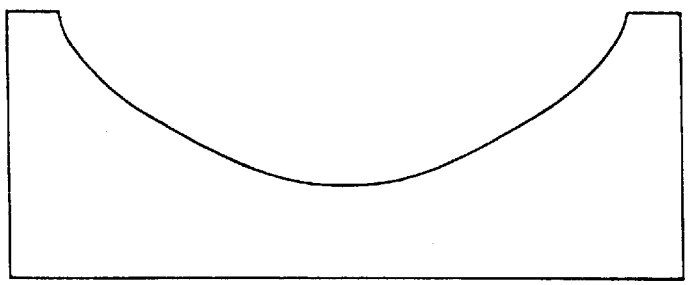
Figure 83D:
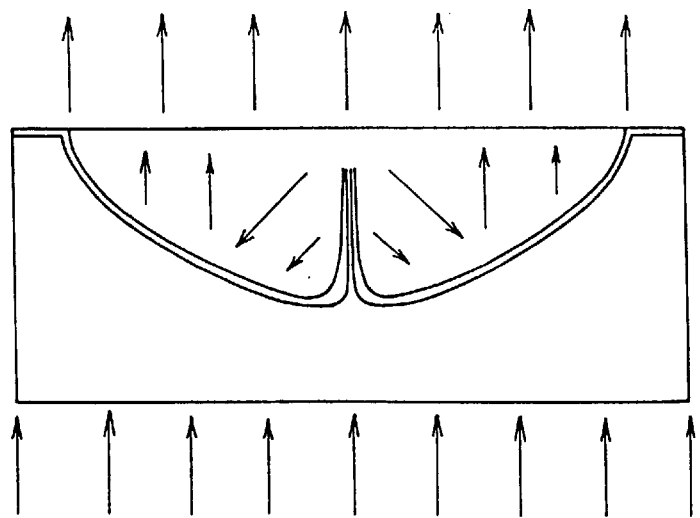

By etching the needle-protrusion structure, the height of the needle may be reduced and the surrounding region can be made into a parabolic mirror surface by a series of operations shown in FIGS. 83A–83C. The crater 216 having a needle-protrusion shown in FIG. 83A is etched to reduce the height of the needle as shown in FIG. 83B, the final height depending on the duration of etching. The curvature of the crater may be made to resemble a parabolic curve shown in FIG. 83C, and etching is carried out to shape the crater mirror so that the needle-protrusion structure corresponds to the focal point of the parabolic curve. The resulting mirror structure shown in FIG. 83D has the needle protrusion located at the focal point of the parabolic mirror. When a light source is placed behind the mirror, the needle-protrusion acts as a waveguide, and the light is scattered in all directions from the tip of the needle-protrusion, and the scattered light is reflected from the parabolic mirror surface to be directed as a parallel beam of light. The fine-structure produced functions as an optical waveguide which converts directionally randomly light from a planar light source, for example an electroluminescent (EL) source, to a directional beam of light.

Figure 84:
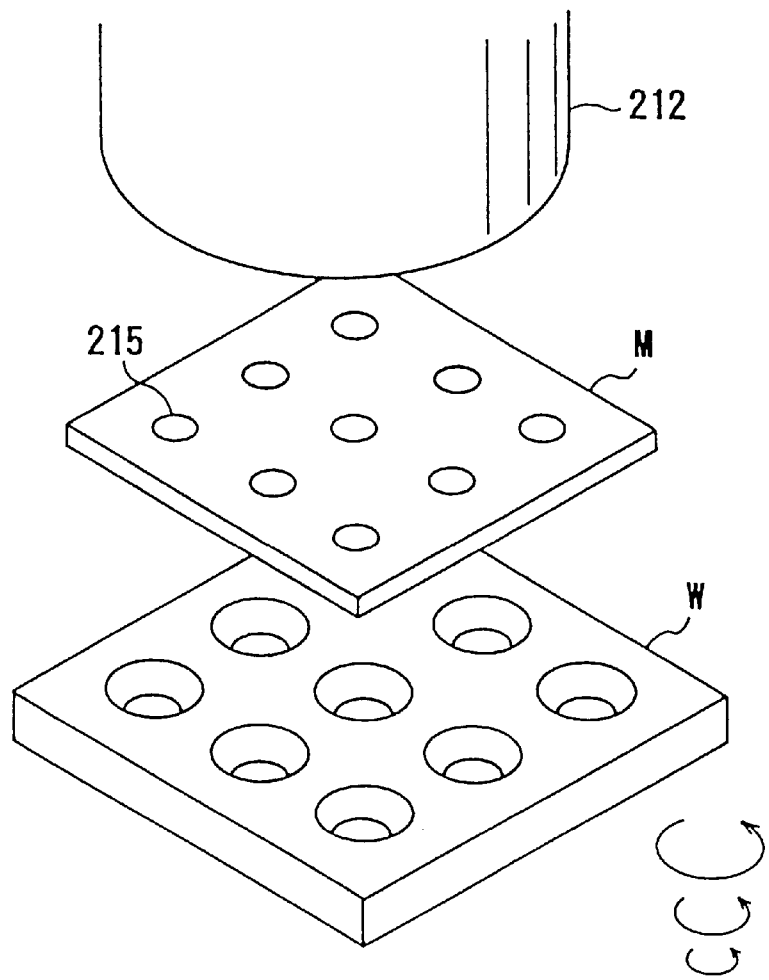
FIG. 84 is an illustration of another example of the fabrication apparatus of the present invention.
Figure 85:
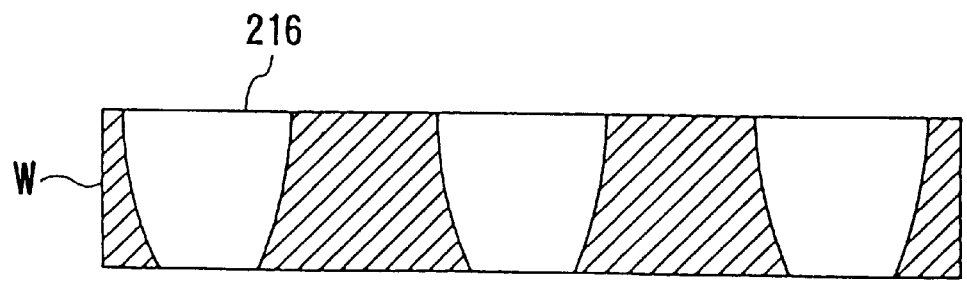
FIG. 85 is a cross sectional view of the fine-structure produced by the apparatus shown in FIG. 84.

Further, in the above example, the radius of the circular trace of the parallel movement of the mask member M was kept constant, however, the radius of the circular motion may be varied as the fabrication proceeds. An arrangement shown in FIG. 84 relates to such a case. If the mask member M and the workpiece W are fixed coaxially on the beam axis and are made stationary, the fine-structure formed on the workpiece W will be a series of holes having vertical side walls of the same shape as holes 215 on the mask member M. If the mask member M and the workpiece W are subjected to parallel circular motions of one common radius about an offset rotation axis, the fine-structure formed in the workpiece W will be holes of a radius given by the envelope traces of the outer peripheries of the holes of the mask member M. Circular holes 215 in the mask member M will produce circular holes having a larger radius than that of the holes 215. For example, if the diameter of the holes 215 is 10 $\mu$m, stationary mask member M will generate holes of 10 $\mu$m diameter in the workpiece W. If the mask member M is offset 6 $\mu$m from the beam center C and rotated at a constant speed, holes of 22 $\mu$m diameter are produced on the workpiece W. Therefore, by gradually reducing the radius of rotation of the mask member M from an initial value to smaller values with progress of etching, holes 216 having parabolic curved walls, illustrated in FIG. 85, will be formed in the workpiece W.

Figure 86:
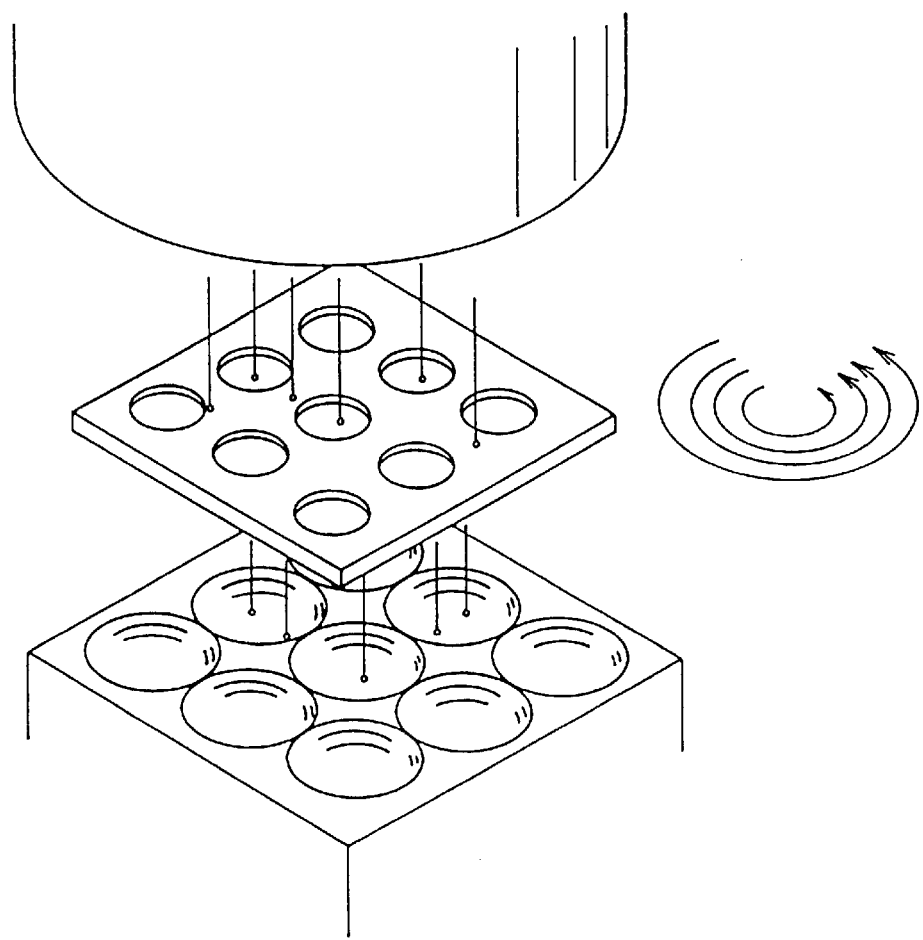
FIG. 86 is an illustration of still another example of the fabrication apparatus of the present invention.
Figure 87A:
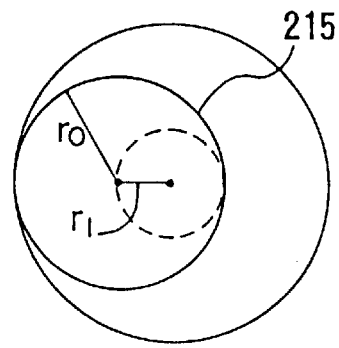
FIGS. 87A–87B are illustrations of the movement of a beam transmission hole and the fine-structure thus produced.
Figure 87B:
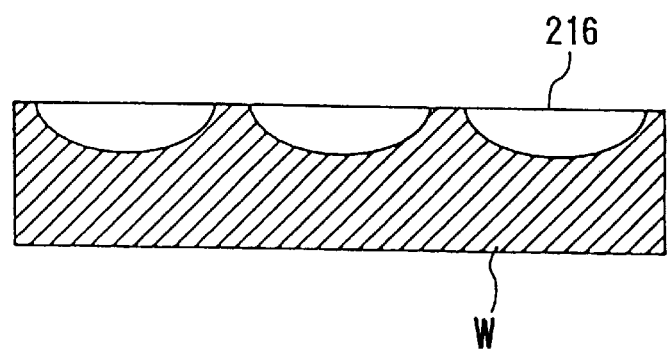

FIG. 86 shows a method of making concave lenses on a workpiece. As shown in FIG. 87A, the offset radius of motion $r_1$ of the transmission hole 215 in the mask member M is smaller than the radius $r_0$ of the transmission holes 215. The magnitude of offset is relatively small so that the centers of rotations are closely spaced. The rotation radius is diminished gradually as the etching process proceeds, and the fine-structures produced in the workpiece W, are a series of concave lenses as illustrated in FIG. 87B.

The product thus formed functions as a multi-reflective lens array. By selecting the radius of the transmission holes 215 in the mask member M to be on the order of nm, reflector lenses having the same order of diameter size can be made. The mask member M having transmission holes of the order of nm can be made by the usual planar photolithographic process or by the focusing ion beam method. By making the lens dimension to be smaller than the wavelength of the input light, a scattering effect will be generated, and the lenses may be utilized as a wavelength selection device. In this case, the wavelength selectivity depends on the size of semi-spherical convex lenses so that an array of convex lenses having a common diameter will scatter all light of wavelengths larger than the diameter of the lenses. For example, a convex micro-lens array of 500 nm diameter convex lenses transmits only light comprising wavelengths shorter than blue light.

FIG. 88 shows a method of making another optical fine-structure. In this case, the diameter of circular rotation motion of the mask member M is made much larger than the radius of the transmission holes 215. For example, the diameter of the holes 215 is 5 $\mu$m while the maximum radius of the circular motion is 50 $\mu$m. The result is a ring-shaped fine-structure consisting of a series of concentric circles. When the motion radius is changed gradually and continually during the fabrication process, the depth of etching can be changed continually depending on the degree of exposure to the beam. At a given radius of rotation, the depth of etching means constant. As shown in FIG. 88, a sparse series of transmission holes 215 are provided in the mask member M. At a given motion radius of the mask member M, series of rings are fabricated in the workpiece W in the way described above. By changing the rate of change of the motion radius from one radius to another in the process of continual change of the motion radius as shown in FIG. 89, a profile 216 such as the one shown in FIG. 90 may be generated on the fabrication surface. The fine-structure thus produced can function as a Fresnel lens, which acts as a beam concentrator. Using the mask member M having regularly distributed transmission holes 215 as shown in FIG. 88, it is possible to fabricate a multi-Fresnel lens array structure on the workpiece W.

FIG. 91 shows a method of making a multi-convex lens array structure. In this case, in addition to rotatable mask members Mb, Mc, a stationary mask member Ma is coaxially fixed on the beam axis. The energy beams passing through the transmission holes 215 provided in the rotating mask members Mb, Mc, must also pass through the transmission holes 215A provided in the stationary mask member Ma. Therefore, by rotating the mask members Mb, Mc as described in the previous case, the outer diameter of the fabricated lens becomes the same as the diameter of the transmission holes 215A of the stationary mask member Ma. In this case the edges of the lens are sharply defined.

Figure 93:
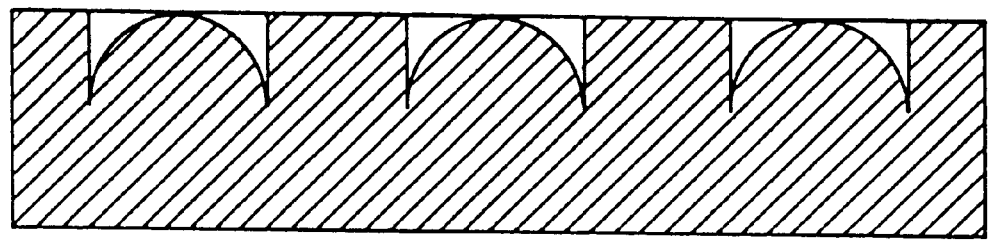
FIG. 93 is a cross sectional view of the fine-structure made using the mask member shown in FIGS. 92A–92B.

An example of the multi-convex lens array made by such method is shown in FIG. 93. The energy beam 212 is a laser beam. The mask members are a stationary member Ma and two rotating members Mb, Mc made of Cr-vapor deposited quartz plates. The stationary mask member Ma is provided with transmission holes of 10 $\mu$m diameter distributed in a lattice pattern with a spacing of 20 $\mu$m. The rotating mask members Mb, Mc are provided with Cr-coated mask patches of 10 $\mu$m diameter distributed in a lattice pattern of a 20 $\mu$m spacing, as shown in FIG. 92A. This means that the movable mask members Mb, Mc permit the laser beam to transmit only through those areas not having the Cr-mask patches. The rotation motion of the mask member Mb is illustrated in FIG. 92B. The stationary holes 215A and the rotation mask patches 215B, 215C are separated by a 180 degree phase shift during the horizontal rotation motion of the movable mask members Mb, Mc. Therefore, the mask pattern formed by the patches 215B, 215C undergo rotation as illustrated in a series of drawings in FIG. 92B, and exposed region Y successively changes position about the beam axis. The product fabricated is a convex lens array shown in FIG. 93.

Figure 94A:
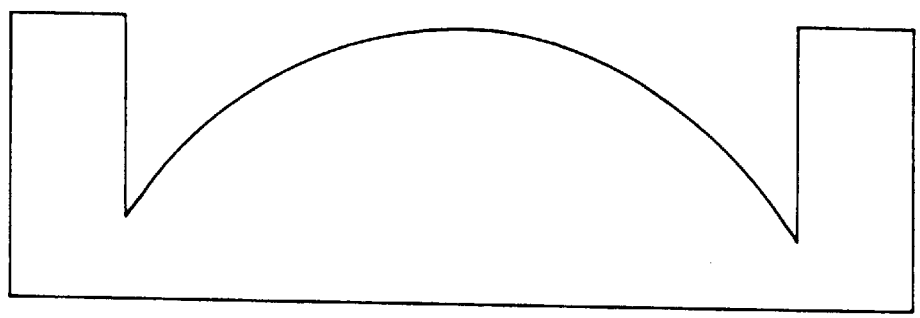
FIGS. 94A–94E show various processing steps related to forming a fine optical-structure.
Figure 94B:
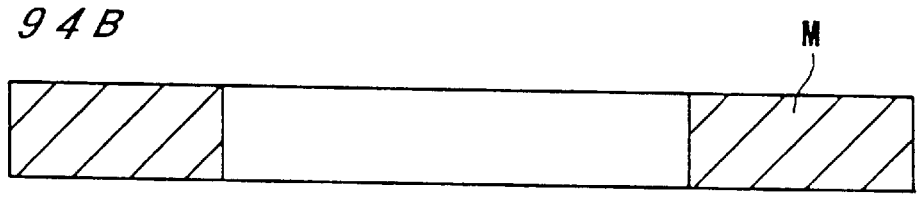
Figure 94C:
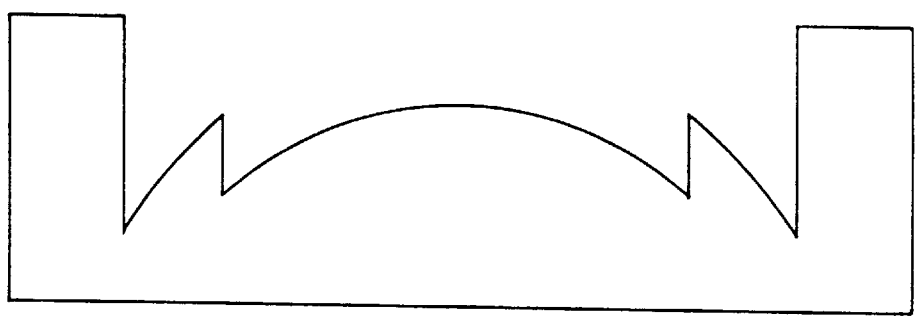
Figure 94D:
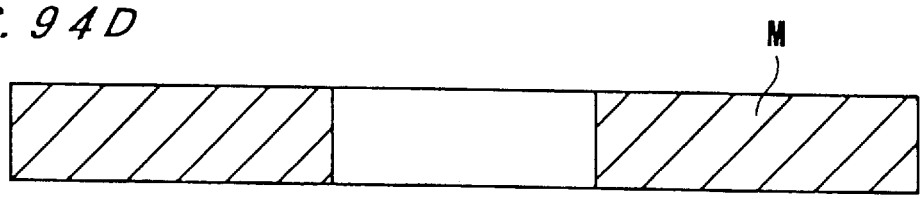
Figure 94E:
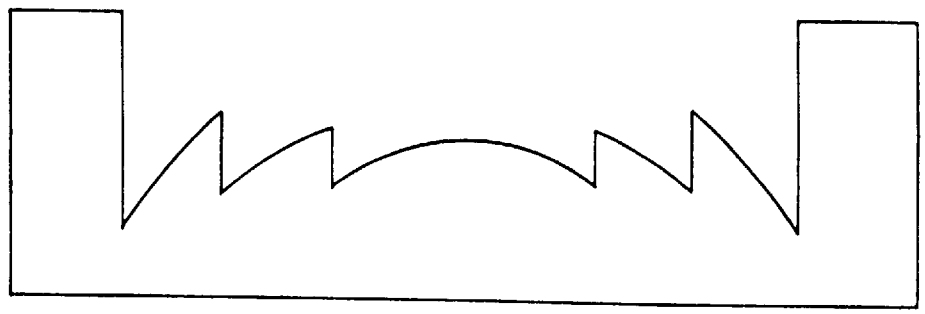

FIGS. 94A–94E show a method of making another optical array structure. In this case, the shape of the mask member M is changed during the fabrication process. The steps will be described in more detail in the following. When the step of producing the convex lens is completed as in FIG. 94A, the shape of the mask member M is changed to the one shown in FIG. 94B having a circular opening of a diameter smaller than the diameter of the transmission hole used to form the lens shown in FIG. 94A. The exposure with the mask member M produces another convex lens of a smaller diameter than before as shown in FIG. 94C. The same steps using still smaller diameters, such as shown in FIG. 94D, may be repeated a number of times to generate a fine-structure shown in FIG. 92E. The product thus fabricated is a Fresnel lens array of excellent light concentrating characteristics.

Figure 97:
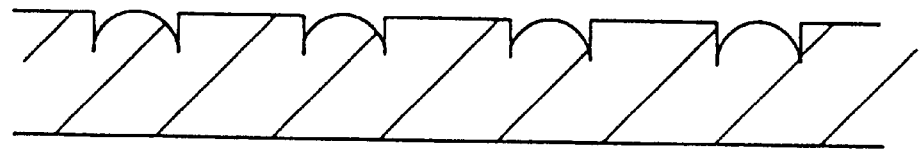
FIG. 97 is a cross sectional view of the fine-structure made using the mask member shown in FIG. 96.

FIG. 95 shows a method of making still another optical fine-structure. In this case, the stationary mask member Ma and the movement of the rotation mask members Mb, Mc are the same as before. The energy beam source 212 in this case generates an FAB, and the transmission holes are covered with gold foil mask members. The stationary mask member Ma is provided with transmission holes 215A. The rotation mask members Mb, Mc are provided with an array of mask patches made of iron in a pattern shown in FIG. 96. The motion patterns of the exposed region Y generated by the movable mask members Mb, Mc are the same as those illustrated in FIG. 92B. The product fabricated is an array of convex lenses shown in FIG. 97. The flat portion of the array is produced as follows. After the exposed region Y has moved through half a circle, the mask members Mb, Mc are moved for a distance A equal to the length A of the array so that the exposed region Y formed by the lower iron array and the transmission hole 215A is also moved a half circle. This motion is illustrated in FIG. 95 by the arrows. The overall motion is a combination of the rotation motion and the translation motion while the workpiece W is exposed to the FAB. The motion pattern is complex, but the dimensional precision of the fabricated structure is high.

Figure 98:
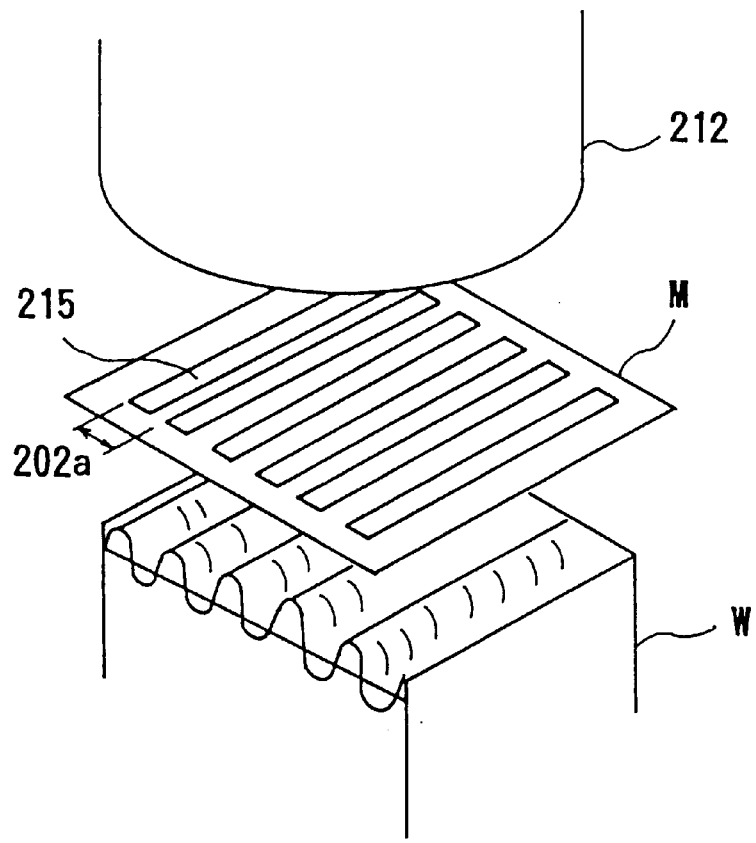
FIG. 98 is an illustration of still another example of the fabrication apparatus of the present invention.
Figure 99A:
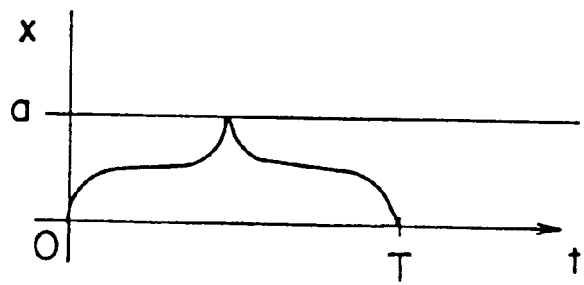
FIGS. 99A–99B show movement of the mask member and a cross sectional view of the fine-structure made.
Figure 99B:
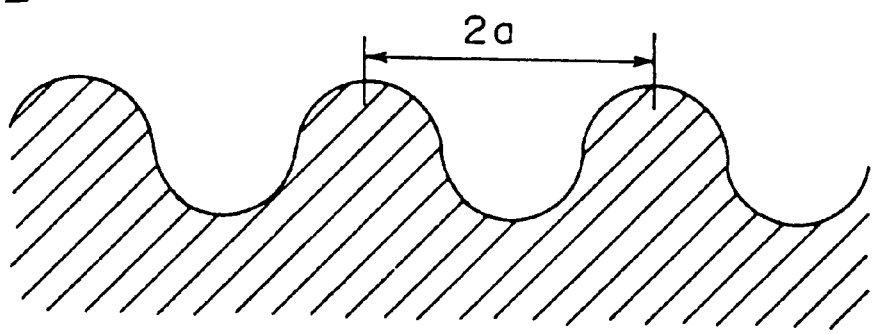

FIG. 98 shows a method of making another fine-structure useful for optical applications by moving the mask member M linearly in parallel motions. The mask member M is provided with a plurality of transmission slits 215 of a given parallel spacing. In this case, slits measuring 10×100 nm are spaced 10 nm apart. The energy beam emitted from the energy beam source 212 passes through the slits 215 to expose the fabrication surface of a workpiece W. The mask member M is moved periodically in a step distance of 10 nm, for example. The relationship of the distance of movement x and time t is shown in FIG. 99A. When the exposure to the beam source is controlled so as to produce 10 nm etching depth in a given time interval, a product having a profile and crest pitch 2a shown in FIG. 99B is produced.

When the material is transparent to the light being radiated, the fine-structure functions as an optical sine-wave diffraction element. Such a device can be used in front of a charge-coupled-device (CCD) screen of a CCD video camera to act as a lowpass filter for filtering parasitic signals due to images formed by frequency spatial signals.

Using the same linear moving mask members driven by the sine waves shown in FIG. 100, a periodic fine-structure having a needle tip shown in FIG. 101 is produced. The spacing of 10 nm in the periodic fine-structure thus produced is smaller than the electron waves, the electrons are confined to the first step of the periodic structure and cannot move to another step. This phenomenon can be utilized to produce another quantum effect device.

Figure 103:
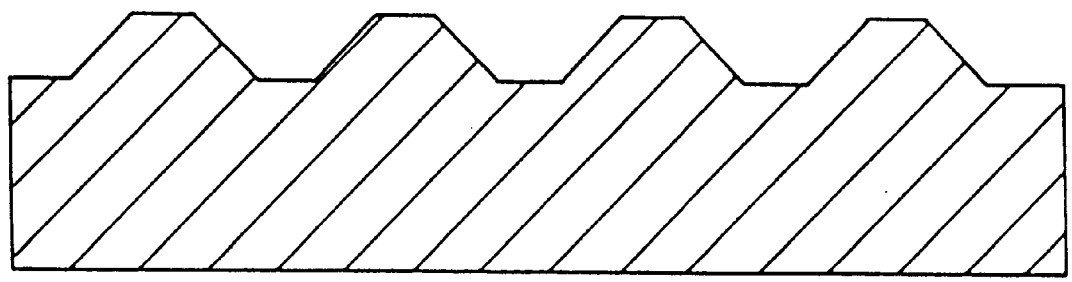
FIG. 103 is a cross sectional view of the fine-structure made by the apparatus shown in FIG. 102.

When the same slit mask member M is used in combination with a parallel motion having a drive pattern shown n FIG. 102, a trapezoidal fine-structure having periodic flat tops as shown in FIG. 103 is produced. When the spacing between the flat tops is of the order of incident light, a diffraction grating effect is generated such that higher order diffraction waves of an incident laser beam are blocked. Such a device, placed in front of a laser beam reception device in a CD player, may function as a filter for higher order diffraction waves.

Figure 104:
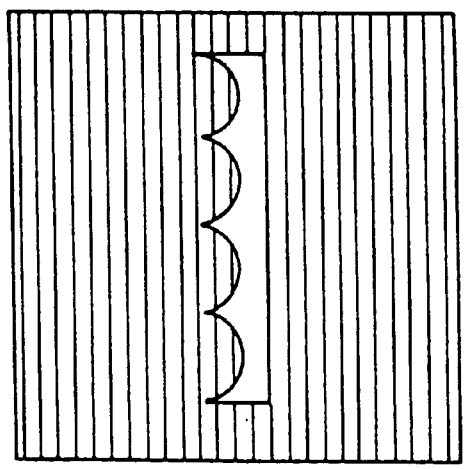
FIG. 104 is an example of a mask member having a special shaped beam transmission cavity.

FIGS. 104 to 106 relate to other fabrication examples using a motion pattern combining parallel linear movements with variable rate of motion. The mask member m is provided with a beam transmission cavity shown in FIG. 104. The mask member M is moved in a horizontal plane at right angles to the beam axis. If the mask member M is moved at a constant speed continually during the exposure, a semi-cylindrical fine-structure shown in FIG. 105 is produced. If the mask member M is moved with time in a periodic sine wave manner, i.e., the speed of the linear motion is gradually increased, decreased and stopped, then this variable rate of motion is repeated in the opposite direction. Under this type of movement pattern, the degree of exposure to the beam energy per unit time received by the workpiece W will vary in a spatial sine wave distribution, and the fine-structure produced is a convex rod lens structure atop a rectangular base, as shown in FIG. 106. When the fine-structure shown in FIG. 105 is made of a transparent material, it can function as multi-cylindrical lens. Such an optical device can transmit an incident beam falling on the rear surface of the structure as lines of focused beams, thus functioning as a lenticular lens, and can be used in place of a revolving mirror used in rapid frame photography.

The fine-structure shown in FIG. 113 is made from the semi-cylindrical fine-structure shown in FIG. 105 by turning the mask member M 90 degrees about the beam axis, and moving linearly at a constant speed parallel to the workpiece W. The product is an array of semi-spherical lenses of the order of nm. An incident beam falling on the back surface of the array is uniformly dispersed and is then focused by the lens, and therefore the array functions as an optical homogenizer. The beam intensity output from this structure is significantly more uniform compared with the conventional optical homogenizers, because of the significantly higher density of fabricated lenses.

Figure 107:
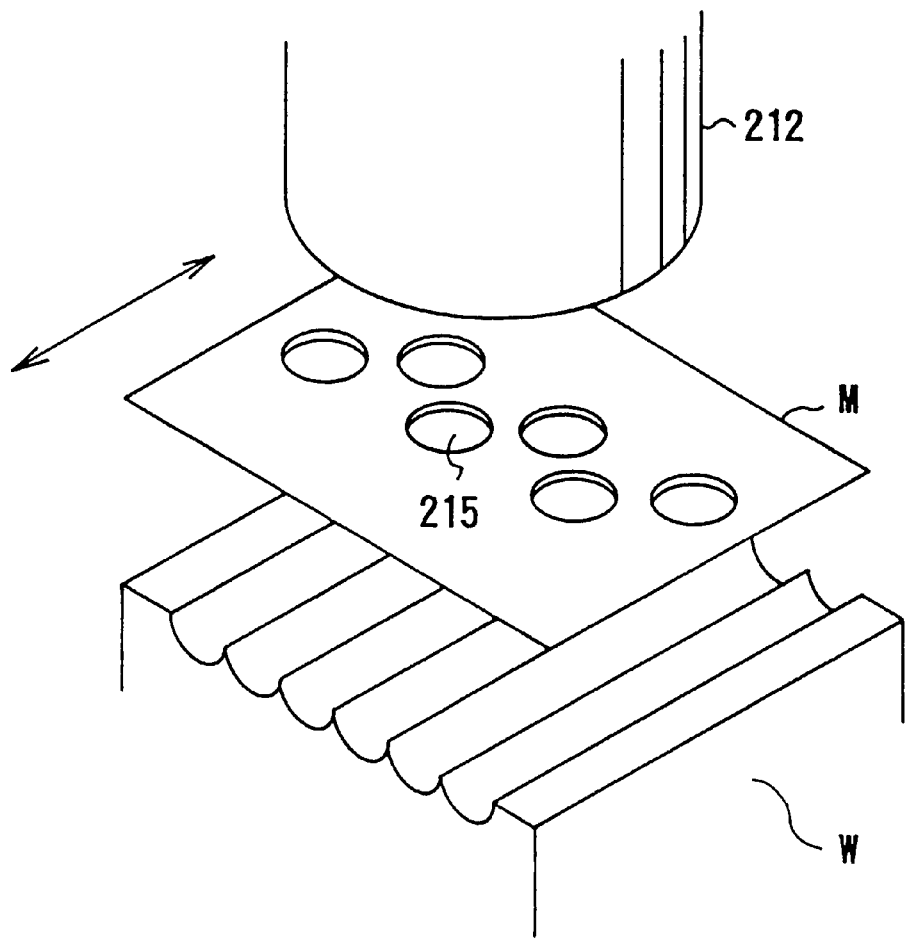
FIG. 107 is an illustration of still another example of the fabrication apparatus of the present invention.
Figure 108:
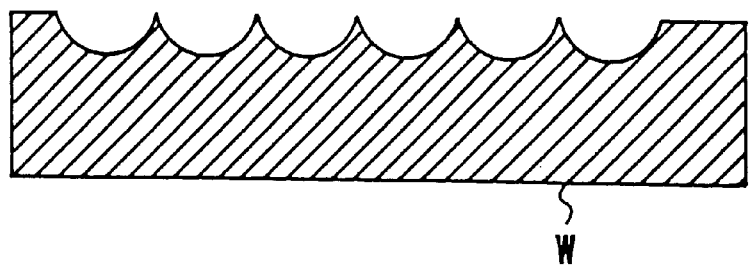
FIG. 108 is a cross sectional view of the fine-structure made by the apparatus shown in FIG. 107.

FIG. 107 shows a method of making a concave channel structure shown in FIG. 108. The mask member M in this case is provided with circular transmission holes 215 in a checkered pattern, and is moved linearly at a constant speed. This type of fine-structure can also be produced by a mask member M having linearly arranged circular holes 215, but the checkered pattern is much more suitable for producing an array of convex lens channels, particularly when the separation distance of the channels is of the order of nm compared with arranging the circular holes 215 in a straight line to produce the same fine-structure.

Figure 111:
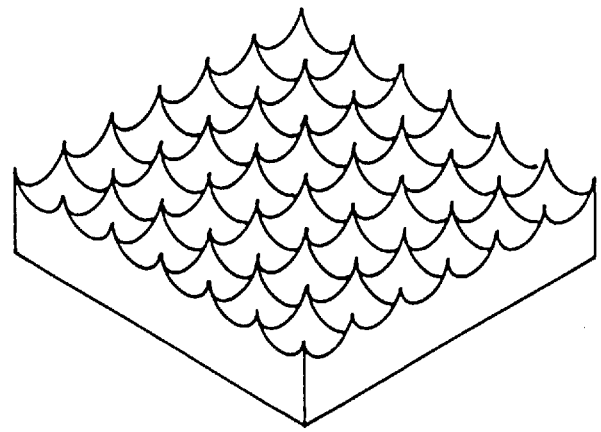
FIG. 111 is a perspective view of the fine-structure produced by the apparatus shown in FIG. 110.

FIG. 109 shows an example in which checkered holes are arranged in a lattice matrix to produce an array of densely packed convex lenses shown in FIG. 111. The mask member M in this case is moved at a constant speed in a square trace as shown in FIG. 110 such that the movement plane is parallel to the workpiece.

Figure 112:
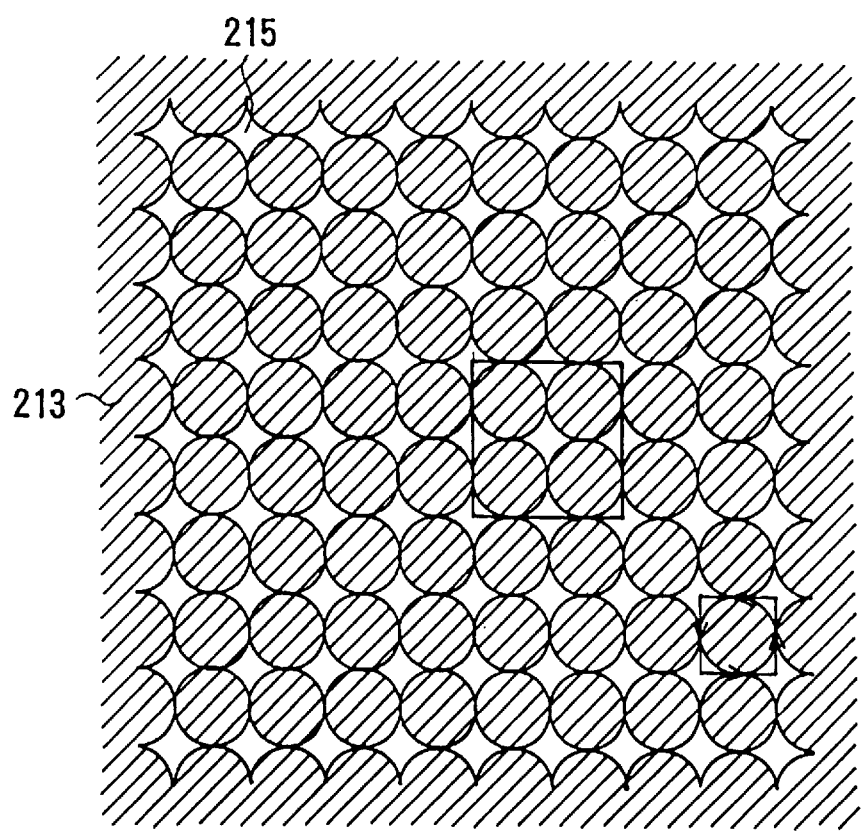
FIG. 112 is an example of a mask member having lattice structured beam blocking patches.

FIG. 112 is another mask member M for making an array of densely packed convex lenses, however, in this case, the circular regions are not transmission holes but masking regions. Between the masking regions are transmission cavities 215 of diamond shape densely distributed across the mask member. The mask member M is moved in a square pattern as in the previous case to produce the micro-convex semi-spherical lens array shown in FIG. 113. When the spacing of the convex lens is made to be on the order of the wavelength of light, the array can function as an optical homogenizer to convert an incident laser beam having a Gaussian intensity distribution to an output laser beam having a uniform intensity distribution.

FIG. 114 shows an arrangement of an energy beam source 212, a mask member M which is fixed and spaced apart at some distance parallel to a workpiece W mounted on a specimen stage. The mask member M and the workpiece W can be caused to undergo a swing motion by means of goniometer stages with respect to fixed beam source 212. The fine-structure produced by this arrangement is shown in FIG. 115 which is an array of micro-concave lenses. The swing motion is about an α-axis at the start, and the swing axis is gradually rotated about the beam axis as the fabrication process is continued. Such motions of the goniometer stages are readily provided by computer control of the goniometer drives.

FIG. 116 shows another arrangement of the basic components for the fabrication process. The goniometer stages are to swing with a synchronous cycle about the α- and β-axes, and the time-motion pattern is sine and cosine waves, respectively. The surface of the specimen stage is inclined at an angle and rotates about the beam axis. The mask member M is rotated about the center of the mask member shown in FIG. 112 and is moved in the direction of the arrow shown in FIG. 116, and the result is a fine-structure having intersecting protrusions produced by cavities as shown in FIG. 117. The cavities may be filled with electrodes to produce a multi-field emitter array.

FIG. 118 shows still another arrangement of the basic components of the fabrication process. The goniometer stages are inclined with respect to the beam axis as in the previous example, and rotated in the white arrow direction. At the same time, the mask member M is moved linearly and parallel to the workpiece W as shown by the solid arrows. The fine-structure produced has open end cavities 216 having curved side walls as shown in FIG. 119. The product can be used as ferule for coupling optical fibers. The ferules have a high dimensional precision, and facilitate insertion of fibers because of their wide openings.

The completed products presented thus far have been fabricated directly using an energy beam on a material. Depending on the nature of the workpiece W, fabrication time and cost may be excessive or the yield may be low. There may be other processing problems, such as the functional shape of the material being difficult to etch, and the complementary configuration can be easily made but the configuration can be easily made but the configuration itself cannot be made directly. An approach of applying a mold process using a mold fabricated by the invention to duplicate the shape will be presented in the following.

Figure 120A:
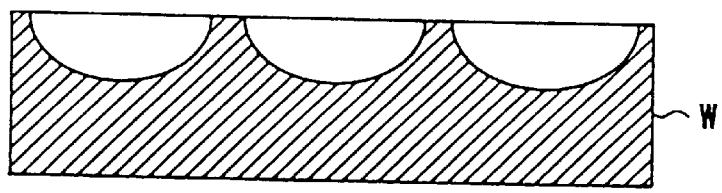
FIGS. 120A–120E illustrate basic processing steps related to forming a mass production of replicas.
Figure 120B:
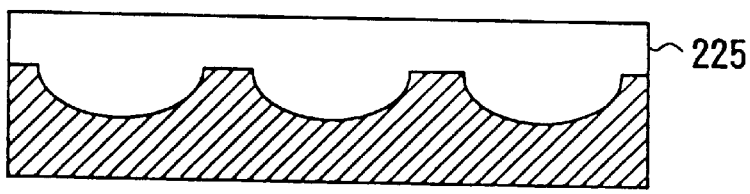
Figure 120C:
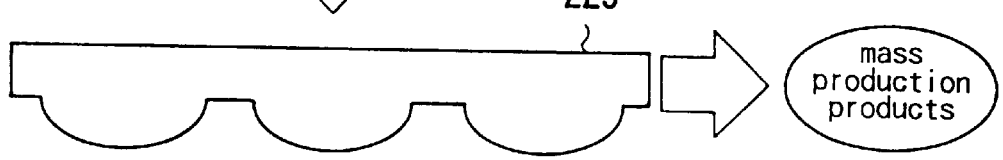
Figure 120D:
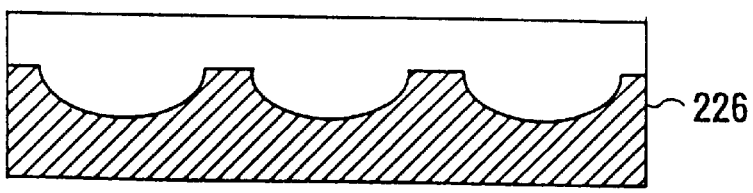
Figure 120E:
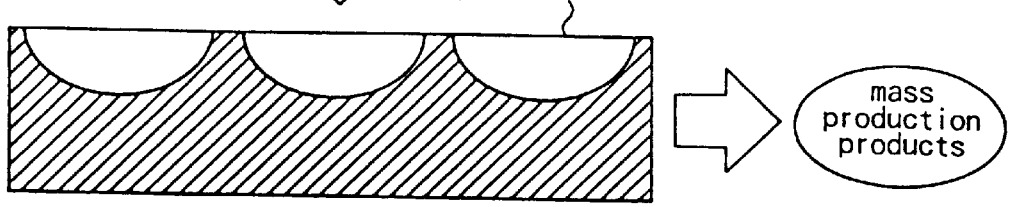

The basic steps are illustrated in FIGS. 120A–120E. In FIG. 120A, a workpiece W is fabricated by energy beam fabrication according to the present invention. In FIG. 120B a complementary replication 225 of the workpiece W is made by means of injection molding or electro-forming. In FIG. 120C, the replication 225 is removed. If this is functional, the final product has been obtained. If a product shown in FIG. 120A is needed, further replication work is carried using the product 225 shown in FIG. 120C to perform injection molding or electro-forming shown in FIG. 120D to produce the final product 226. This approach is useful in mass production of plastic mold products and the like.

An example of electro-forming will be presented next. First, material such as GaAs single crystal is fabricated in an FAB of chloride gas atoms to make an array of micro-convex lenses. Next, the surface of the array is sputtered with gold to make an electrically conductive layer. The sputtered array is immersed in a bath of Ni—Co solution to carry out Ni electro-forming. The deposited film is peeled off to produce an array substrate of GaAs micro-lenses having a Ni-base with a gold layer.

Some of the features of fabrication according to the present invention will be summarized below. Fabrication is applicable to a workpiece having a large disparity between high and low points on the fabrication surface. The mask member can be placed far away from the workpiece in such a case, but the large distance of separation does not affect the fabrication ability of such energy beams as an FAB having high beam linearity. Therefore, a bearing structure having a curved fabrication surface can be processed readily by placing the mask member away from the workpiece to fabricate necessary fine grooved structures directly in the fabrication surface.

A curved surface having such grooved structure can be used as friction reduction means for bearing components.

Fine groove dimensions of the order obtained by such fabrication enable reduction of the spacing between the grooves, thus increasing the groove pitch, and the clearance between the bearing and the shaft can also be reduced to the order of nm. Such fine-structures are useful in optical disc heads to reduce friction while maintaining a tight fit, thus enabling production of high density memory devices. When the fine-groove structure is used in shaft seals, labyrinth seal structures can be produced readily to reduce frictional forces while reducing conductance. When applied to magnetic seal devices, the fine-grooves and tight clearance will reduce leakage of vapor of the magnetic fluid medium.

In the examples presented, the energy beams were selected from fast atomic beams, ion beams, electron beam, laser beams, radiation beams, X-ray beams and radical particle beams. However, the energy beams are not limited to those mentioned above. The workpiece can be chosen from any of the following materials but is not necessarily restricted thereto semiconductor materials such as silicon, silicon dioxide; quantum effect materials such as GaAs, AlGaAs, InGaAs; structural materials such as aluminum, stainless steels, hard and refractory materials such as tungsten, titanium, tungsten carbide, boron nitride, titanium nitride, ceramics; optical materials such as plastics, polyimide, glasses, quartz glass, optical glasses, ruby, sapphire, magnesium fluoride, zinc selenide and zinc telluride and others.

What is claimed is:

1. An apparatus for performing micro-fabrication processing on a workpiece, said apparatus comprising:
    an energy beam source for generating an energy beam along a beam axis;
    a stage for holding a workpiece in a manner to adjust an orientation of the workpiece relative to said beam axis;
    a mask member having a fine-structural pattern;
    a mask holding device for holding said mask member at a position spaced from the workpiece held by said stage;
    a relative positioning device for moving at least one component among said energy beam source, said mask member and the workpiece held by said stage relative to other of said components; and
    a controller for controlling operation of said relative positioning device to ensure that said movement of said at least one component relative to said other components comprises continuous movement to produce a fine structure having a smooth curved or inclined surface on the workpiece.

2. An apparatus as claimed in claim 1, wherein said relative positioning device comprises a driving mechanism for causing said energy beam to undergo swiveling movement about an axis.

3. An apparatus as claimed in claim 1, wherein said relative positioning device includes means for producing said relative movement at right angles to said beam axis.

4. An apparatus as claimed in claim 1, wherein said relative positioning device includes means for producing said relative movement in a direction parallel to said beam axis.

5. An apparatus as claimed in claim 1, wherein said relative positioning device includes means for producing a relative translatory movement of said at least one component with respect to said other components.

6. An apparatus as claimed in claim 1, wherein said relative positioning device includes means for producing a rotational relative movement.

7. An apparatus as claimed in claim 1, wherein said mask member is provided with a coating to reduce reaction with said energy beam.

8. An apparatus as claimed in claim 1, wherein said mask member is provided with a plurality of common fine-structural patterns repeated in a regular pattern.

9. An apparatus as claimed is claim 1, wherein said relative positioning device includes means for producing coarse movements and micro-movements.

10. An apparatus as claimed in claim 9, wherein said means for producing micro-movements comprises one of piezo-electric drive elements, magnetostrictive drive elements and thermal drive elements, or a combination of said one with a lever device.

11. An apparatus as claimed in claim 10, wherein said means for producing micro-movements is operable provided to provide said micro-movements in a range selected from the group consisting of 0.1 to 10 nm, 10 to 100 nm and 100 to 10,000 nm.

12. An apparatus as claimed in claim 1, wherein said energy beam includes at least one beam selected from a group consisting of a fast atomic beam, an ion beam, an electron beam, a laser beam, a radiation beam, an X-ray beam, an atomic beam and a molecular beam singly or in combination.

13. An apparatus as claimed in claim 1, wherein said energy beam is a focused energy beam.

14. An apparatus as claimed in claim 1, wherein said controller includes means for controlling exposure of a particular region of the workpiece to said energy beam.

15. An apparatus as claimed in claim 14, wherein said means for controlling periodically alters a relative orientation angle of said mask member with respect to the workpiece.

16. An apparatus as claimed in claim 14, wherein said controller further comprises means for analyzing a duration of exposure to irradiation, a shape of a beam transmission opening to be provided on said mask member, a relative parallel movement track and speed, a relative rotational movement track and speed, by process simulation in accordance with a pre-determined post-fabrication shape of said workpiece.

17. An apparatus as claimed in claim 14, further comprising aligning means for aligning said energy beam source, said mask member and the workpiece in a vacuum by use of an optical device including a light microscope, a scanning secondary electron microscope or a laser microscope.

* * * * *